United States Patent
Chen et al.

(10) Patent No.: US 10,332,657 B2
(45) Date of Patent: Jun. 25, 2019

(54) METHODS FOR FORMING GOLD NANOWIRES ON A SUBSTRATE AND GOLD NANOWIRES FORMED THEREOF

(71) Applicant: Nanyang Technological University, Singapore (SG)

(72) Inventors: Hongyu Chen, Singapore (SG); Jiating He, Singapore (SG); Yawen Wang, Singapore (SG)

(73) Assignee: Nanyang Technological University, Singapore (SG)

( * ) Notice: Subject to any disclaimer, the term of this patent is extended or adjusted under 35 U.S.C. 154(b) by 185 days.

(21) Appl. No.: 14/346,243

(22) PCT Filed: Sep. 24, 2012

(86) PCT No.: PCT/SG2012/000355
§ 371 (c)(1),
(2) Date: Mar. 20, 2014

(87) PCT Pub. No.: WO2013/043133
PCT Pub. Date: Mar. 28, 2013

(65) Prior Publication Data
US 2014/0234157 A1  Aug. 21, 2014

Related U.S. Application Data

(60) Provisional application No. 61/538,407, filed on Sep. 23, 2011, provisional application No. 61/546,817, filed on Oct. 13, 2011.

(51) Int. Cl.
*B22F 1/00* (2006.01)
*B22F 9/24* (2006.01)
(Continued)

(52) U.S. Cl.
CPC ....... *H01B 13/0036* (2013.01); *B22F 1/0025* (2013.01); *B22F 9/24* (2013.01);
(Continued)

(58) Field of Classification Search
CPC ....... H01L 21/288; B82Y 30/00; B82Y 40/00; B22F 1/0025; B22F 9/24; H01B 1/02; H01B 13/0036
See application file for complete search history.

(56) References Cited

U.S. PATENT DOCUMENTS 8,202,436 B2 *  6/2012  Lee .................. G03F 7/0002
                                              216/13
2011/0137062 A1 *  6/2011  Murphy ................ B82Y 30/00
                                              556/114

FOREIGN PATENT DOCUMENTS

KR   10-2006-066590      6/2006
WO   03/068674 A1        8/2003

OTHER PUBLICATIONS

Hunyadi et al., "Bimetallic silver-gold nanowires: fabrication and use in surfactant-enhanced Raman scattering," J. Mater. Chem., 2006, 16, pp. 3929-3935).*
(Continued)

*Primary Examiner* — Keith Walker
*Assistant Examiner* — John A Hevey
(74) *Attorney, Agent, or Firm* — Seed IP Law Group LLP

(57) ABSTRACT

A method for forming gold nanowires on a substrate is provided. The method includes a) attaching noble metal nanoparticles onto the substrate; and b) contacting the noble metal nanoparticles with an aqueous solution comprising a ligand, gold ions and a reducing agent, wherein the ligand is an organic compound having a thiol group. Gold nanowires
(Continued)

formed by a method according to the method, and an electronic device comprising the gold nanowires are also provided.

25 Claims, 48 Drawing Sheets

(51) Int. Cl.
    H01B 1/02        (2006.01)
    B82Y 30/00       (2011.01)
    B82Y 40/00       (2011.01)
    H01B 13/00      (2006.01)
    H01L 21/288     (2006.01)

(52) U.S. Cl.
    CPC ............... *B82Y 30/00* (2013.01); *H01B 1/02* (2013.01); *H01L 21/288* (2013.01); *B82Y 40/00* (2013.01)

(56) References Cited

OTHER PUBLICATIONS

Meltzer et al., "Fabrication of Nanostructures by Hydroxylamine Seeding of Gold Nanoparticle Templates," Langmuir 2001, 17, pp. 1713-1718.*
Gole et al., "Seed-Mediated Synthesis of Gold Nanorods: Role of the Size and Nature of the Seed," Chem. Mater. 2004, 16, 3633-3640.*
Lin et al., "Formation of ordered arrays of gold nanoparticles from CTAB reverse micelles," Materials Letters 49 (2001), pp. 282-286.*
Bardhan et al., "Nanosphere-in-a-Nanoshell: A Simple Nanomatryushka," *J. Phys. Chem. C* 114(16):7378-7383, 2009.
Cademartiri et al., "Ultrathin Nanowires—A Materials Chemistry Perspective," *Advanced Materials* 21(9):1013-1020, 2009.
Caswell et al., "Preferential End-to-End Assembly of Gold Nanorods by Biotin-Streptavidin Connectors," *Journal of the American Chemical Society* 125(46):13914-13915, 2003.
Chen et al., "Measuring Ensemble-Averaged Surface-Enhanced Raman Scattering in the Hotspots of Colloidal Nanoparticle Dimers and Trimers," *Journal of the American Chemical Society* 132(11):3644-3645, 2010.
Chen et al., "Scalable Routes to Janus Au—$SiO_2$ and Ternary Ag—Au—$SiO_2$ Nanoparticles," *Chemistry of Materials* 22(13):3826-3828, 2010.
Cheng et al., "Hierarchical Assembly of ZnO Nanostructures on $SnO_2$ Backbone Nanowires: Low-Temperature Hydrothermal Preparation and Optical Properties," *ACSNano* 3(10):3069-3076, 2009.
Elias et al., "Hollow Urchin-like ZnO thin Films by Electrochemical Deposition," *Advanced Materials* 22(14):1607-1612, 2010.
Fan et al., "Semiconductor Nanowires: From Self-Organization to Patterned Growth," *Small* 2(6):700-717, 2006.
Frens et al., "Controlled Nucleation for the Regulation of the Particle Size in Monodisperse Gold Suspensions," *Nature* 241(105):20-22, 1973.
Gao et al., "Dependence of the Gold Nanorod Aspect Ratio on the Nature of the Directing Surfactant in Aqueous Solution," *Langmuir* 19:9065-9070, 2003.
Grebinski et al., "Solution-Based Straight and Branched CdSe Nanowires," *Chemistry of Materials* 16(25):5260-5272, 2004.
Grebinski et al., "Synthesis and Characterization of Au/Bi Core/Shell Nanocrystals: A Precursor toward II-VI Nanowires," *Journal of Physical Chemistry B* 108(28):9745-9751, 2004.
Greene et al., "Low-Temperature Wafer-Scale Production of ZnO Nanowire Arrays," *Angewandte Chemie* 42(26):3031-3034, 2003.
Greene et al., "Solution-Grown Zinc Oxide Nanowires," *Inorganic Chemistry* 45(19):7535-7543, 2006.
Gu et al., "Germanium-catalyzed hierarchical $Al_2$ and $SiO_2$ nanowire bunch arrays," *Nanoscale* 1:347-354, 2009.

Halder et al., "Ultrafine Single-Crystalline Gold Nanowire Arrays by Oriented Attachment," *Advanced Materials* 19(14):1854-1858, 2007.
Heitsch et al., "Solution-Liquid-Solid (SLS) Growth of Silicon Nanowires," *Journal of the American Chemical Society* 130(16):5436-5437, 2008.
Hong et al., "Ultrathin Au—Ag bimetallic nanowires with Coulomb blockade effects," *Chem. Comm.* 47:5160-5162, 2011.
Hu et al., "Novel semiconducting nanowire heterostructures: synthesis, properties, and applications," *Journal of Materials Chemistry* 19(3):330-343, 2009.
Huang et al., "Catalytic Growth of Zinc Oxide Nanowires by Vapor Transport," *Advanced Materials* 13(2):113-116, 2001.
Huang et al., "One-Pot, High-Yield Synthesis of 5-Fold Twinned Pd Nanowires and Nanorods," *Journal of the American Chemical Society* 131(13):4602-4603, 2009.
Huo et al., "Sub-Two Nanometer Single Crystal Au Nanowires," *Nano Letters* 8(7):2041-2044, 2008.
Imura et al., "Reversible phase transfer and fractionation of Au nanoparticles by pH change," *Chem. Comm.* 46:9206-9208, 2010.
Imura et al., "Water-dispersible ultrathin Au nanowires prepared using a lamellar template of a long-chain amidoamine derivative," *Chem. Comm.* 47:6380-6382, 2011.
Jana et al., "Seeding Growth for Size Control of 5-40 nm Diameter Gold Nanoparticles," *Langmuir* 17(22):6782-6786, 2001.
Johnson et al., "Growth and form of gold nanorods prepared by seed-mediated, surfactant-directed synthesis," *Journal of Materials Chemistry* 12:1765-1770, 2002.
Kim et al., "Chemical Synthesis of Gold Nanowires in Acidic Solution," *Journal of the American Chemical Society* 130(44):14442-14443, 2008.
Krichevski et al., "Growth of Colloidal Gold Nanostars and Nanowires Induced by Palladium Doping," *Langmuir* 23(3):1496-1499, 2007.
Krichevski et al., "Formation of Gold-Silver Nanowires in Thin Surfactant Solution Films," *Langmuir* 22(3):867-870, 2006.
Love et al., "Self-Assembled Monolayers of Thiolates on Metals as Form of Nanotechnology," *Chem. Rev.* 105(4):1103-1169, 2005.
Lu et al., "Ultrathin Gold Nanowires Can Be Obtained by Reducing Polymeric Strands of Oleylamine-AuCl Complexes Formed via Aurophilic Interaction," *Journal of the American Chemical Society* 130(28):8900-8901, 2008.
Neouze et al., "Surface Modification and Functionalization of Metal and Metal Oxide Nanoparticles by Organic Ligands," *Chemical Monthly* 139(3):183-195, 2008.
Pazos-Pérez et al., "Synthesis of Flexible, Ultrathin Gold Nanowires in Organic Media," *Langmuir* 24(17):9855-9860, 2008.
Pei et al., "Formation Process of Two-Dimensional Networked Gold Nanowires by Citrate Reduction of $AuCl_4$ and the Shape Stabilization," *Langmuir* 20(18):7837-7843, 2004.
Peng et al., "Mechanisms for the Shape-Control and Shape-Evolution of Colloidal Semiconductor Nanocrystals," *Advanced Materials* 15(5):459-463, 2003.
Pham et al., "Preparation and Characterization of Gold Nanoshells Coated with Self-Assembled Monoslayers," *Langmuir* 18(12):4915-4920, 2002.
Pong et al., "First Principles Computational Study for Understanding the Interactions between ssDNA and Gold Nanoparticles: Adsorption of Methylamine on Gold Nanoparticulate Surfaces," *Langmuir* 21(25):11599-11603, 2005.
Prodan et al., "A Hybridization Model for the Plasmon Response of Complex Nanostructures," *Science* 302:419-422, 2003.
Puthussery et al., "Band-Filling of Solution-Synthesized CdS Nanowires," *ACS Nano* 2(2): 357-367, 2008.
Sun et al., "Large-Scale Synthesis of Uniform Silver Nanowires Through a Soft, Self-Seeding, Polyol Process," *Advanced Materials* 14(11):833-837, 2002.
Sun et al., "Uniform Silver Nanowires Synthesis by Reducing $AgNO_3$ with Ethylene Glycol in the Presence of Seeds and Poly(Vinyl Pyrrolidone)," *Chem. Mater.* 14(11):4736-4745, 2002.
Trentler et al., "Solution-Liquid-Solid Growth of Crystalline III-V Semiconductors: An Analogy to Vapor-Liquid-Solid Growth," *Science* 270(5243):1791-1794, 1995.

(56) References Cited

OTHER PUBLICATIONS

Tuan et al., "Nanocrystal-Mediated Crystallization of Silicon and Germanium Nanowires in Organic Solvents: The Role of Catalysis and Solid-Phase Seeding," *Angew. Chem.* 118(31):5308-5311, 2006.
Vasilev et al., "Simple, One-Step Synthesis of Gold Nanowires in Aqueous Solution," *Langmuir* 21(26):12399-12403, 2005.
Wagner et al., "Vapor-Liquid-Solid Mechanism of Single Crystal Growth," *Applied Physics Letters* 4(5):89-90, 1964.
Wallace et al., "Kinetics of Silica Nucleation on Carboxyl- and Amine-Terminated Surfaces: Insights for Biomineralization," *Journal of the American Chemical Society* 131(14):5244-5250, 2009.
Wang et al., "Facile Synthesis of Ultrathin and Single-Crystalline Au Nanowires," *Chem. Asian. J.* 4(7):1028-1034, 2009.
Wang et al., "Simultaneous phase and size control of upconversion nanocrystals through lanthanide doping," *Nature* 463:1061-1065, 2010.
Wang et al., "Ultrathin Au Nanowires and Their Transport Properties," *Journal of the American Chemical Society* 130(28):8902-8903, 2008.
Wang et al., "Polymer-Encapsulated Gold-Nanoparticle Dimers: Facile Preparation and Catalytical Application in Guided Growth of Dimeric ZnO-Nanowires," *Nano Letters* 8(9):2643-2647, 2008.
Wong et al., "Revisitng the Stöber Method: Inhomogeneity in Silica Shells," *Journal of the American Chemical Society* 133(30):11422-11425, 2011.
Wu et al., "Effects of Seed Layer Characteristics on the Synthesis of ZnO Nanowires," *J. Am. Ceram. Soc.* 92(11):2718-2723, 2009.
Wu et al., "Nonaqueous Production of Nanostructured Anatase with High-Energy Facets," *Journal of the American Chemical Society* 130(51):17563-17567, 2008.
Xue et al., "Self-Assembled Monolayer Mediated Silica Coating of Silver Triangular Nanoprisms," *Advanced Materials* 19(22):4071-4074, 2007.
Yan et al., "Dendritic Nanowire Ultraviolet Laser Array," *Journal of the American Chemical Society* 125(16):4728-4729, 2003.
Yan et al., "Nanowire Phototonics," *Nature Photonics* 3:569-576, 2009.
Zhang et al., "Hierarchical Assembly of $SnO_2$ Nanorod Arrays on $\alpha$-$Fe_2O_3$ Nanotubes: A Case of Interfacial Lattice Compatibility," *Journal of the American Chemical Society* 127(39): 13492-13493, 2005.
Zhang et al., "Self-Assembled Shape- and Orientation-Controlled Synthesis of Nanoscale $Cu_3Si$ Triangles, Squares, and Wires," *Nano Letters* 8(10):3205-3210, 2008.

\* cited by examiner (A)

(B)

(A)

(B)

(C)

0.5 μm

1/10 seed (B)

(C)

(D)

(E)

(A)

(E)

(F)

(G)

(D)

| "o" refers to the position on sample in b & c | Conductivity Before Ag Deposition (Ω) | Conductivity After Ag Deposition (Ω) |
|---|---|---|
| → | 2,320 | 490 |
| → | 1,750 | 310 |

(B)

(C)

METHODS FOR FORMING GOLD NANOWIRES ON A SUBSTRATE AND GOLD NANOWIRES FORMED THEREOF

CROSS-REFERENCE TO RELATED APPLICATIONS

This application makes reference to and claims the benefit of priority of U.S. Provisional Application No. 61/538,407 filed on Sep. 23, 2011, and U.S. Provisional Application No. 61/546,817 filed on Oct. 13, 2011, the contents of both applications being hereby incorporated by reference in their entirety for all purposes.

TECHNICAL FIELD

The invention relates to methods for forming gold nanowires, and gold nanowires formed thereof.

BACKGROUND

Ultrathin metal nanowires (NWs) with diameters of less than 10 nm have attracted much interest in recent years. Large anisotropy, electrical conductivity, and chemical stability of ultrathin gold NWs (AuNWs) make them suitable candidates as linkage in nanoelectronic devices. Their narrow width cuts down on the usage of precious metal and confers high sensitivity for applications such as sensors. Other potential application areas include fully transparent thin-film transistors (TTFTs).

Since TTFTs have been were first reported in 2003, they have been rapidly applied and commercialized in the electronics industry. Indium tin oxide (ITO) was found to be outstanding in both electrical conductivity and optical transparency, thereby rendering it suitable for use in TTFTs. Demand of these transistors has increased exponentially as they could be embedded in various devices such as displays, touch screens and photovoltaics. However, due to the scarcity and surging price of indium, there is a need for comparable substitutes for ITO.

In addition, research on nanotechnology in recent years has made assembly and array of material on nanometer scale possible. Some carbon based nanostructures, such as graphene oxide and carbon nanotubes, may be aligned and used as transparent electrodes with good conductivity. Networks of silver nanowires have also shown promising capability in the construction of optoelectronic devices. However, preparation of the above-mentioned materials involves methods such as chemical vapor deposition (CVD), sputtering and spin coating. Disadvantages of these techniques include high expense, high energy consumption, low yield, fragile towards external environment, and limitation of the coating surfaces.

In view of the above, there remains a need for an improved method for forming nanowires which addresses at least one or more of the above-mentioned problems.

SUMMARY OF THE INVENTION

In a first aspect, the invention refers to a method for forming gold nanowires on a substrate. The method comprises a) attaching noble metal nanoparticles onto the substrate; and b) contacting the noble metal nanoparticles with an aqueous solution comprising a ligand, gold ions and a reducing agent, wherein the ligand is an organic compound having a thiol group.

In a second aspect, the invention refers to gold nanowires formed by a method according to the first aspect.

In a third aspect, the invention refers to an electronic device comprising gold nanowires formed by a method according to the first aspect.

BRIEF DESCRIPTION OF THE DRAWINGS

The invention will be better understood with reference to the detailed description when considered in conjunction with the non-limiting examples and the accompanying drawings, in which:

In FIG. 1(A), a substrate 100 is provided. Noble metal nanoparticles 103 are attached to the substrate 100 as shown in FIG. 1(B). In various embodiments, the noble metal nanoparticles 103 comprise or consist essentially of gold nanoparticles. The noble metal nanoparticles 103 are contacted with an aqueous solution comprising a ligand, gold ions and a reducing agent, to form gold nanowires 105 on the substrate 100 as shown in FIG. 1(C).

In FIG. 2(A), a substrate 200 in the form of a nanoparticle having a gold core 202 and a silica shell 201 is provided. Noble metal nanoparticles 203 are attached to the surface of the silica shell 201 as shown in FIG. 2(B). The noble metal nanoparticles 203 are contacted with an aqueous solution comprising a ligand, gold ions and a reducing agent, to form gold nanowires 205 on the substrate 200 as shown in FIG. 2(C).

In FIG. 3(A), a binding agent 3-aminopropyltrimethoxysilane (APTMS) is shown. The APTMS is hydrolysed in water, with subsequent condensation, to form the compounds shown in FIG. 3(B) and FIG. 3(C) respectively. The compound in FIG. 3(C) undergoes coupling with the free hydroxy groups on the glass surface to form silanized glass, as shown in FIG. 3(D). The silanized glass is contacted with an aqueous solution containing gold nanoparticles, whereby the gold nanoparticles are anchored on the glass substrate through Coulomb interactions with amino groups present on the silanized glass as shown in FIG. 3(E).

7(C) is a TEM image of a nanocomposite sample prepared according to the same process used for sample shown in FIG. 5 but without using PVP (control experiment). Scale bar in the figures denotes a length of 50 nm.

FIG. 8(i) is a large-area TEM image of (AuNP@silica)@AuNWs in FIG. 8(a). Scale bar=0.5 μm.

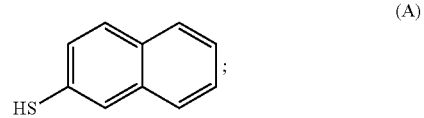

(A)

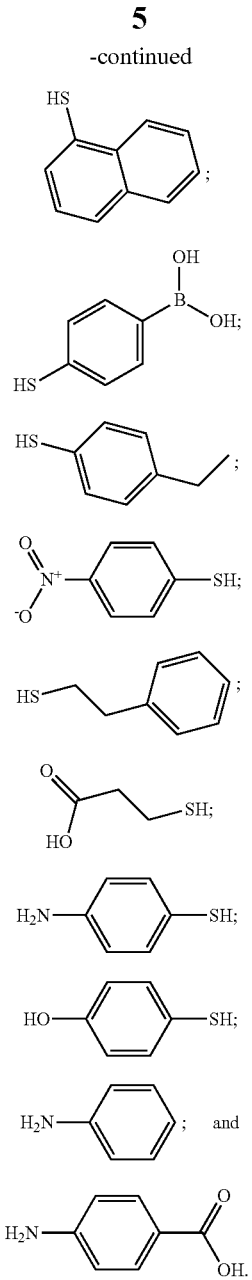

AuNW may be achieved by adjusting the ligand concentration during growth.

Figure 41:
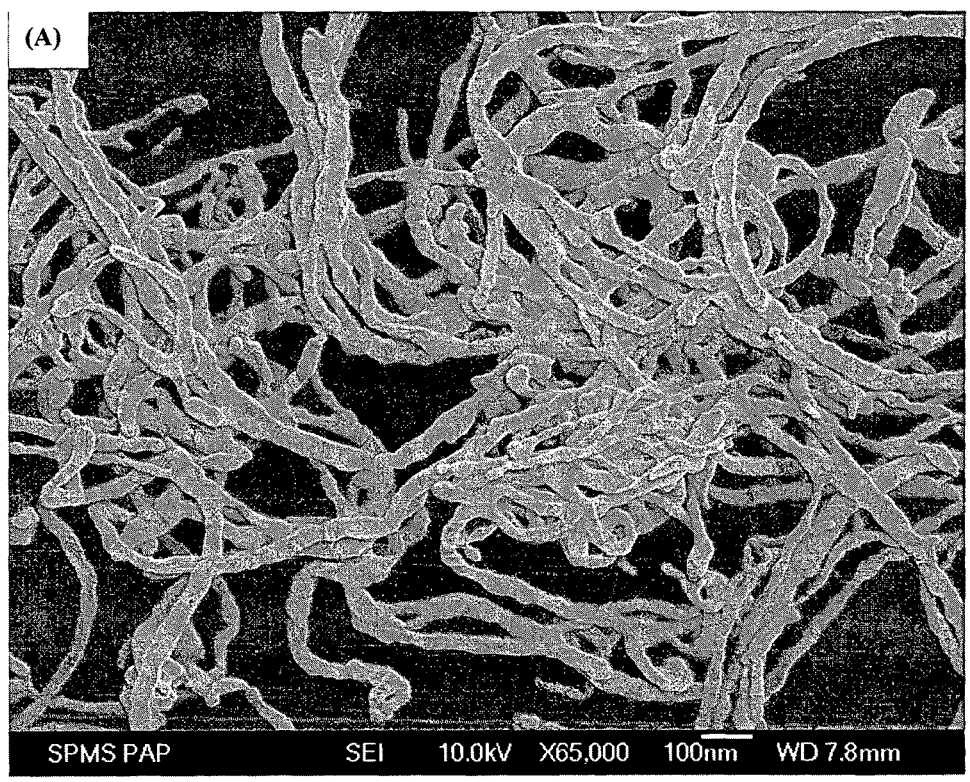
Figure 41:
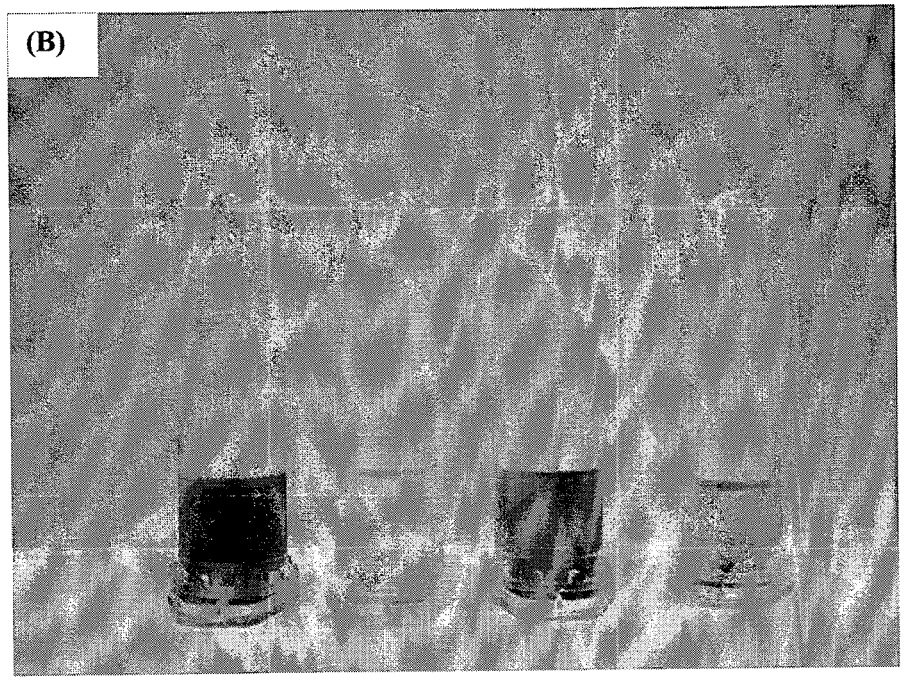

FIG. 41 (A) is a SEM image showing the ligand effect. The ligand is washed away 10 s after growth and put back. FIG. 41(B) is a photograph showing the ligand effect in this system, where the Au seed was firstly incubated with ligand 1, then added into a solution containing ligand 2, HAuCl$_4$ and AA. From left to right: (i) Ligand 1: none, Ligand 2: 11-mercaptoundecanoic acid (MUA); (ii) Ligand 1: 4-MBA, Ligand 2: MUA; (iii) Ligand 1: none, Ligand 2: 4-MBA; (iv) Ligand 1: 4-MBA; Ligand 2: 4-MBA. The result shows that the reduction rate of Au with 4-MBA is lower than that with 11-MUA.

Figure 42:
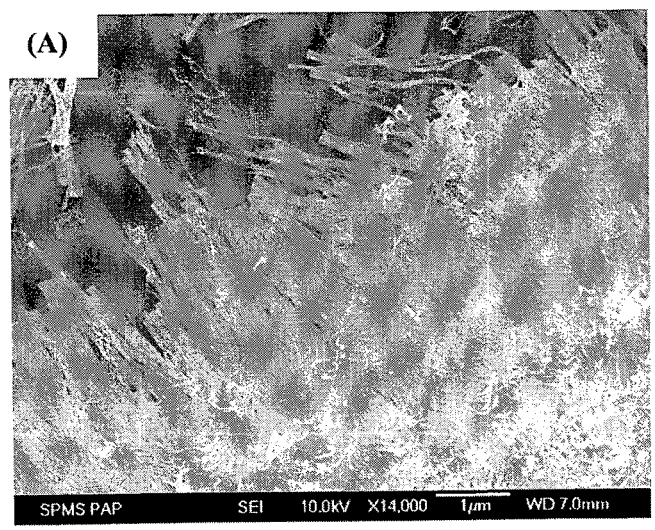
Figure 42:
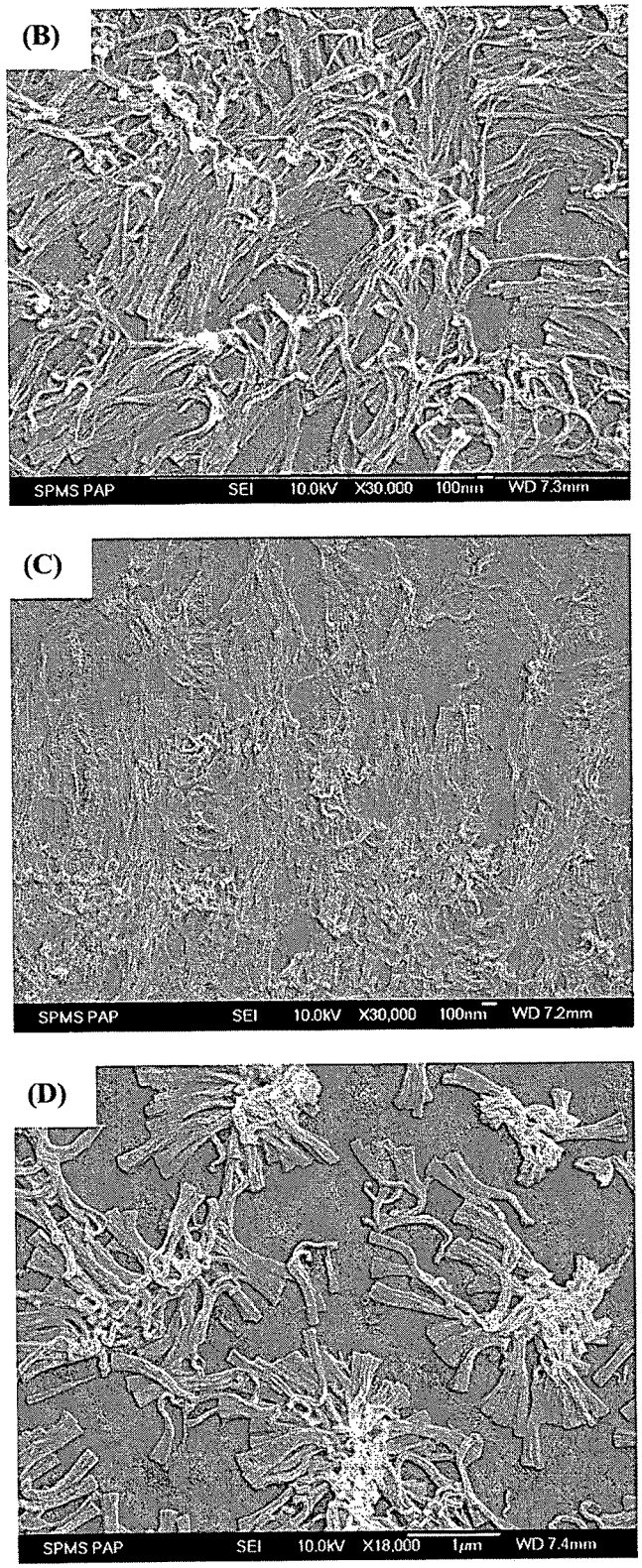
Figure 42:
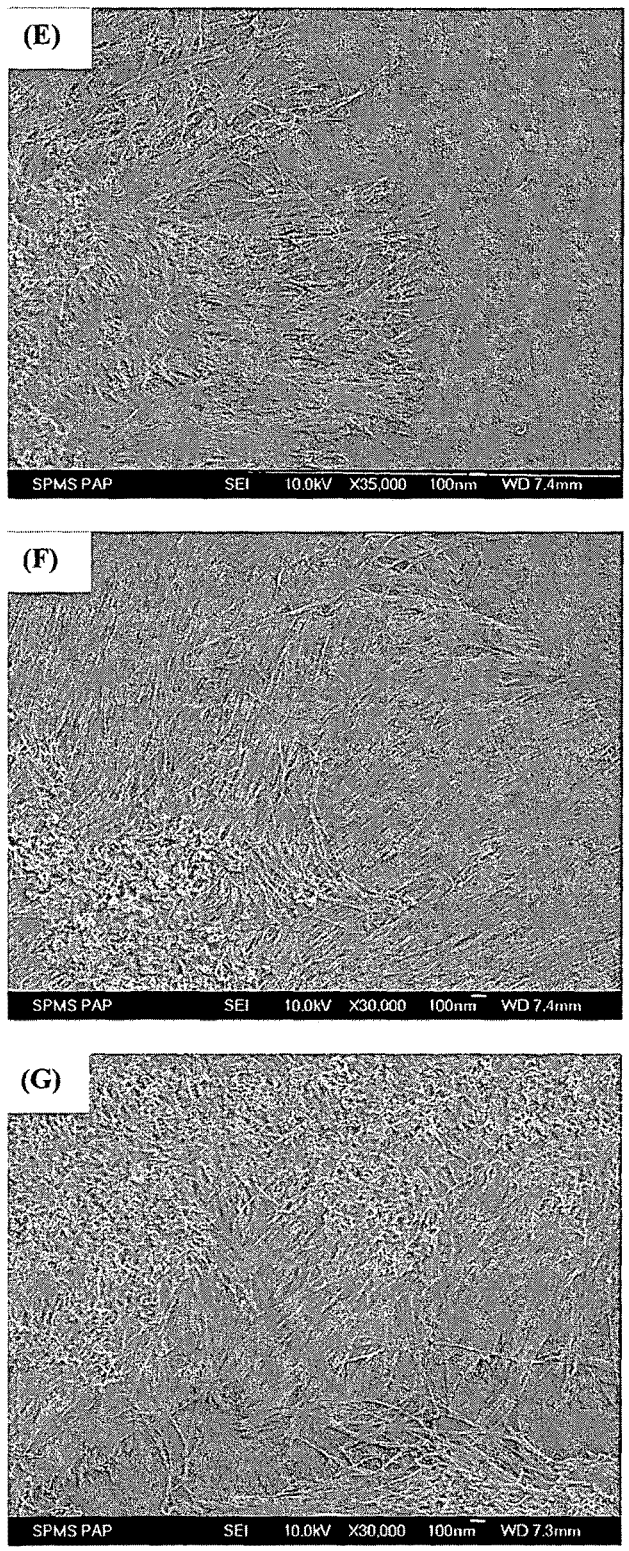

FIG. 42 (A) to (G) are SEM images of AuNWs prepared using different concentrations of HAuCl$_4$ and ascorbic acid (AA) (A) 2× concentration of each reagent; (B) 1× concentration of each reagent; (C) ½× concentration of each reagent; (D) ⅕× concentration of each reagent; For the samples with high density of seeds: (E) 4× amount of each reagent; (F) 1× amount of each reagent; and (G) ¼× concentration of each reagent.

Figure 43:
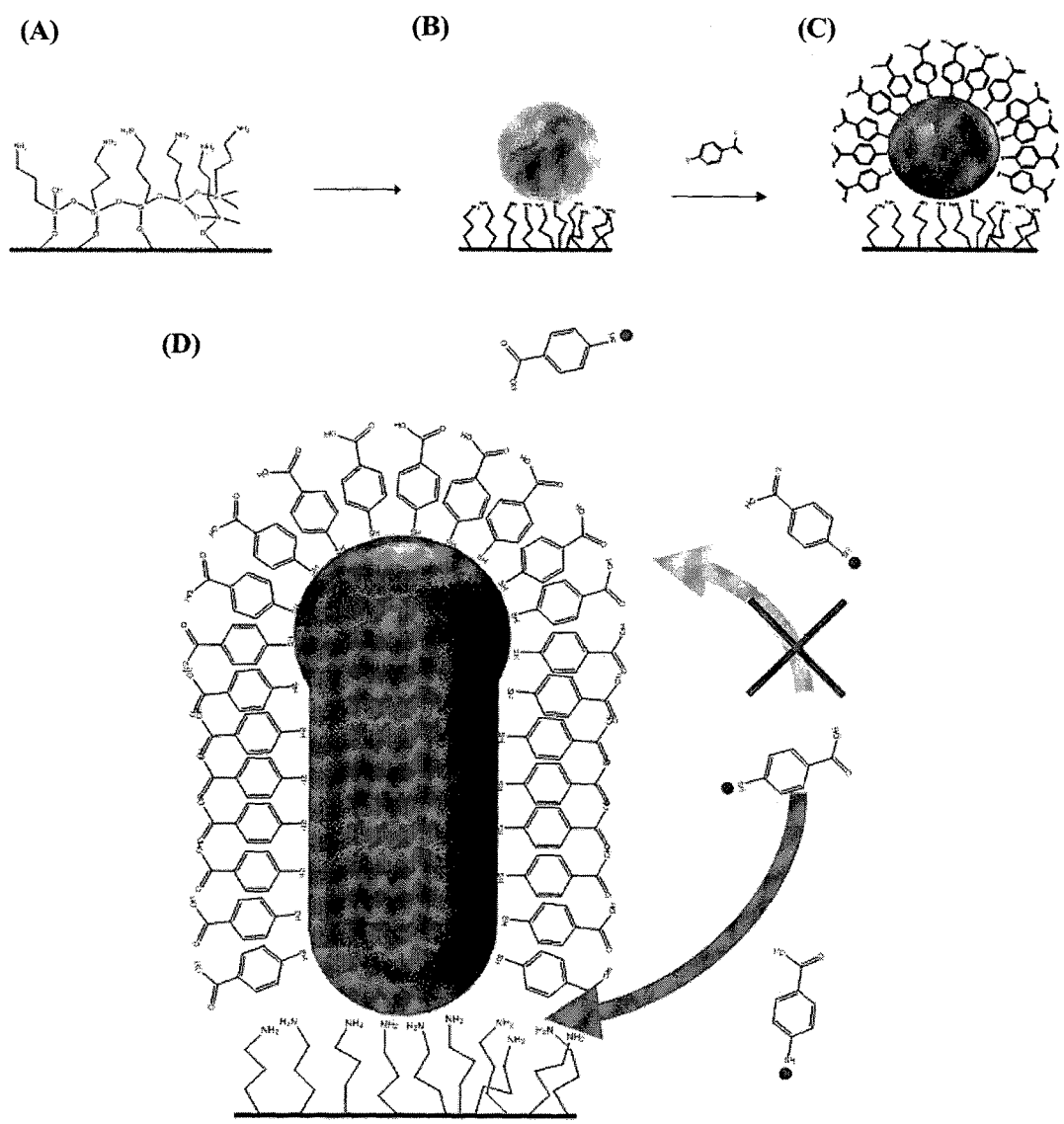

FIG. 43 (A) to (D) are schematic diagrams showing deposition mechanism, whereby seed/ligand interface is the Au deposition position. (A) a substrate functionalized with amino group; (B) absorption of Au seeds on the surface; (C) the ligand (i.e. 4-MBA) can pack densely on the surface of the seeds, except for the seed-substrate interface; (D) Au can be continuously deposited at the seed-substrate interface because ligands cannot effectively bind there, whereas the instant binding of strong ligands inhibits the growth at the perimeter of this active site, pushing the nanocrystals upward into anisotropic NWs.

Figure 44:
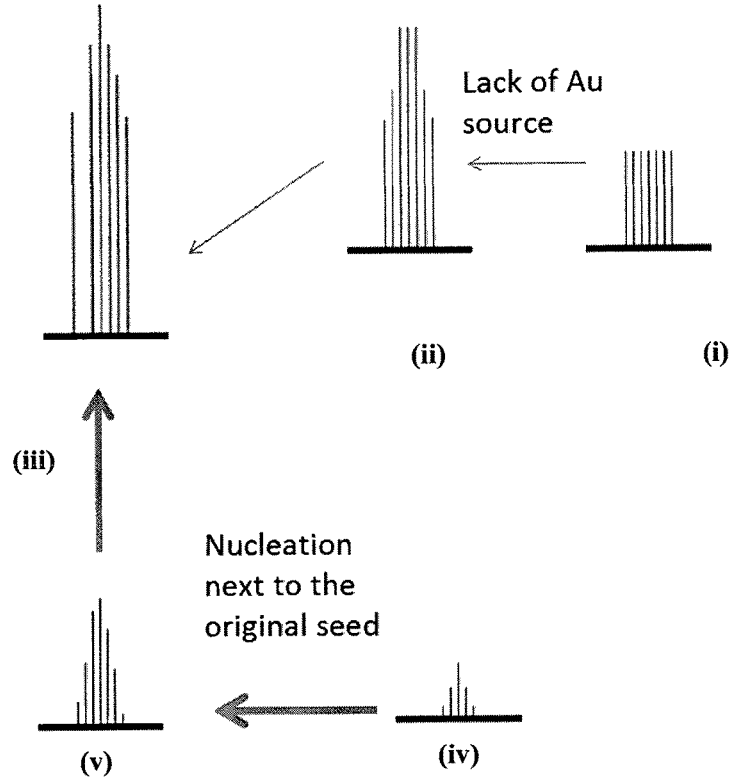
Figure 44:
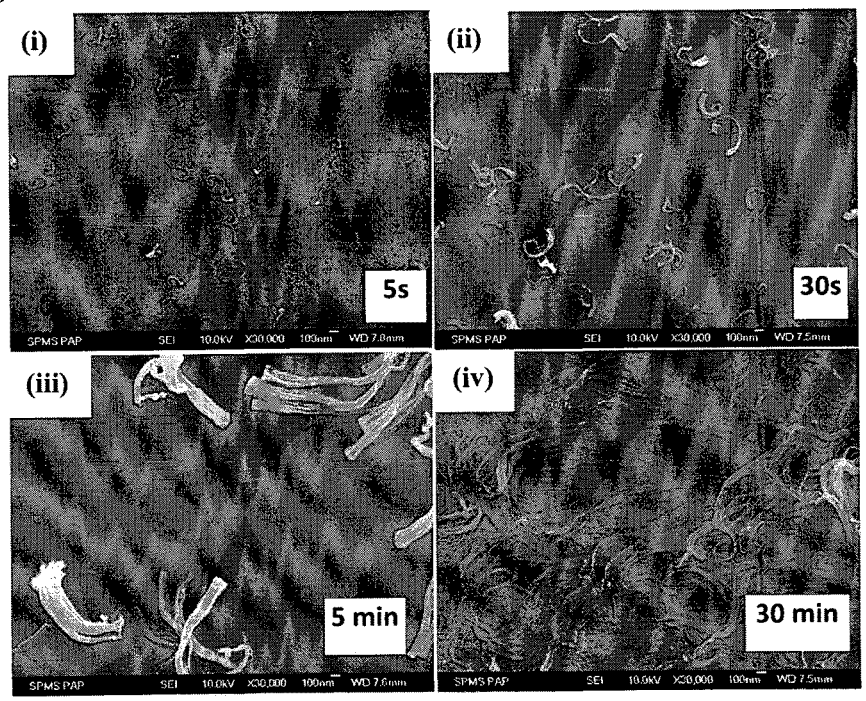

FIG. 44 (A) is a schematic diagram depicting the bundle mechanism. Bundles appear when the seed concentration is low. However, bundle formation appears to be affected by seed density. Concentration of HAuCl$_4$ and ascorbic acid (AA) does not have effect on bundle formation. FIG. 44 (B) are SEM images of AuNWs prepared using 15 nm AuNP with ⅕ amount of reagent for (i) 5 s; (ii) 30 s; (iii) 5 mM; and (iv) 30 mM.

Figure 45:
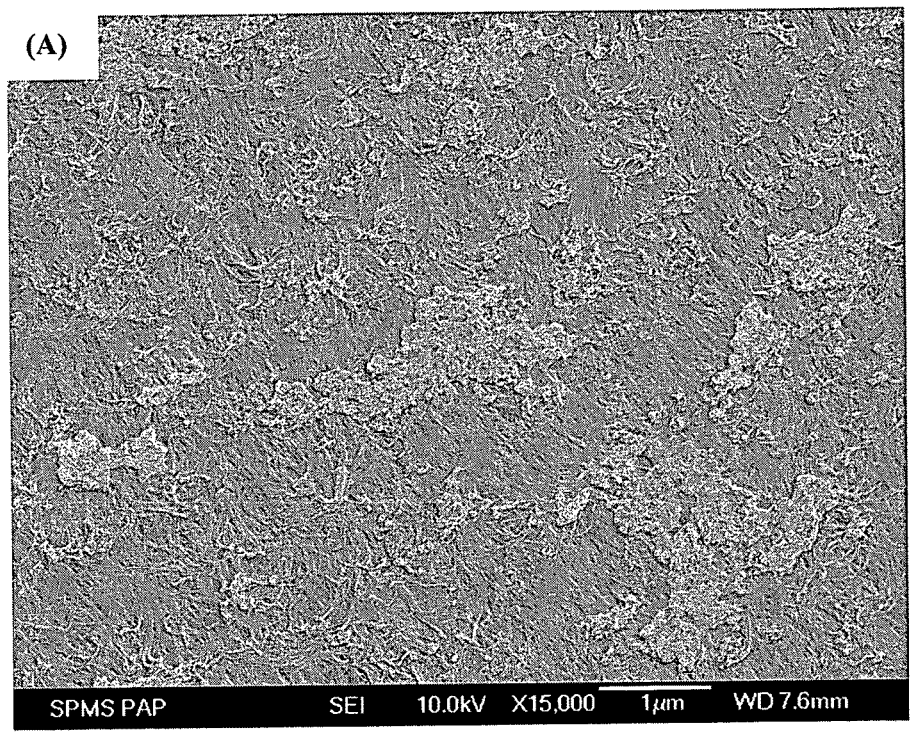
Figure 45:
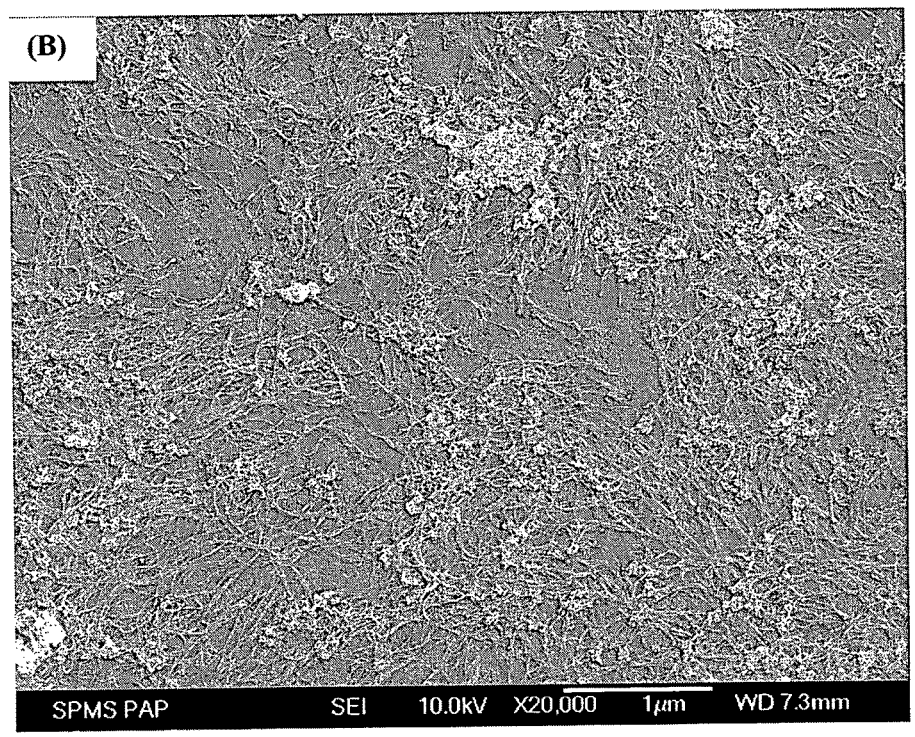

FIG. 45 are SEM images of (A) 1 mM 4-MBA and (B) 3 mM 4-MBA, demonstrating how ligand affect the bundle formation. Same seed solution of ⅕ dilution of 15 nm AuNP, HAuCl$_4$ and ascorbic acid is used.

Figure 46:
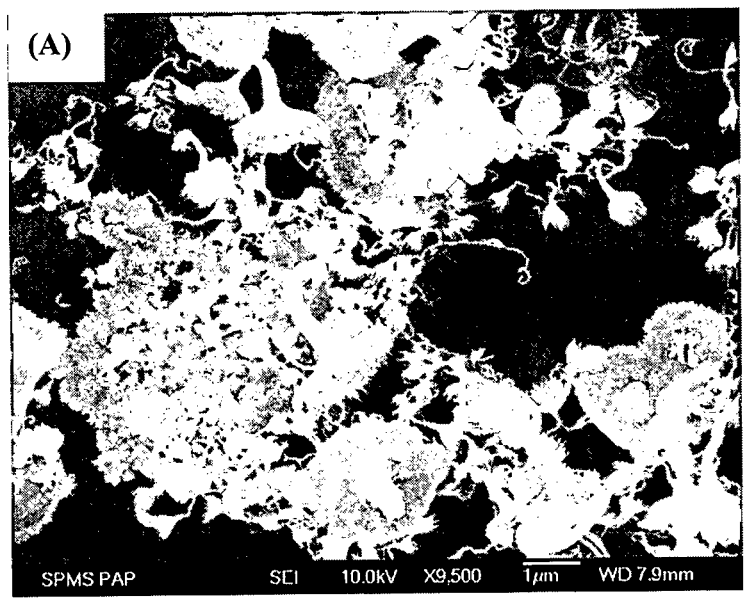
Figure 46:
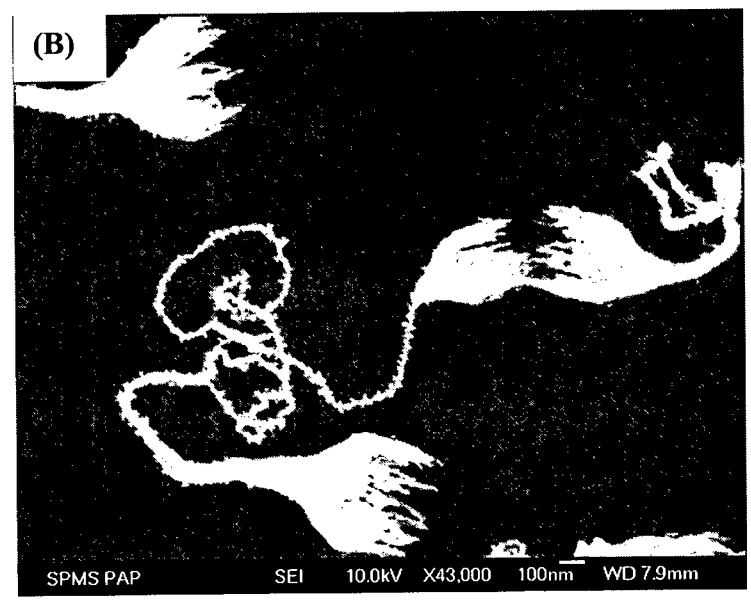
Figure 46:
Figure 46:
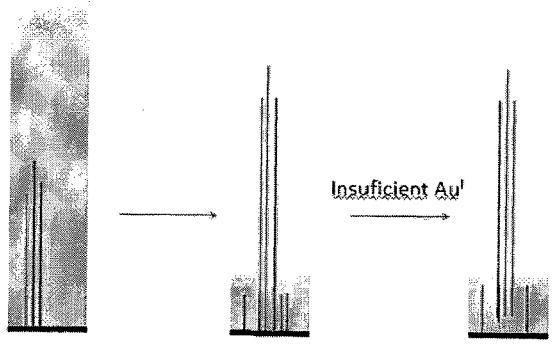

FIGS. 46 (A and B) are (A) low and (B) high magnification SEM images of nanoflowers formed during drying process; FIG. 46(C) is scheme of the drying process, where the growth solution on substrate surface become higher concentrated with the solvent evaporated. FIG. 46(D) is a scheme showing the growth mechanism during drying process.

Figure 47:
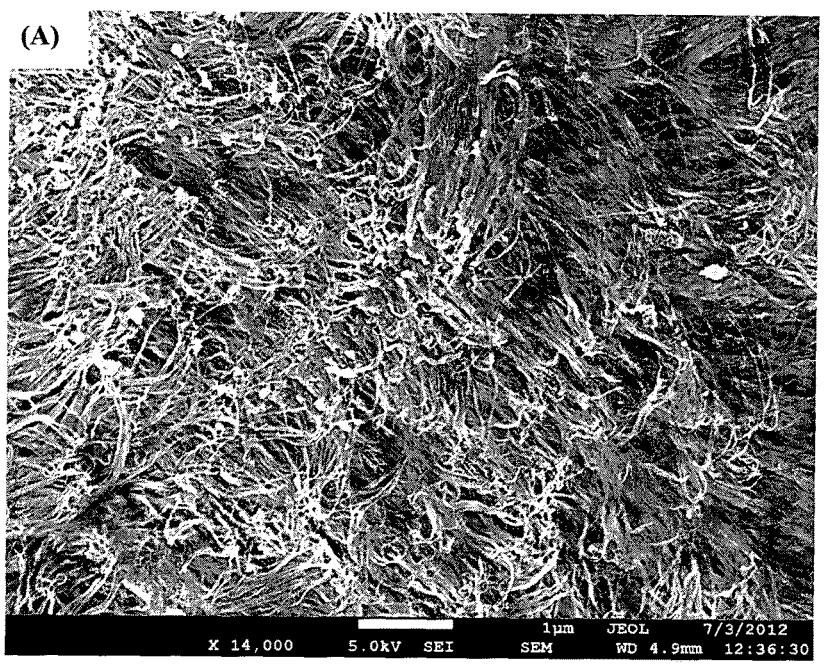
Figure 47:
Figure 47:
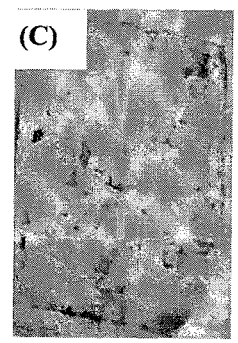

FIG. 47 (A) is a SEM image of AuNWs on glass using 4-MBA as ligand for building conductive film. Scale bar in the figure denotes a length of 1 μm. FIGS. 47(B) and (C) are photographs of AuNWs on glass using different ligands (B) 4-MBA; and (C) 4-MPAA.

Figure 48:
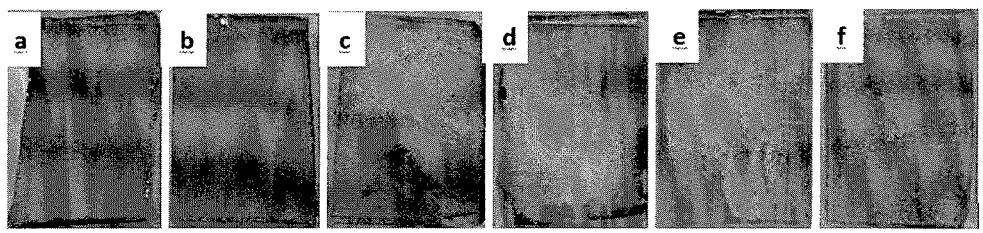

FIG. 48 (A) to (F) are photographs showing the growth of AuNWs on glass with different APTMS concentrations using 3 nm to 5 nm Au seed (a) 22 mM; (b) 16.5 mM; (c) 15.4 mM; (d) 13.8 mM; (e) 11 mM (f) 13.8 mM with sonication.

Figure 49:
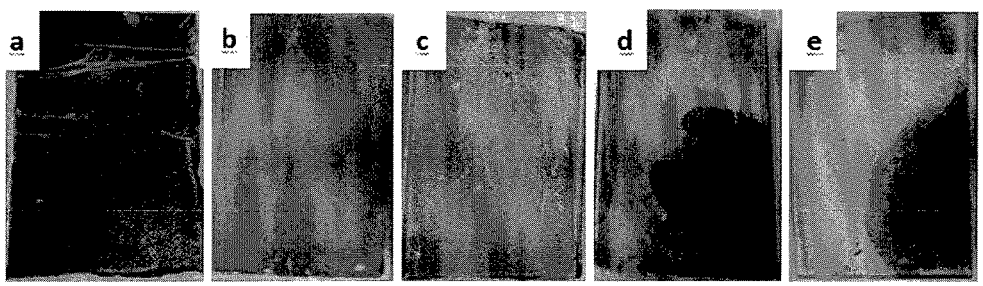
Figure 49:
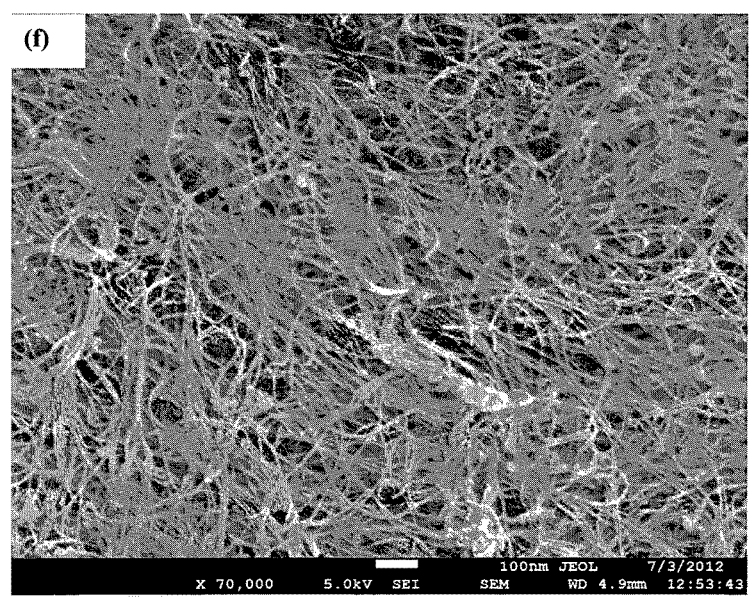
Figure 49:
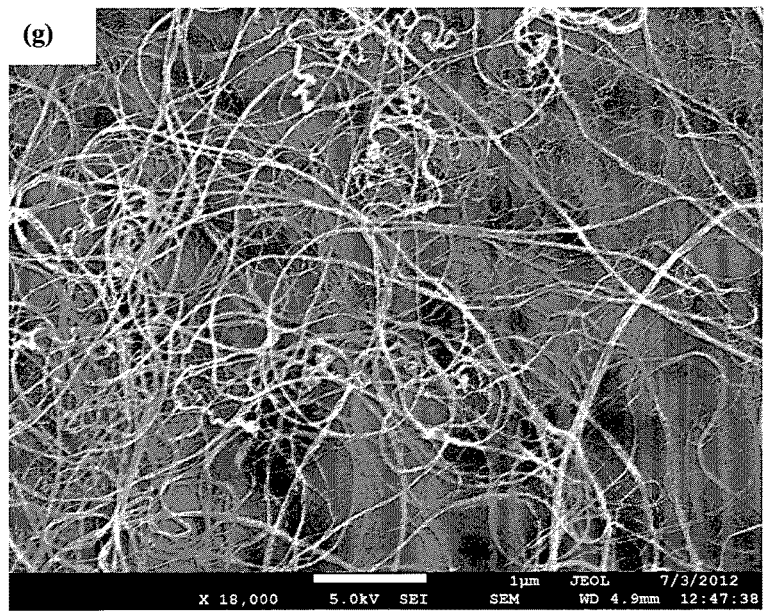

FIG. 49 (A) to (C) are photographs showing AuNWs growth on glass using Au seeds of different size (a) 3 nm to 5 nm; (b) 15 nm; (c) 35 nm; FIGS. 49(D) and (E) are photographs showing AuNWs growth on glass using different concentrations of 15 nm Au seeds (d) 100 μL; (e) 50 μL. FIGS. 49 (F) and (G) are SEM images of sample E: (F) dark region, Scale bar=100 nm; (G) bright region, Scale bar=1 μm.

Figure 50:
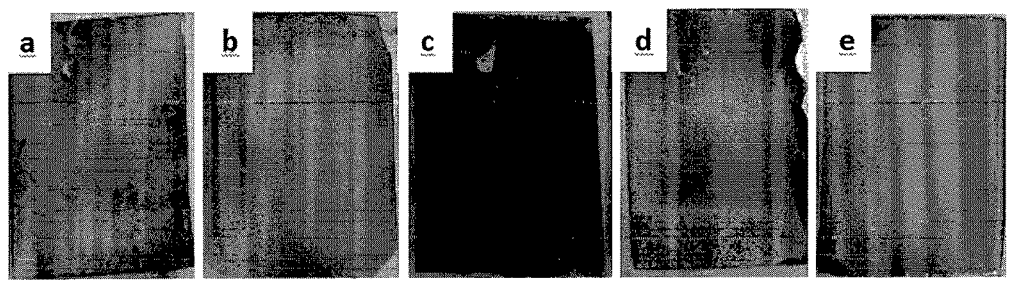

FIG. 50 (A) to (E) are photographs showing AuNWs on glass with different incubation time using 15 nm Au seeds (a) 5 min; (b) 10 min; (c) 30 min; AuNWs growth with different amount of HAuCl$_4$ (d) 2.0 mol; (e) 1.5 mol.

Figure 51:
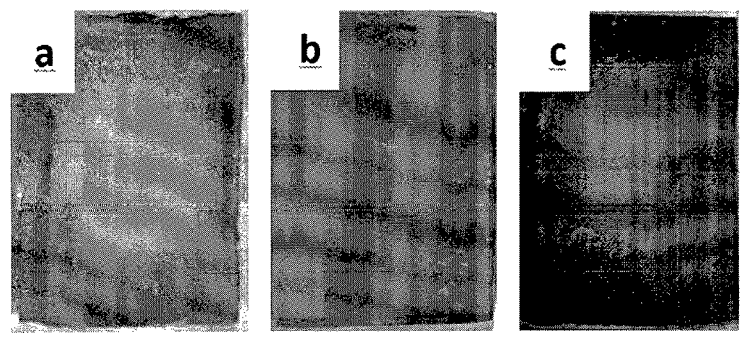

FIG. 51 (A) to (C) are photographs showing AuNWs on glass with different reaction time (a) 5 min; (b) 10 min; and (c) 30 min.

Figure 52:
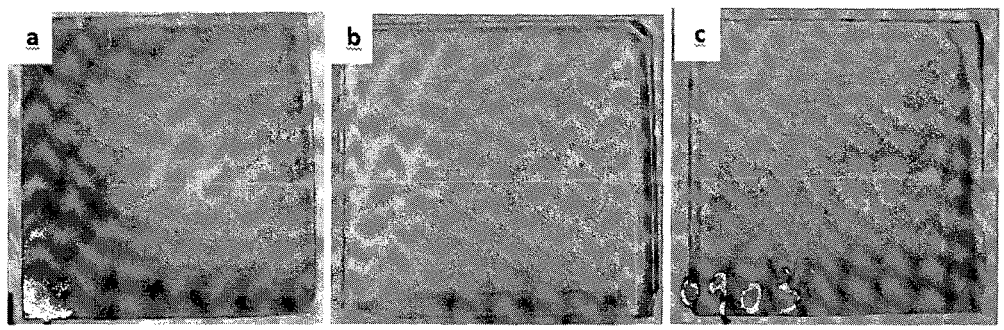

FIG. 52 (A) to (C) are photographs showing (a) Scale up of optimized AuNWs film on glass; (b) Sample in (a) with an decreased amount of 4-MBA; (c) Sample in (b) after Ag deposition. FIG. 52 (D) is a schematic diagram indicating the position on the samples in (b) and (c) and their associated conductivity values.

Figure 53:
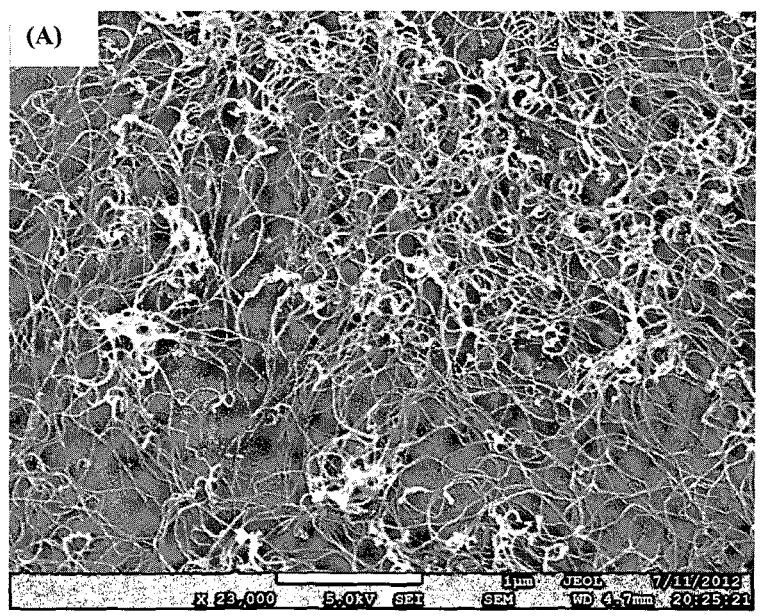
Figure 53:
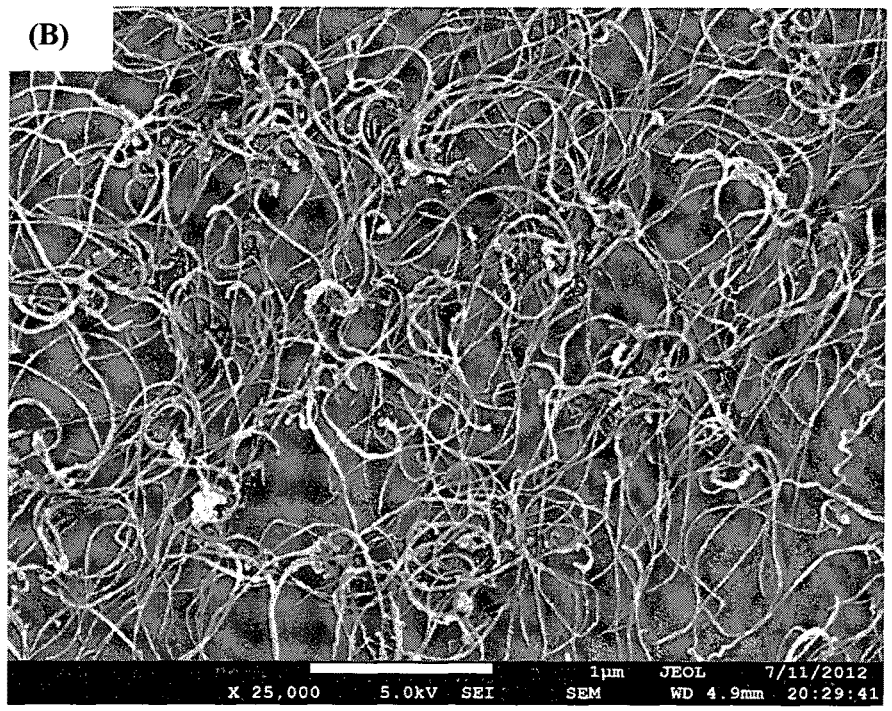

FIGS. 53 (A) and (B) are SEM images of samples in FIGS. 52 (b) and (c) respectively. Scale bar=1 μm.

Figure 54:
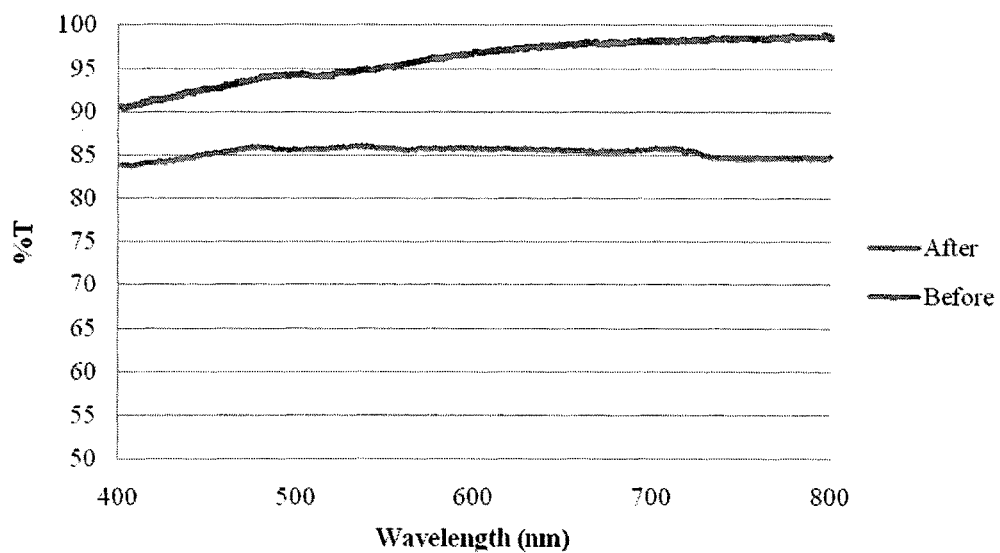

FIG. 54 is a graph showing Ultraviolet-visible (UV-Vis) spectra of the samples in FIGS. 52(*b*) and (*c*).

Figure 55:
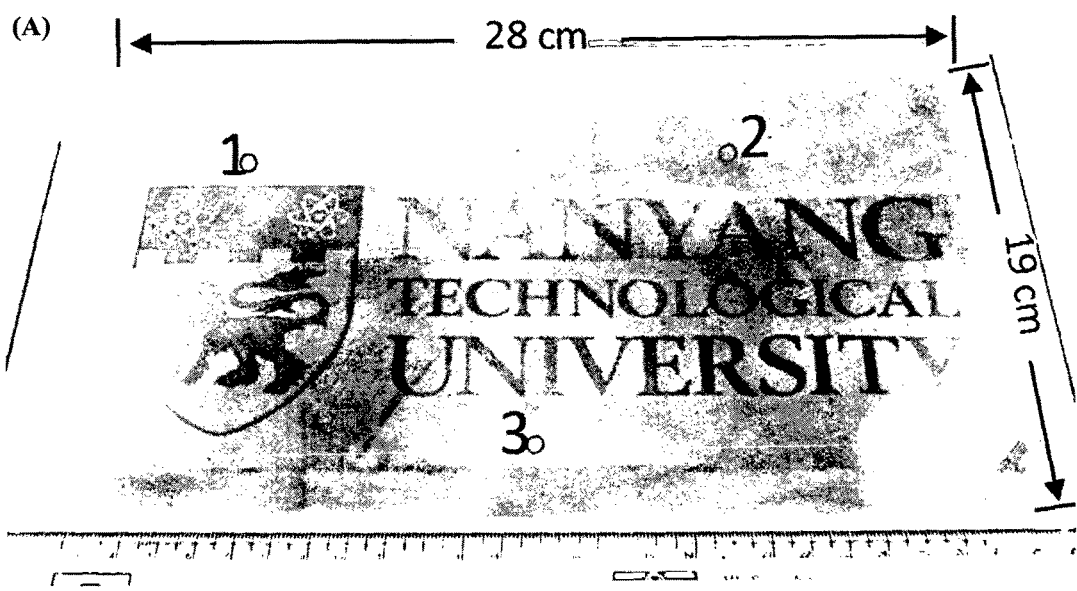
Figure 55:
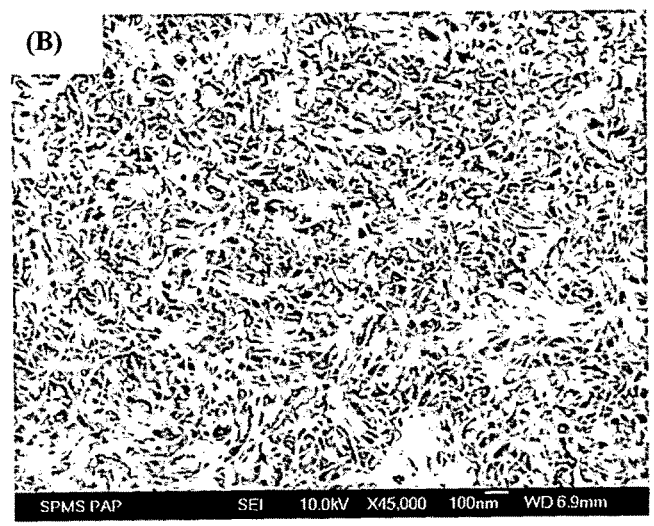

FIG. 55 (A) is a photograph of a conductive film (532 cm$^2$) made of ultrathin AuNWs on a large glass slide. Sheet resistance at the three different spots was measured to be: (1) 53.8 Ω/sq; (2) 45.1 Ω/sq; and (3) 76.5 Ω/sq. FIG. 55(B) is a SEM image of AuNWs grown on a scale-down sample with similar transparency as sample A. Scale bar denotes a length of 100 nm.

Figure 56:
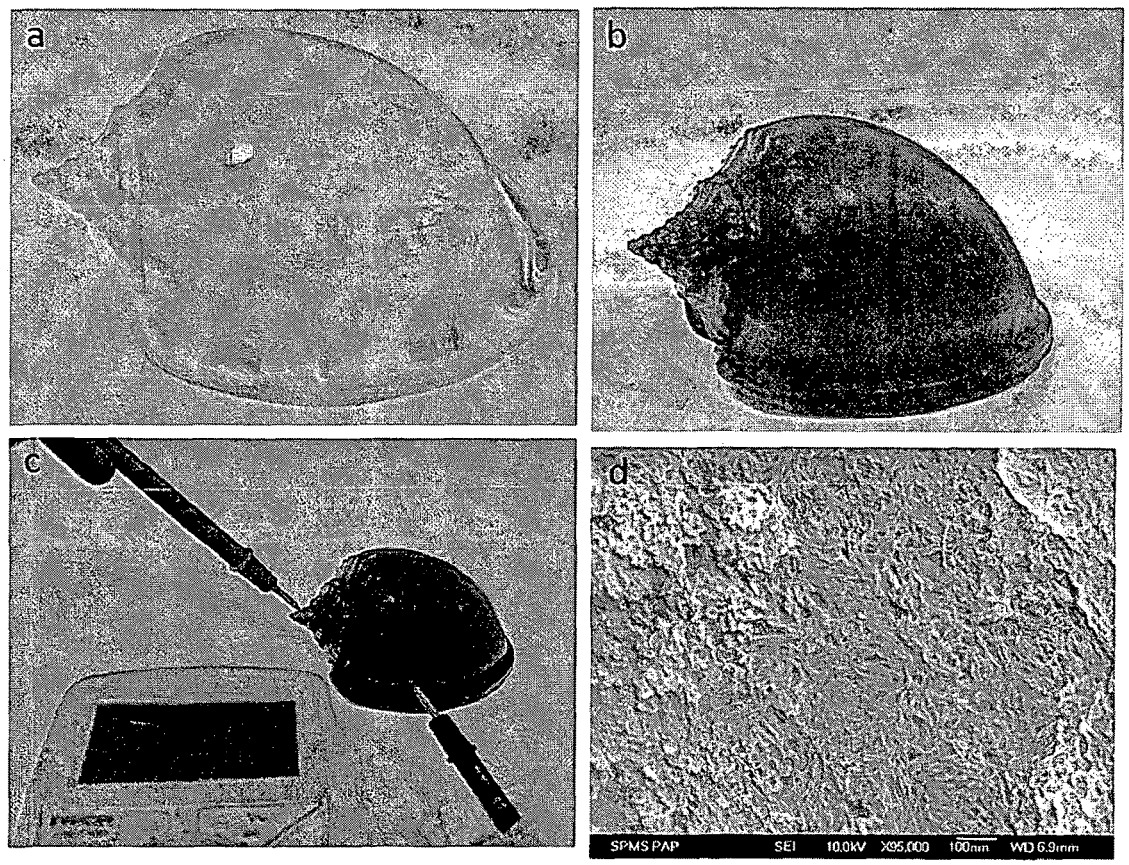

FIG. 56 (A) to (C) are photographs of a trumpet shell (A) before; and (B) after coating a AuNW film; (C) point to point resistance of AuNW-coated trumpet shell measured by digital multimeter. From the figure, it can be seen that the resistance is 117Ω from the tip to the edge. FIG. 56 (D) is a SEM image of AuNWs on sample b (a small chip was removed for characterization).

Figure 57:
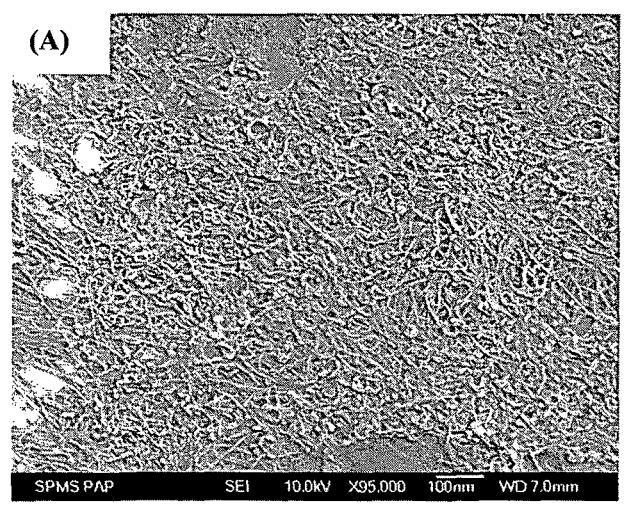
Figure 57:
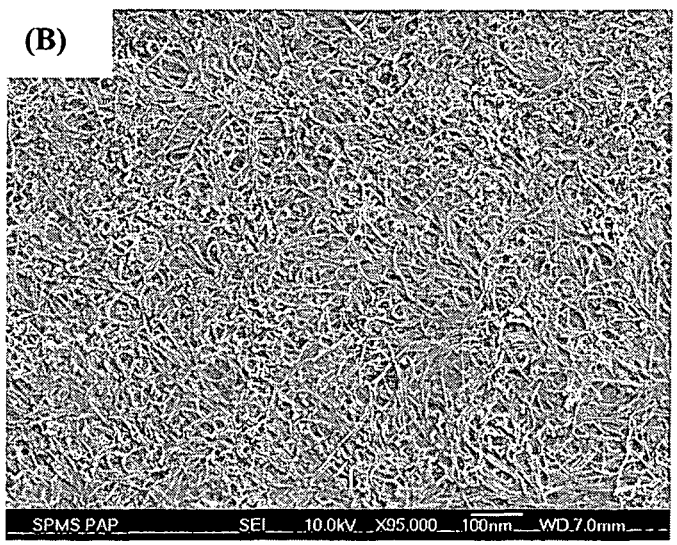
Figure 57:
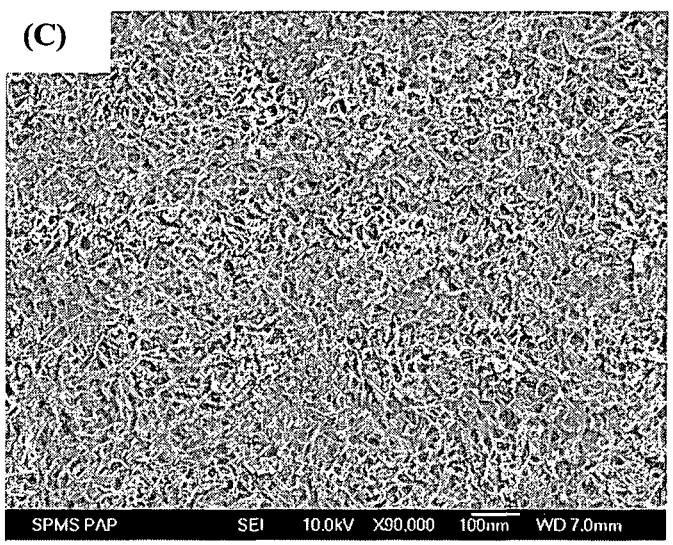

FIG. 57 (A) to (C) are SEM images of AuNWs grown on different substrates of (A) Al$_2$O$_3$; (B) SrTiO$_3$; and (C) LaAlO$_3$.

Figure 5:
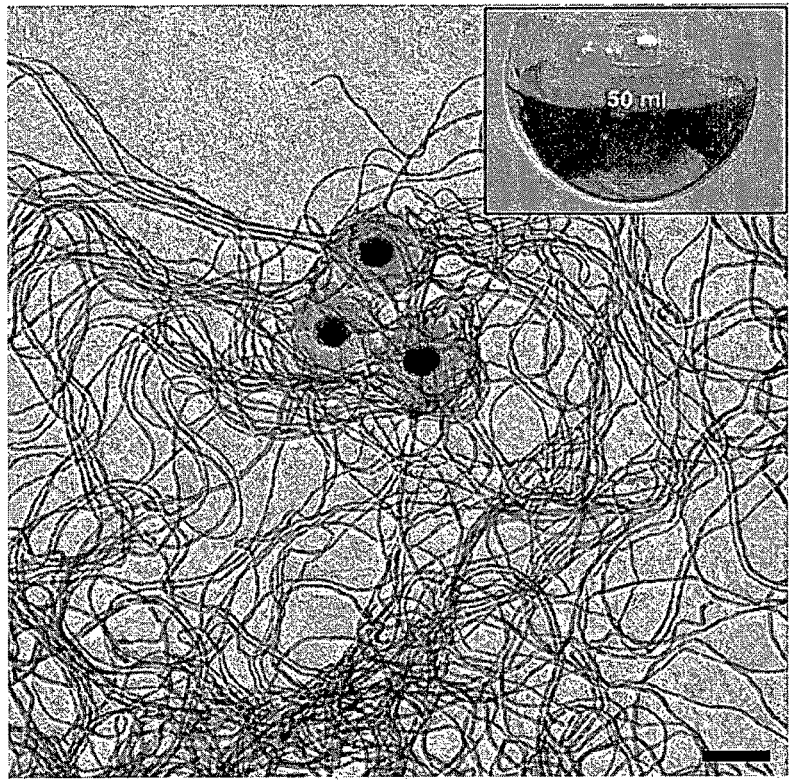
FIG. 5(A) is a TEM image of gold nanowires on silica-coated gold nanoparticles [(AuNP@silica)@AuNWs] synthesized using 4-mercapto-phenylacetic acid (4-MPAA) as ligand and polyvinyl pyrrolidone (PVP) as surfactant. Inset of the figure shows a scaled-up reaction. Scale bar in the figure depicts a length of 50 nm.
FIGS. 5(B) and (C) are respectively, a low and high magnification TEM image of (AuNP@silica)@AuNWs nanocomposites using 4-MPAA ligand with a higher quantity of $HAuCl_4$.
Figure 5:
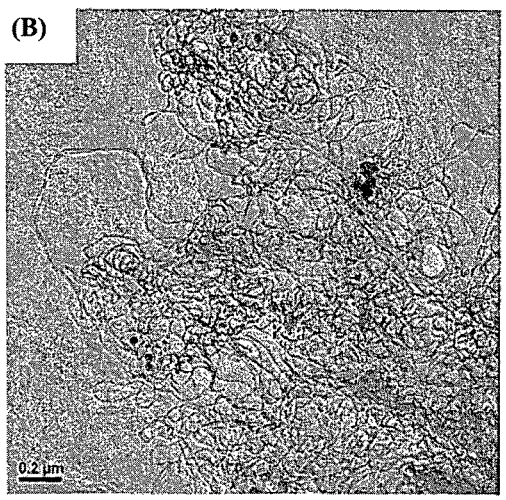
Figure 5:
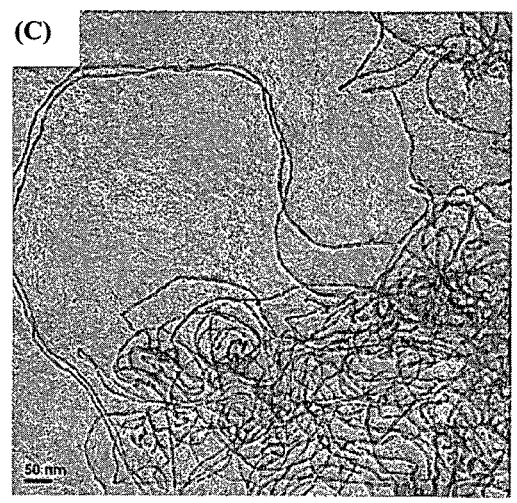
Figure 58:
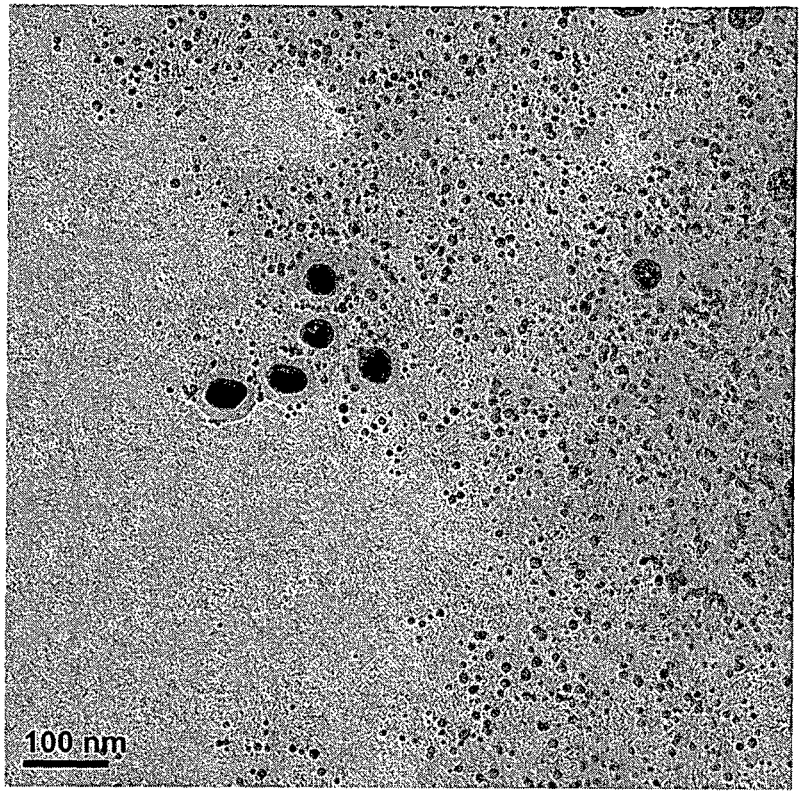

FIG. 58 is a TEM image of NPs which were obtained from a control experiment carried out using AuNP@silica without attached seeds, prepared under otherwise the same reaction conditions as for FIG. 5. Scale bar in the figure denotes a length of 100 nm.

Figure 59:
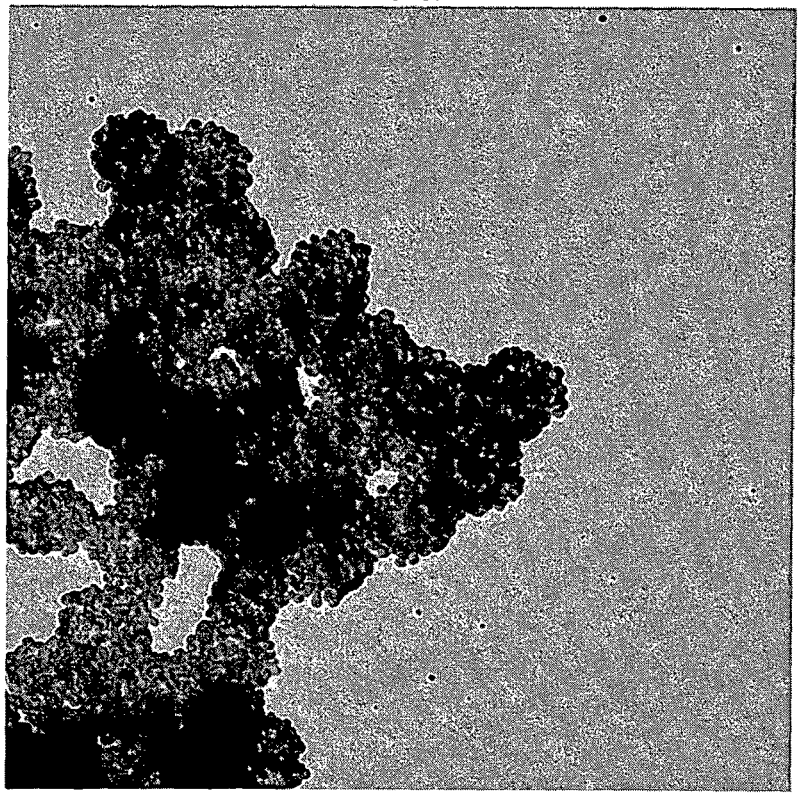

FIG. 59 is a TEM image of triple-layer (AuNP@Silica) @Au_shell which were obtained from a control experiment carried out in the absence of thiol-ligands. Scale bar in the figure denotes a length of 0.1 µm.

Figure 60:
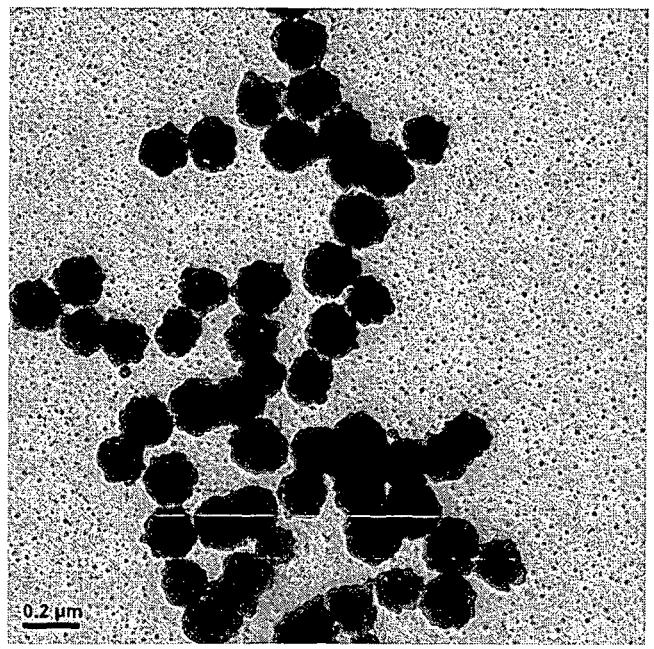

FIG. 60 is a TEM image of large AuNPs from a control experiment carried out in the absence of free Au seed or (AuNP@silica)@seeds using 0.7 mM 4-MPAA as ligand. Scale bar=0.2 µm.

Figure 61:
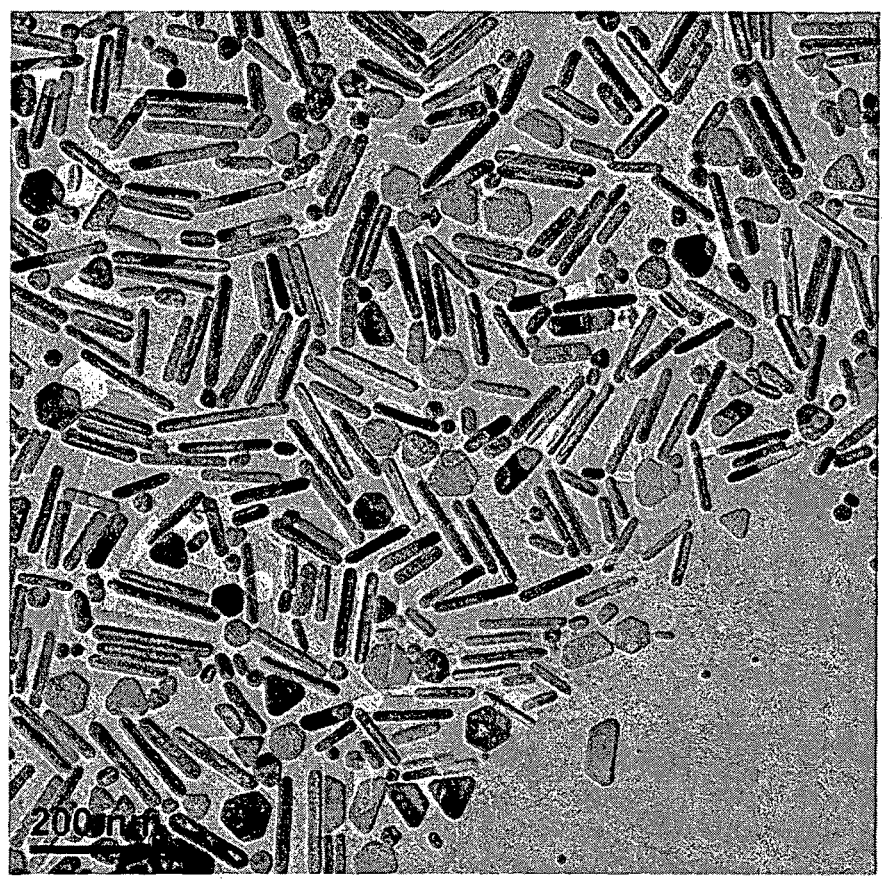

FIG. 61 is a TEM image of NPs which were obtained from a control experiment carried out by using CTAB as ligand in the presence of (AuNP@silica)@seeds. Many Au nanorods and nanosheets were observed. Scale bar=200 nm.

Figure 62:
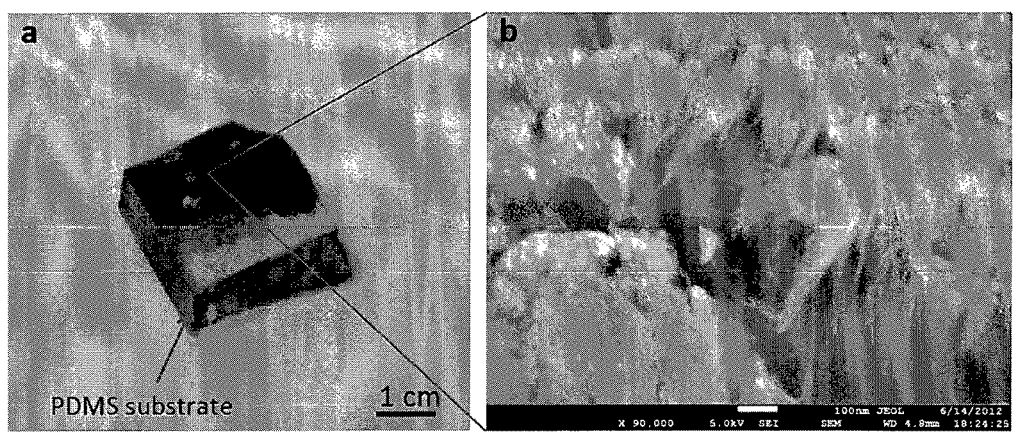

FIG. 62 is (a) a photograph of resulting polydimethylsiloxane (PDMS) after nanowire growth; and (b) SEM image of AuNWs on the surface of sample in (a).

DETAILED DESCRIPTION OF THE INVENTION

In a first aspect, the invention refers to a method for forming gold nanowires on a substrate. The method comprises a) attaching noble metal nanoparticles onto the substrate; and b) contacting the noble metal nanoparticles with an aqueous solution comprising a ligand, gold ions and a reducing agent, wherein the ligand is an organic compound having a thiol group.

The method of forming gold nanowires according to the first aspect allows growth of ultrathin gold nanowires to be selectively carried out on noble metal nanoparticles, such as gold nanoparticles, which are attached to a substrate. By positioning the nanoparticles on the substrate, designed growth of nanowires on specified locations on a substrate may be carried out. This selective growth of the ultrathin gold nanowires renders it possible to customize and to create nanohybrid structures or networks of gold nanowires for use in device fabrication. Furthermore, using a method of the first aspect, ultrathin gold nanowires with diameters of less than 10 nm and/or with narrow diameter distribution may be fabricated in a simple and efficient manner.

A nanowire refers generally to an elongated structure having a cross-sectional dimension that is in the nanometers range. For example, the nanowire may have a cross-sectional dimension that is less than 100 nm. The term "nanowire" as used herein may also be used to refer to other elongated nanostructures, such as nanorods, nanofibers, nanotubes, and nanoribbons. The cross-section of the nanowire may assume any shape, and may be uniform or non-uniform throughout the length of the nanowire.

The method for forming gold nanowires on a substrate includes attaching noble metal nanoparticles onto the substrate. A "nanoparticle" refers to a particle having a characteristic length, such as diameter, in the range of up to 100 nm. Examples of a noble metal include silver (Ag), palladium (Pd), gold (Au), platinum (Pt), iridium (Ir), osmium (Os), rhodium (Rh) and ruthenium (Ru). In various embodiments, the noble metal nanoparticles are nanoparticles comprising or consisting essentially of gold, silver, platinum, palladium, or combinations thereof.

In some embodiments, the noble metal nanoparticles are nanoparticles comprising or consisting essentially of gold. In one embodiment, the noble metal nanoparticles are gold nanoparticles. The gold nanoparticles may be present as colloidal nanoparticles in solution. In one specific embodiment, gold nanoparticles prepared by the Turkevich method, which involves citrate reduction of chloroauric acid, are used.

The noble metal nanoparticles may have a regular shape, or may be irregularly shaped. For example, the noble metal nanoparticle may be a sphere, a rod, a cube, or irregularly shaped. The size of the noble metal nanoparticles may be characterized by their mean diameter. The term "diameter" as used herein refers to the maximal length of a straight line segment passing through the center of a figure and terminating at the periphery. The term "mean diameter" refers to an average diameter of the nanoparticles, and may be calculated by dividing the sum of the diameter of each nanoparticle by the total number of nanoparticles. Although the term "diameter" is used normally to refer to the maximal length of a line segment passing through the centre and connecting two points on the periphery of a nanosphere, it is also used herein to refer to the maximal length of a line segment passing through the centre and connecting two points on the periphery of nanoparticles having other shapes, such as a nanotube or a nanotetrahedra, or an irregular shape.

The mean diameter of the noble metal nanoparticles may be about 3 nm to about 15 nm, such as about 3 nm to about 10 nm, about 10 nm to about 15 nm, or about 15 nm. In one embodiment, the mean diameter of the noble metal nanoparticles is about 15 nm. In various embodiments, the noble metal nanoparticles are essentially monodisperse.

To avoid that the noble metal nanoparticles aggregate in the solution, negatively charged noble metal nanoparticles may be used. In some embodiments, the negatively charged noble metal nanoparticles comprise or consist essentially of gold nanoparticles carrying a negative charge at the nanoparticle surface. Gold nanoparticles with a negative surface charge may be nanoparticles in which the negative charge of the gold nanoparticles is conferred by a carboxylic acid, sulfonic acid, carbolic acid or a mixture of the aforementioned acids which is immobilized at the surface of the gold nanoparticles. For example, the carboxylic acid may be, but is not limited to citric acid, lactic acid, acetic acid, formic acid, oxalic acid, uric acid, pyrenedodecanoic acid, mercaptosuccinic acid, aspartic acid, to name only a few.

In one specific embodiment in which gold nanoparticles are used, citric acid is used to form negatively charged gold nanoparticles comprising a surface layer of citrate ions. For example, the gold nanoparticles may be citrate-stabilized gold nanoparticles.

To attach the noble metal nanoparticles to the substrate, the method of the first aspect may further comprise coating a surface of the substrate with a binding agent for attaching the noble metal nanoparticles to the substrate. Depending on the type of substrate and noble metal nanoparticles used, different binding agents may be used. Generally, any material that is able to attach the noble metal nanoparticles to the substrate may be used.

For example, when the substrate comprises or consists essentially or glass or metal oxide, the surface of the substrate may contain hydroxyl groups. Suitable binding agents for such substrates may include organofunctional alkoxysilane molecules. Accordingly, the binding agent may comprise organofunctional alkoxysilane molecules such as, but are not limited to, (3-aminopropyl)-triethoxysilane, (3-aminopropyl)-diethoxy-methylsilane, (3-aminopropyl)-dimethyl-ethoxysilane, (3-glycidoxypropyl)-dimethyl-ethoxysilane, (3-mercaptopropyl)-trimethoxysilane, (3-mercaptopropyl)-methyl-dimethoxysilane, or a mixture thereof. In various embodiments, the binding agent comprises or consists essentially of 3-aminopropyltrimethoxysilane (APTMS).

In other embodiments, the noble metal nanoparticles may be attached to the substrate without the use of a binding agent. For example, in case the substrate is positively charged and the noble metal nanoparticles are negatively charged nanoparticles, the nanoparticles may be attached to the substrate by electrostatic interaction, whereby the term "electrostatic interaction" refers to attraction between electrically charged molecules, such as between a negatively charged molecule and a positively charged molecule.

The substrate may be incubated in a suspension comprising noble metal nanoparticles to allow adsorption of the noble metal nanoparticles on the substrate, hence attaching the noble metal nanoparticles onto the substrate. The time for incubation may be any suitable time necessary to allow adsorption of the noble metal nanoparticles. For example, the incubating time may range from about 1 min to about 5 hours, such as about 5 minutes to about 2 hours, about 10 minutes to about 1 hour, or about 10 minutes.

The noble metal nanoparticles attached to the substrate may have an inter-particle distance of less than 5 nm, such as less than 4 nm, less than 3 nm, less than 2 nm or less than 1 nm. Generally, the larger the surface area of the substrate, the larger the number of noble metal nanoparticles that may be attached to the substrate.

The substrate may, in general, be formed from any material. For example, the substrate may be a metal such as a noble metal or a transition metal, a polymer such as polyethylene terephthalate (PET) or polydimethylsiloxane (PDMS), a natural derivative such as shells of sea snails, or carbon such as graphene. The substrate may be silica, alumina, titania, strontium titanium oxide, lanthanum aluminum oxide, calcium carbonate, silicon, paper, glass, polymers, or combinations thereof. In various embodiments, the substrate is silica, glass, polyethylene terephthalate or polydimethylsiloxane. In one embodiment, the substrate is polydimethylsiloxane.

The substrate may also have any shapes, such as a cylinder, a sphere, a hemisphere, a pyramid, a diamond, or is irregularly shaped. Accordingly, the surface of the substrate wherein the noble metal nanoparticles are attached to may be non-planar. In some embodiments, the substrate may comprise a planar surface onto which the noble metal nanoparticles are attached. For example, the support may be in the form of a flat sheet, or a cuboid, or the planar side of a hemisphere. The substrate may be in the form of a nanoparticle. The substrate may also assume the shape as it is used in an electronic device, such as in thin-film transistors.

As mentioned above, the method of the first aspect allows designed growth of nanowires on specified locations on a substrate by positioning the nanoparticles. For example, the noble metal nanoparticles may be attached to designated locations on a substrate. Given that the nanowires are only grown on the attached noble metal nanoparticles, the resulting nanowire-substrate structure may be designed for use in fabricating of devices. Advantageously, it has been surprisingly found by the inventors that the width of the resulting gold nanowires is independent on the size of the nanoparticles or seeds. As a result, gold nanowires having a narrow diameter distribution may be obtained using a method of the first aspect.

In some embodiments, the standard deviation of diameter distribution of the gold nanowires is equal to or less than 30% of the mean diameter value, such as equal to or less than 25%, 20%, 15%, 10%, 5%, or 2% of the mean diameter value. In some embodiments, the diameter of the gold nanowires is essentially the same.

The method according to the first aspect includes contacting the noble metal nanoparticles with an aqueous solution comprising a ligand, gold ions and a reducing agent, wherein the ligand is an organic compound having a thiol group.

The term "organic compound" as used herein refers to a hydrocarbon compound which may optionally be substituted with one or more heteroatoms. Examples of heteroatoms include, but are not limited to, oxygen, sulfur, nitrogen, phosphorus, silicon, and halide.

In various embodiments, the ligand is a compound of formula I

(I)

wherein A is a substituted or unsubstituted straight-chain or branched $C_1$-$C_6$ alkyl, substituted or unsubstituted monocyclic, condensed polycyclic or bridged $C_5$-$C_{20}$ aryl or heteroaryl, wherein in the heteroaryl, 1-4 carbon atoms are replaced by O, N or S, and wherein $R_1$ is selected from —H, —OH, —COOH, —CONH$_2$, —NH$_2$, —NO$_2$, —SO$_3$H, —OSO$_3$H, —OP(=O)(OH)$_2$, $C_1$-$C_4$ alkyl substituted with one or more substituents selected from the group consisting of OH, —COOH, —CONH$_2$, —NH$_2$, —NO$_2$, —SO$_3$H, —OSO$_3$H, and —OP(=O)(OH)$_2$.

The term "substituted or unsubstituted straight-chain or branched $C_1$-$C_6$ alkyl" refers to a fully saturated aliphatic hydrocarbon. Whenever it appears here, a numerical range, such as 1 to 10 or $C_1$-$C_{10}$ refers to each integer in the given range, e.g. it means that an alkyl group comprises only 1 carbon atom, 2 carbon atoms, 3 carbon atoms etc. up to and including 6 carbon atoms. Examples of alkyl groups may be, but are not limited to, methyl, ethyl, n-propyl, isopropyl, n-butyl, isobutyl, s-butyl, t-butyl, n-hexyl, and the like. Exemplary substituents include $C_1$-$C_6$ alkoxy, $C_5$-$C_6$ aryl, $C_5$-$C_6$ aryloxy, sulfhydryl, $C_5$-$C_6$ arylthio, halogen, hydroxyl, amino, sulfonyl, carbonyl, nitro, cyano, and carboxyl.

The term "monocyclic aryl" refers to a monocyclic aromatic carbon ring. Examples of monocyclic aryl groups may be, but are not limited to, phenyl and the like.

The term "condensed polycyclic aryl" refers to an aromatic carbon ring structure in which more than 1 monocyclic carbon rings are condensed or fused. Examples include naphthyl, anthracenyl, and phenanthryl.

The term "bridged aryl" refers to an aromatic carbon ring structure in which 1 aromatic carbon ring is connected to another aromatic carbon ring via a bridging group or atom, such as Si, O, S, or NH, or via a direct bond. Examples include biphenyl, triphenyl, phenyl-naphthyl, binaphthyl, diphenyl ether, diphenyl sulphide, diphenyl disulphide and the like.

The term "$C_5$-$C_{20}$", as used herein, means that the respective group has between 5 and 20 carbon atoms. In various embodiments, such a group is a $C_5$-$C_{14}$ aryl, a $C_6$-$C_{12}$ aryl, a $C_6$ aryl, a $C_{10}$ aryl, a $C_{12}$ aryl, or a $C_{14}$ aryl. In relation to a heteroaryl, this means that the heteroaryl is 5-20-membered, as 1 to 4 of the carbon atoms can be replaced by heteroatoms, as defined above.

The term "substituted", as used herein, means that a hydrogen atom of a compound or moiety is replaced by a substituent or heteroatom. Exemplary substituents include alkoxy, aryl, aryloxy, sulfhydryl, arylthio, halogen, hydroxyl, amino, carbonyl and carboxyl. Examples of heteroatoms have already been described above.

In some embodiments, the ligand is a compound of formula II

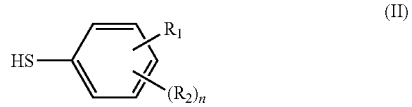

(II)

wherein $R_1$ is selected from —H, —OH, —COOH, —$CONH_2$, —$NH_2$, $NO_2$, —$SO_3H$, —$OSO_3H$, —OP(=O)(OH)$_2$, $C_1$-$C_4$ alkyl substituted with one or more substituents selected from the group consisting of OH, —COOH, —$CONH_2$, —$NH_2$, $NO_2$, —$SO_3H$, —$OSO_3H$, and —OP(=O)(OH)$_2$, and wherein $R_1$ is in meta or para position relative to the thiol group; each $R_2$ is independently selected from the group consisting of, —H, —OH, —COOH, —$CONH_2$, —$NH_2$, $NO_2$, —$SO_3H$, —$OSO_3H$, —OP(=O)(OH)$_2$, unsubstituted or substituted $C_1$-$C_4$ alkyl; and wherein n is 0, 1, 2, 3 or 4.

For example, the ligand may be 4-mercapto-phenylacetic acid (4-MPAA), 4-mercaptobenzoic acid (4-MBA), 3-mercaptobenzoic acid (3-MBA), 4-mercaptophenol (4-MPN), and mixtures thereof. In one embodiment, the ligand comprises or consists of 4-mercaptobenzoic acid (4-MBA).

The ligand may be present in an amount that is sufficient to cover a portion of a surface of the noble metal nanoparticles to form the gold nanowires. For example, the ligand may be present in an amount that is sufficient to cover about 5% to about 95% of a surface of the noble metal nanoparticles, such as about 10% to about 80%, about 25% to about 75%, or about 40% to about 80%. In various embodiments, the concentration of the ligand in the solution may be in the range of about 0.1 mM to about 1.4 mM, such as about 0.1 mM to about 1 mM, about 0.5 mM to about 1 mM, or about 0.7 mM.

The aqueous solution also includes gold ions. In contacting the noble metal nanoparticles with the gold ions comprised in the aqueous solution, the gold ions may be adsorbed on the noble metal nanoparticles to form the gold nanowires. For example, the aqueous solution containing gold ions may comprise chloroauric acid, tetrachloroauric acid, a lithium salt of tetrachloroauric acid, a sodium salt of tetrachloroauric acid, a potassium salt of tetrachloroauric acid, tetrabromoauric acid, a lithium salt of tetrabromoauric acid, a sodium salt of tetrabromoauric acid, a potassium salt of tetrabromoauric acid, tetracyanoauric acid, a sodium salt of tetracyanoauric acid and a potassium salt of tetracyanoauric acid. In various embodiments, the gold ions may be provided by a gold source such as chloroauric acid, gold trichloride, gold potassium chloride, and combinations thereof. In various embodiments, chloroauric acid is used as the source of gold ions.

The aqueous solution further comprises a reducing agent. The term "reducing agent" as used herein, refers to an agent that donates electrons in an oxidation-reduction reaction. Examples of a reducing agent include, but are not limited to, a hydrazine compound, sodium citrate, hydroquinone, ethylene glycol, oxalic acid, sodium borohydride, hydrogen, formaldehyde, ascorbic acid, and hydroxylamine. Examples of a hydrazine compound that may be used include hydrazine, hydrazine hydrochloride, hydrazine sulfate, hydrazine hydrate, hydrazine monohydrate, phenyl hydrazine, benzyl hydrazine, and ethyl hydrazine.

In various embodiments, the reducing agent is selected from the group consisting of hydroquinone, sodium citrate, hydrazine, ethylene glycol, oxalic acid, sodium borohydride, formaldehyde, ascorbic acid, and combinations thereof. In one embodiment, the reducing agent comprises or consists essentially of ascorbic acid.

The solution may further comprise a surfactant. The surfactant may be polyvinyl pyrrolidone (PVP), sodium dodecyl sulfate, sodium citrate, hexadecyltrimethylammonium bromide, sodium dodecyl benzene sulfonate, octyl phenol ethoxylate, or combinations thereof. In one embodiment, the surfactant comprises or consists essentially of polyvinyl pyrrolidone (PVP).

The length of time to form the gold nanowires may range from a few seconds to a few hours, depending on factors such as concentration of the gold ions, the ligand, and the reducing agent in solution, the number of noble metal nanoparticles present, and the length of the gold nanowires to be formed. In one embodiment, the noble metal nanoparticles are contacted with the aqueous solution for about 10 minutes to form the gold nanowires.

The method of the first aspect may further comprise depositing a layer of metal nanoparticles on the gold nanowires. The metal nanoparticles may comprise or consist of a noble metal, a transition metal, or a combination thereof. Examples of a noble metal include silver (Ag), palladium (Pd), gold (Au), platinum (Pt), iridium (Ir), osmium (Os), rhodium (Rh) and ruthenium (Ru). Examples of a transition metal include titanium (Ti), vanadium (V), chromium (Cr), manganese (Mn), iron (Fe), cobalt (Co), nickel (Ni), copper (Cu) and zinc (Zn). In various embodiments, the metal nanoparticles comprise or consist essentially of silver.

Advantageously, it has been found by the inventors that deposition of a layer of metal nanoparticles on the gold nanowires improves the electrical conductivity of the gold nanowires network structure. This is particularly beneficial in application areas such as transparent thin film transistors, in which transparency of the gold nanowire structure is important.

In a second aspect, the invention refers to gold nanowires formed by a method according to the first aspect.

The gold nanowires that are formed may be ultrathin, in that they have a mean diameter of less than 20 nm, such as about 5 nm to about 20 nm, about 5 nm to about 15 nm, about 5 nm to about 10 nm, or about 6 nm. As mentioned above, gold nanowires having a narrow diameter distribution may be obtained.

In a third aspect, the invention refers to an electronic device comprising gold nanowires formed by a method according to the first aspect. The gold nanowires according to various aspects of the invention may be used to manufacture an electrode, such as an electrode for a supercapacitor; a sensor; or a transistor such as a transparent thin film transistor. These, in turn, may find applications in high performance microelectronics applications.

The invention illustratively described herein may suitably be practiced in the absence of any element or elements, limitation or limitations, not specifically disclosed herein. Thus, for example, the terms "comprising", "including", "containing", etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the inventions embodied therein herein disclosed may be resorted to by those skilled in the art, and that such modifications and variations are considered to be within the scope of this invention.

The invention has been described broadly and generically herein. Each of the narrower species and subgeneric groupings falling within the generic disclosure also form part of the invention. This includes the generic description of the invention with a proviso or negative limitation removing any subject matter from the genus, regardless of whether or not the excised material is specifically recited herein.

Other embodiments are within the following claims and non-limiting examples. In addition, where features or aspects of the invention are described in terms of Markush groups, those skilled in the art will recognize that the invention is also thereby described in terms of any individual member or subgroup of members of the Markush group.

EXPERIMENTAL SECTION

Figure 1:
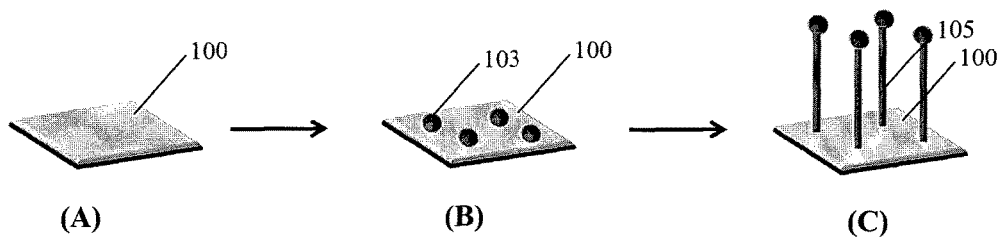
FIG. 1 depicts a general process scheme of a method for forming gold nanowires.

An seeded growth of ultrathin AuNWs involving a new ligand system is presented. FIG. 1 depicts a general process scheme of a method for forming gold nanowires. In FIG. 1(A), a substrate 100 is provided. Noble metal nanoparticles such as gold nanoparticles 103 are attached to the substrate 100 as shown in FIG. 1(B). The noble metal nanoparticles 103 are contacted with an aqueous solution comprising a ligand, gold ions and a reducing agent, to form gold nanowires 105 on the substrate 100 as shown in FIG. 1(C).

Figure 2:
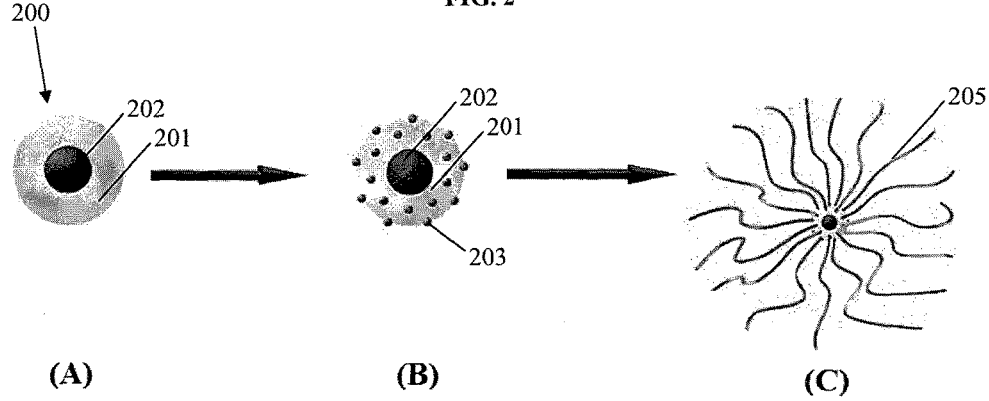
FIG. 2 depicts a process scheme of a method for forming gold nanowires according to an embodiment.
Figure 3:
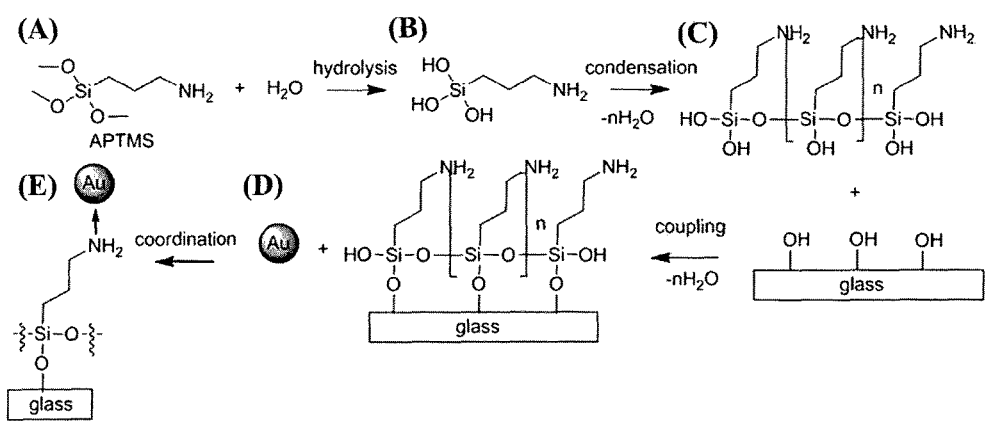
FIG. 3 is a schematic diagram showing a process for preparing glass substrate with gold nanoparticles attached thereon according to an embodiment.

FIG. 2 depicts a process scheme of a method for forming gold nanowires according to an embodiment. In FIG. 2(A), a substrate 200 in the form of a nanoparticle having a gold core 202 and a silica shell 201 is provided. Gold nanoparticles 203 are attached to the surface of the silica shell 201 as shown in FIG. 2(B). The gold nanoparticles 203 are contacted with an aqueous solution comprising a ligand, gold ions and a reducing agent, to form gold nanowires 205 on the substrate 200 as shown in FIG. 2(C).

The growth of nanowires occurs only on Au seeds anchored on silica surface and produces bonded AuNWs thereon. Thus, it allows facile synthesis of NW-based hierarchical nanostructures. Intriguingly, the width of the resulting AuNWs is independent on the size of the seeds, which is critical for the efficient synthesis of ultrathin AuNWs with narrow diameter distribution.

Example 1: Materials

All solutions were prepared using deionized (DI) water (resistivity>18 $M\Omega \cdot cm^{-1}$). 4-mercaptophenylacetic acid (4-MPAA, 97%, Alfa Aesar), 4-mercaptobenzoic acid (4-MBA, 90%, Sigma Aldrich), 4-mercaptophenol (4-MPN, 90%, Alfa Aesar), 3-mercaptobenzoic acid (3-MBA, 95%, Sigma Aldrich), hydrogen tetrachloroaurate (III) ($HAuCl_4$, 99.9%, Au 49% on metals basis, Alfa Aesar), 3-aminopropyltriethoxysilane (APTES, Sigma Aldrich), sodium citrate tribasic dihydrate (99.0%, Sigma Aldrich), Polyvinylpyrrolidone (PVP, 99%, Alfa Aesar), L-ascorbic acid (Sigma Aldrich), 11-mercaptoundxadecanoic acid (11-MUA, Sigma Aldrich), tetraethylorthosilicate (TEOS, Sigma Aldrich), Hexadecyltrimethylammonium bromide (CTAB, Sigma Aldrich), Ammonia (25%-28% w/w, Chemical Reagent), 2-propanol (HPLC grade) and ethanol (analytical grade) were used as received. Copper specimen grids (200 mesh) with formvar/carbon support film (referred to as TEM grids in the text) were purchased from XinXing BaiRui (T10023).

Example 2: Methods of Characterization

Transmission electron microscopy (TEM) images were collected on a JEM-1400 (JEOL) operated at about 100 kV to 120 kV. High resolution TEM (HRTEM) images were taken from JEOL 2100 F Field Emission Transmission Electron Microscope at 200 kV. Scanning Electron Microscopy (SEM) images were collected from JEOL JSM-6700F, at 10 kV. Ultraviolet-visible (UV-vis) spectra were collected on a Cary 100 spectrophotometer. Percentage transparency was averaged from the measured T % values from 350 nm to 800 nm using the bare glass slide as corrected baseline. Conductivity was measured by a Neiko digital multi-meter under the ohmmeter mode. The conductivity reported was an average of at least three sets of value measured between two points on each sample at top, middle and bottom respectively.

Example 3: Preparation of TEM Samples

TEM grids were treated with oxygen plasma in a Harrick plasma cleaner/sterilizer for 45 s to improve the surface hydrophilicity. The hydrophilic face of the TEM grid was then placed in contact with the sample solution. A filter paper was used to wick off the excess solution on the TEM grid, which was then dried in air for 30 min.

Example 4: Synthesis of AuNPs

AuNPs were synthesized using sodium citrate reduction of $HAuCl_4$.

Example 4.1: AuNPs (3-5 Nm)

147 μL of trisodium citrate (1%) and 100 μL of hydrogen tetrachloroaurate solution (50 mM) were added to 20 mL of deionized water while stirring. 600 μL of sodium borohydride solution (100 mM) at 0° C. was then added to the mixture with stirring. The resulting mixture was incubated at room temperature for 30 min.

Example 4.2: AuNPs (15 Nm)

100 mL of hydrogen tetrachloroaurate solution (0.5 mM) was heated to 110° C. with vigorous stirring for 30 min. 2.62 mL of trisodium citrate (38.7 mM) was then added. The resulting mixture was heated for an additional 60 min.

Example 4.3: AuNPs (35 Nm)

100 mL of hydrogen tetrachloroaurate solution (0.25 mM) was heated to reflux with vigorously stirred for 10 min. 12 mL of AuNP seeds (15 nm) and 500 μL of sodium citrate (38.7 mM) was then added. After boiling the solution for 45 min, the solution was cooled to room temperature. Subsequently, sodium citrate was added so that its concentration was 989 μM.

Example 5: Synthesis of Silica Coated-Gold Nanoparticles (AuNP@Silica)

The synthesis of silica coated-gold nanoparticles (AuNP@silica) was carried out using the Stöber method with modifications.

As-synthesized 35 nm citrate-stabilized gold nanoparticles (AuNPs) solution (3 mL) was concentrated to a total of 6 μL by centrifugation at 4000 g for 8 min. After the removal of supernatant, the residual nanoparticles (NPs) were re-dispersed into 500 μL of water. The resulting solution was transferred to 2.5 mL 2-propanol dropwise under vigorous stirring, after which 20 μL 11-MUA (2 mM in ethanol) was added. After 5 min, 600 μL TEOS (8.96 mM in water) was added, followed by 90 μL of ammonia (25% to 28% w/w). Concentric core-shell AuNP@silica were obtained after 12 h of reaction at room temperature. To isolate the AuNP@silica, the reaction mixture was centrifuged at 5200 g for 9 min and the supernatant removed. The residual NPs were re-dispersed in ethanol.

Figure 4:
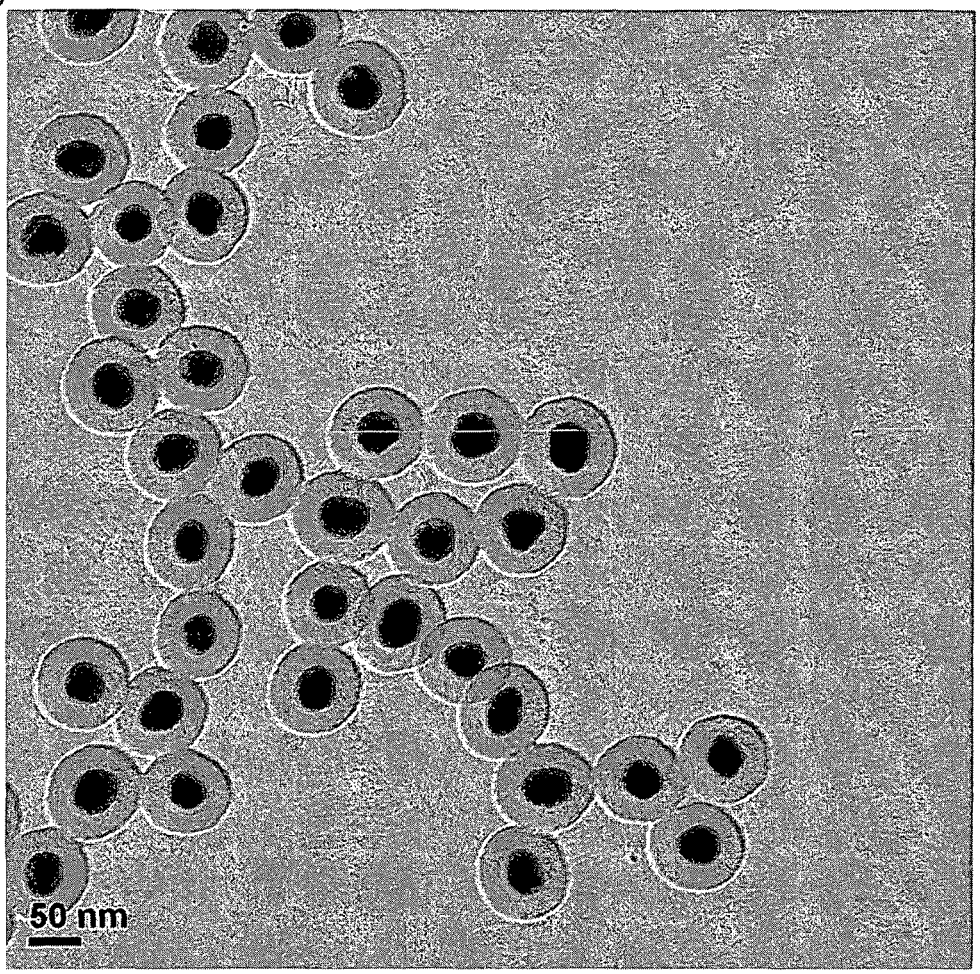
FIG. 4(A) is a large-area transmission electron microscope (TEM) image of silica coated gold nanoparticles (AuNP@silica) using 35 nm AuNP as core.
FIG. 4(B) is a TEM image of AuNP@silica with adsorbed seeds using 35 nm AuNP as core. Scale bar in the figures depicts a length of 50 nm.
Figure 4:
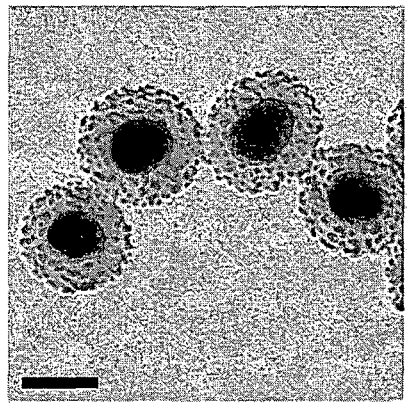

The TEM image of the resulting NPs is shown in FIG. 4A, which is a large-area TEM image of AuNP@silica using 35 nm AuNP as core. It has been shown that silicon wafer with a thermo oxide layer can also be used for growing AuNWs (see, Example 18). Thus, the nature of the silica substrate was not a critical factor for AuNW growth.

Example 6: Synthesis of Silica Coated-Gold Nanoparticles with Gold Nanoparticles Attached Thereon [(AuNP@Silica)@Seeds]

The synthesis of silica coated-gold nanoparticles with gold nanoparticles attached thereon ((AuNP@silica)@seeds) includes preparation of citrate-stabilized Au seeds. In a general method to synthesis Au seeds, a 50 mL flask was filled with 1.47 mg of sodium citrate and 1.70 mg of $HAuCl_4$ which were dissolved in 20 mL of water. 600 μL of ice-cold $NaBH_4$ solution (0.1 M) was then added with vigorous stirring. The solution turned from orange-yellow to brownish-red, indicating the formation of AuNP seeds. The average sizes of the resulting Au seeds were 3-5 nm.

The AuNP@silica as synthesized in Example 5 were functionalized with amino group by their addition to APTES solution. AuNP@silica solution (1.5 mL) was concentrated to a total of about 6 μL by centrifugation at 5200 g for 9 min.

After the removal of the supernatant, the isolated NPs were added into a solution containing 500 μL $H_2O$, 500 μL ethanol and APTES (1 mM). Amino-functionalized AuNP@silica were obtained after 1 h reaction with vigorous stirring. The NPs were purified twice by centrifugation in ethanol at 5200 g for 9 min. Consequently, the concentrated NPs were added into the Au seeds solution (500 μL) and incubated for 2 h to ensure that a single layer of Au seeds has been fully attached onto the Au@silica NPs.

To isolate the (AuNP@silica)@seeds, the mixture was centrifuged at 5200 g for 8 min and the isolated NPs were re-dispersed in 500 μL ethanol. The TEM image of the resulting (AuNP@Silica)@seeds was shown in FIG. 4B, which is a transmission electron microscope (TEM) image of silica coated gold nanoparticles (AuNP@silica), which are used as seeds to grow the gold nanowires.

For preparing (AuNP@silica)@seeds using 15 nm AuNPs as seeds, all reaction conditions were the same except that citrate-stabilized AuNPs with diameter of 15 $nm^2$ were used as seeds to be incubated with the amino-functionalized AuNP@silica. To isolate the (AuNP@silica)@seeds, the mixture was centrifuged at 4000 g for 7 min and the isolated NPs were re-dispersed in 500 μL ethanol.

Example 7: General Synthesis of Gold Nanowires Grown on Silica-Coated Gold Nanoparticles (AuNP@Silica)@AuNWs Gold nanowires grown on silica-coated gold nanoparticles [(AuNP@silica)@AuNWs] can be obtained in the same reaction system using 4-MPAA, 4-MBA, 4-MPN or 3-MBA as ligands. The general synthesis is as follows:

As-synthesized (AuNP@silica)@seeds solution (500 μL) was concentrated to a total of 6 μL by centrifugation at 5200 g for 8 mM. The concentrated solution was then added into a reaction solution containing the acting ligand (0.7 mM), PVP (21 mM), $HAuCl_4$ (1.2 mM) and L-ascorbic acid (3.6 mM) under vigorous stirring. The reaction mixture was then stirred at room temperature for 15 mM, during which its color turned from red to grey. The (AuNP@silica)@AuNWs were obtained after 15 mM of reaction. The resulting nanocomposites were then purified and isolated by centrifugation at 4000 g for 4 mM. The concentrated NPs were collected by removing the supernatant and re-dispersing in water, where they were stable for weeks.

The TEM image of the resulting NPs was shown in FIG. 5, and FIG. 8(A) to (D), for ligands 4-MPAA, 4-MBA, 4-MPN or 3-MBA respectively. For the preparation of (AuNP@silica)@AuNWs with shorter AuNWs and 4-MPAA as ligand (FIGS. 7(A) and 7(B)), all reaction conditions were unchanged except that the concentration of $HAuCl_4$ was lowered to 0.3 mM.

Figure 8:
FIG. 8(a) to (i) is a series of TEM images of gold nanowires on silica-coated gold nanoparticles [(AuNP@silica)@AuNWs] synthesized using the following conditions: (a) 4-MBA as ligand, 0.7 mM HAuCl$_4$; (b) 4-MBA as ligand, 1.2 mM HAuCl$_4$; (c) 4-MPN as ligand, 1.2 mM HAuCl$_4$; and (d) 3-MBA as ligand, 1.2 mM HAuCl$_4$. Nanocomposites resulted from control experiments for sample of FIG. 5 are shown in (e) 2-MBA as ligand; (f) 11-MUA as ligand; (g) the sample of FIG. 5 was coated with silica; (h) 1.4 mM 4-MPAA as ligand, giving gold (Au) nanospheres of 6 nm and 33 nm in diameter. Scale bar in the figures denote a length of 100 nm.
Figure 8:
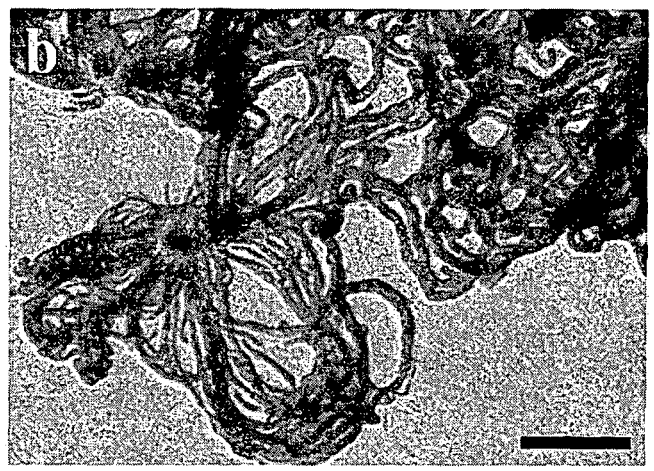
Figure 8:
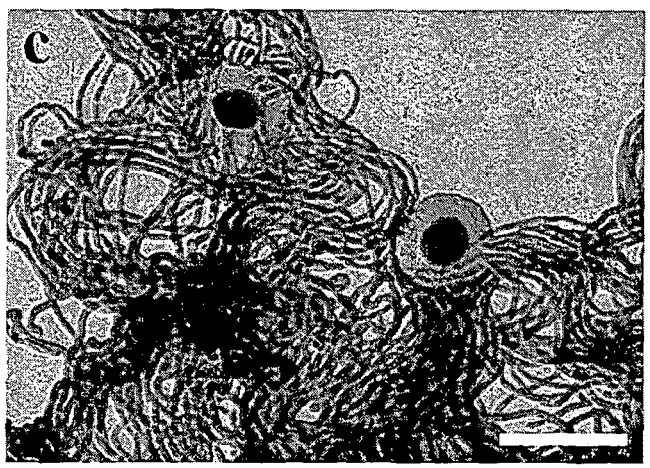
Figure 8:
Figure 8:
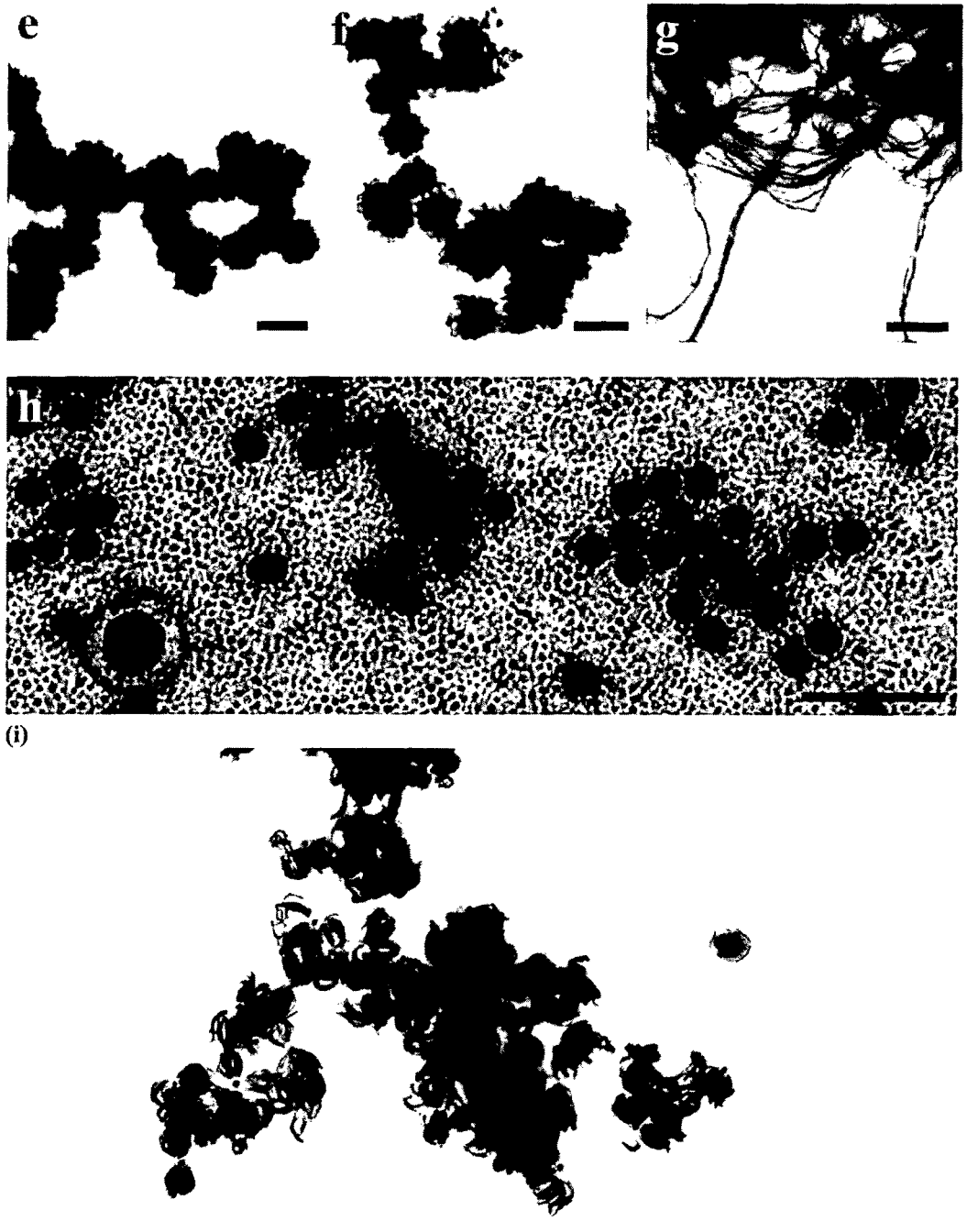

Similarly for (AuNP@silica)@AuNWs with shorter AuNWs and 4-MBA as ligand (FIGS. 8$a$ and 8($i$)), the concentration of $HAuCl_4$ was lowered to 0.7 mM.

Figure 9:
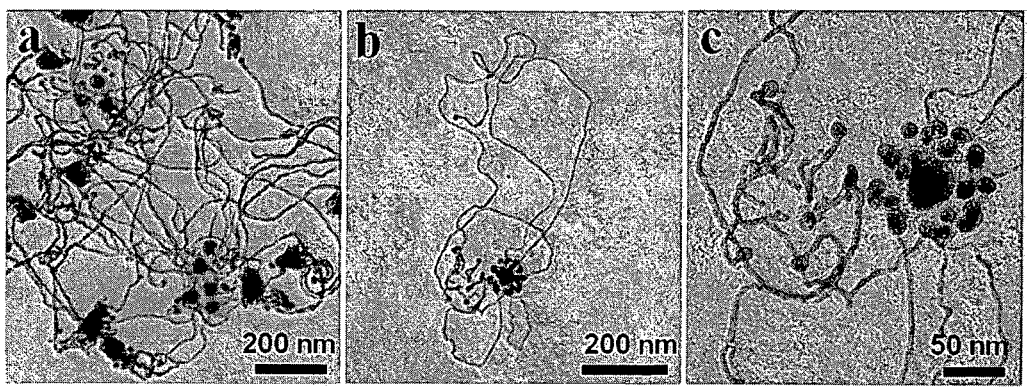
FIG. 9(a) to (c) are low and high magnification TEM images of (AuNP@silica)@AuNWs using 15 nm AuNPs as seeds.

To prepare (AuNP@silica)@AuNWs using 15 nm AuNPs as seeds (FIG. 9($a$) to ($c$)), (AuNP@Silica)@15 nm-seeds nanocomposites were used but all other conditions were the same.

Example 8: Control Experiments

Figure 7:
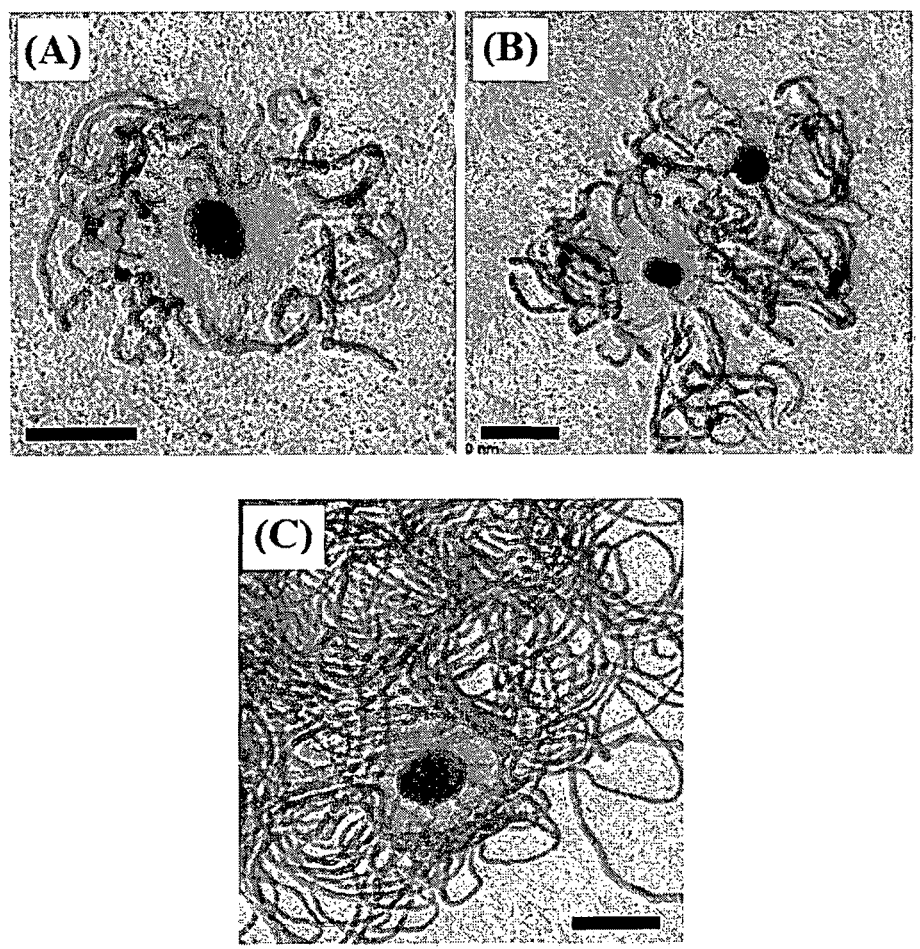
FIGS. 7(A) and (B) are TEM images of (A) isolated and (B) entangled gold nanowires on silica-coated gold nanoparticles [(AuNP@silica)@AuNWs] with short AuNWs prepared using 4-MPAA ligand and PVP surfactant. FIG.
FIG. 7(D) is a large-area TEM image of (AuNP@silica)@AuNWs of the sample shown in FIG. 7(C). Scale bar in the figure denotes a length of 0.1 μm.
Figure 7:
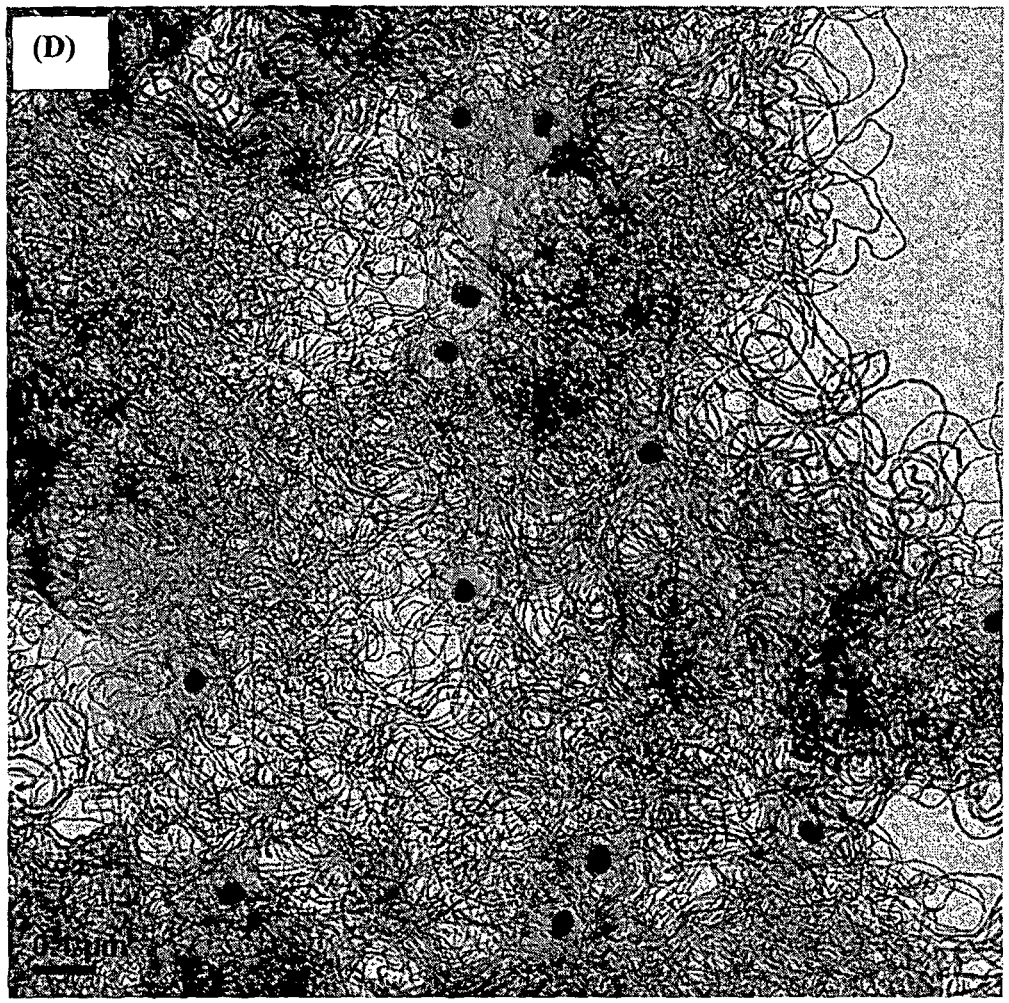

Some control experiments were carried out to elucidate the growth mechanism of AuNWs. (1) (AuNP@silica) @AuNWs can be synthesized without PVP surfactant, with all other conditions unchanged, as shown in FIGS. 7(C) and 7(D); (2) when AuNP@silica (FIG. 4(A)) were used as precursor directly in the reaction solution, numerous small AuNPs were formed as shown in FIG. 5B. (3) In the absence of the thiol-ligands, (AuNP@silica)@Au_shell were obtained as shown in FIG. 59; (4) In the absence of (AuNP@silica)@seeds, spherical AuNPs were obtained using 4-MPAA as ligand, as shown in FIG. 60; (5) when CTAB (5 mM) was used as ligand, the absences of AuNWs were observed as shown in FIG. 61.

Example 9: Synthesis of Ultrathin AuNWs on Silicon Wafer Using 4-MPAA as Ligand

The synthesis of AuNWs on silicon wafer is similar to that of (AuNP@silica)@AuNWs except that bulk silicon wafer was used as a substrate.

Firstly, the wafer chip (1 cm×1 cm) was pre-treated with Piranha solution ($H_2SO_4$ and $H_2O_2$=3:1) to improve its surface hydrophilicity. The wafer was then functionalized with amino group by reacting with APTES solution (2 mM). Subsequently, the wafer was dipped into excess citrate-stabilized Au seeds (3-5 nm) solution and incubated for 2 h to ensure that the wafer was fully encapsulated by a single layer of Au seeds.

The wafer was dipped into water twice to remove the excess Au seeds and a filter paper was used to wick off the excess solution on the wafer surface. The seeds-functionalized wafer was then dipped into the reaction solution (the same as that used for (AuNP@silica)@AuNWs) for 15 min.

Finally, the wafer was dipped into water to remove the excess reactants and a filter paper was used to wick off the excess solution on the wafer surface. All of the thiol-ligands can be used to induce growth of AuNWs on silicon wafer and the SEM image of AuNWs on silicon wafer using MPAA as ligand is shown in FIG. 11b.

Example 10: Ligand Types

Applicable ligands for this system include 4-mercaptophenylacetic acid (4-MPAA), 4-mercaptobenzoic acid (4-MBA), 3-mercaptobenzoic acid (3-MBA), and 4-mercaptophenol (4-MPN). A common characteristic of these ligands is that they have a benzene ring with a hydrophilic group on one side and a thiol group on the other. To the best of our knowledge, this class of ligands was not previously known for directing NW growth.

Example 11: Using 4-MPAA as Ligand to Form AuNWs on Colloidal Substrates

Silica-coated AuNPs (AuNP@silica, $d_{AuNP}$=35 nm; $d_{overall}$=90 nm) were used as the model substrate for growing the ultrathin AuNWs according to an embodiment. The core-shell NPs can be easily recognized among the messy NWs, but the internal AuNPs did not play an active role as confirmed by control experiments using silica NPs.

The silica surface was coated with amino group using 3-aminopropyltriethoxysilane (APTES) to facilitate the subsequent adsorption of citrate-stabilized Au seeds (d=3-5 nm). The resulting (AuNP@silica)@seeds were confirmed by transmission electron microscopy (TEM) as shown in FIG. 4B). About 120-160 seeds were found attached to the surface of each AuNP@silica.

After purification, the (AuNP@silica)@seeds were mixed with 4-MPAA (0.7 mM), surfactant polyvinylpyrrolidone (PVP, 21 mM), $HAuCl_4$ (1.2 mM), and reducing agent L-ascorbic acid (3.6 mM). The reaction mixture was then stirred at room temperature for 15 min, during which its color turned from red to grey. The resulting (AuNP@-silica)@AuNWs were then isolated by centrifugation; after being redispersed in water, they were stable for weeks.

Figure 6:
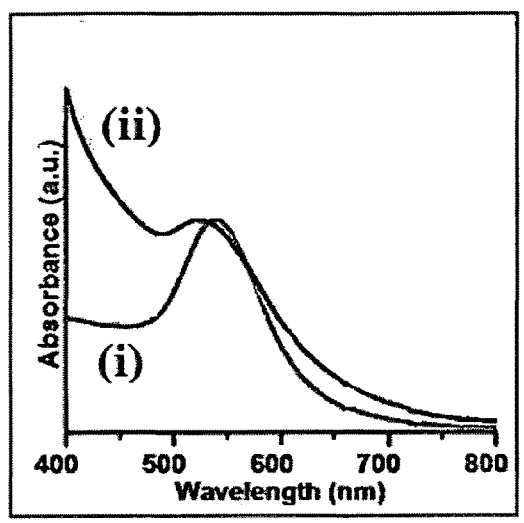
FIG. 6 is a graph showing the UV-Vis spectra of the nanocomposite samples depicted in (i) FIG. 4 and (ii) FIG. 5.

As shown in FIG. 5A, the nanocomposites with long and flexible AuNWs formed messy entangled clusters. The ultrathin AuNWs were very uniform in width (6 nm). Most of them were over 1 μm in length and seem to extend from the silica surface. The UV-Vis spectrum of this sample showed stronger absorption at around 400 nm than that of the original (AuNP-@silica)@seeds (FIG. 6). This new absorption probably arose from the AuNWs, as it was consistent with that of ultrathin AuNWs synthesized in organic systems.

Example 12: Effects of Lowering $HAuCl_4$ Concentration (Using 4-MPAA as Ligand to Form Gold Nanowires (AuNWs))

To confirm the attachment of the AuNWs to the silica surface, attempts were made to restrict AuNW growth by lowering $HAuCl_4$ concentration (0.3 mM; all other conditions unchanged).

With the shorter AuNWs, the (AuNP@silica)@AuNWs were less entangled, resulting in individual nanocomposites and their small clusters (FIGS. 7(A) and (B)). The ultrathin AuNWs were clearly anchored end-on to the silica surface, and each nanocomposite had about 15 wavy AuNWs of about 100 nm in length. During the NW growth, the solution contained very few free seeds; after the growth, few free-standing NWs were observed. Hence, the AuNWs originated from the surface-bound seeds.

Despite the complex hierarchical structure, the synthesis of the (AuNP@silica)@AuNWs was easy and reproducible. The growth of AuNWs only involved the mixing of the ingredients in correct ratio and stirring at room temperature. The synthesis can be easily scaled up to 30 mL (FIG. 5(A) inset) without significant change in the resulting nanostructures.

Example 13: Effects of Ligands on Formation of Gold Nanowires (AuNWs)

The 4-MPAA-derived AuNWs could be easily coated with silica shells without additional ligands (FIG. 8(g)). Ligands with terminal —COOH groups are amenable for silica adsorption. Thus, the direct silica coating was in support for the surface 4-MPAA ligands.

When 4-MPN, 4-MBA, and 3-MBA were used in place of 4-MPAA, ultrathin AuNWs were obtained (FIG. 8), and their length was also tunable. The AuNWs formed using 4-MPN have uniform width of 6 nm, which were the same as those formed by 4-MPAA.

In contrast, the width of AuNWs formed using 3-MBA was variable, even along a same NW (FIG. 8(d)). The AuNWs derived from 4-MBA tend to aggregate like dirty hair to form large bundles, leading to octopus-like hierarchical nanocomposites (FIG. 8a). Upon close inspection, however, the width of the individual AuNWs in the bundle had similar width to those derived from other ligands. Unlike the other AuNWs, the 4-MBA-derived AuNWs often fused after further growth to give NWs of larger diameter (FIG. 8b).

From the experimental results obtained, it may be seen that these ligands played a critical role. Without them but with PVP still present, the surface-bound seeds simply grew larger and fused together into a shell.

The same result was obtained when unsuitable ligands, such as 2-MBA or 11-mercaptoundecanoic acid (11-MUA), were used in the synthesis (FIGS. 8(e) and (f)). However, upon increase of ligand concentration (4-MPAA from 0.7 mM to 1.4 mM, PVP unchanged), AuNWs, did not form. Instead, uniform Au nanospheres of 6 nm and 33 nm in diameter were obtained (FIG. 8(h)). It appeared that the high 4-MPAA concentration prevented AuNW growth by blocking the active surface on the seeds. This led to the homogenous nucleation of Au nanospheres in the solution. The divergence in the diameters of the highly uniform nanospheres suggested that they were thermodynamically controlled, probably a result of the strong surface ligand.

Example 14: Effects of Surfactant on Formation of AuNWs

In our system, PVP acted as a surfactant to prevent the aggregation of the nanostructures. In its absence, 4-MPAA still induced the formation of ultrathin AuNWs, but most of the AuNWs and AuNP@silica were lost due to aggregation.

In FIG. 7(C), the residue AuNWs were 6 nm in diameter, same as those in FIG. 5(A), indicating that PVP did not play a key role in controlling the AuNW width. Although cetyltrimethylammonium Bromide (CTAB) is previously known for directing NW growth, the replacement of the thiol ligands with CTAB in a control experiment gave free Au nanorods independent of the (AuNP@silica)@seeds.

Example 15: Effects of Size of Au Seeds on Formation of AuNWs

To study the role of the Au seeds, a control experiment was carried out using AuNP@silica without the attached seeds. AuNW did not form, instead, small Au nanospheres of 3-8 nm in diameter were observed. Similar results were obtained when only free Au seeds were used: the seeds grew larger but AuNWs did not form. Hence, it appeared that the adsorption of the seeds on the silica surface gave rise to their unique ability of initiating the growth of ultrathin AuNWs.

The diameter of the ultrathin AuNWs was uniform and independent on the size of the Au seeds used.

FIG. 9(a) to (c) are low and high magnification TEM images of (AuNP@silica)@AuNWs using 15 nm AuNPs as seeds. When 15 nm AuNPs were used in place of the 3-5 nm seeds, the resulting AuNWs were still 6 nm in diameter as can be seen from the figure. This observation was surprising, because in typical seeded growth, the size of the NWs was always larger than the seeds from which they grew. With the large seeds, we can easily determine their position after the AuNW growth.

As shown in FIG. 9(c), not all of the seeds were able to grow AuNWs. Most of the tips of the AuNWs that we observed retained the 15 nm AuNP seeds. However, given the high density of surface-bound seeds, it is hard to determine if the attachment of the AuNWs to the silica surface was through these seeds.

Example 16: Morphology of AuNWs Formed

Figure 10:
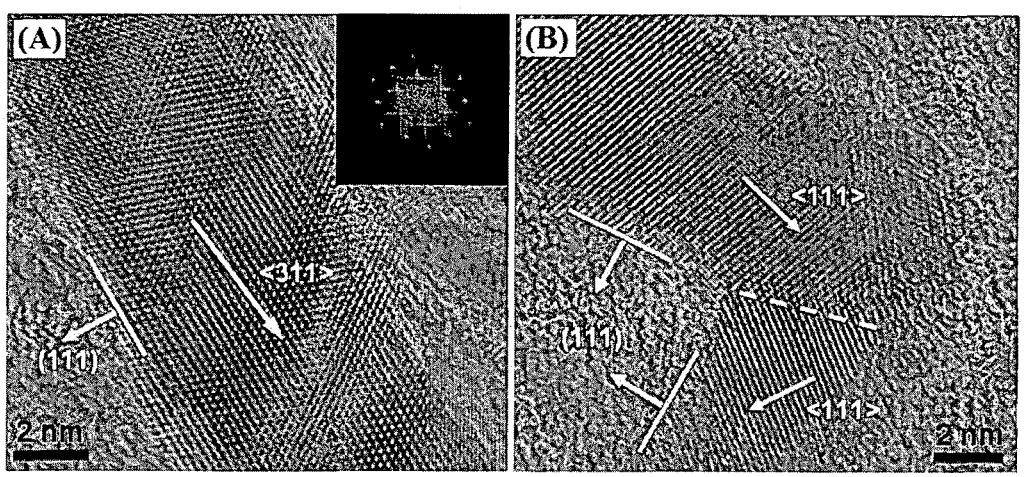
FIGS. 10(A) and (B) are high resolution TEM (HRTEM) images of (A) a straight segment of the ultrathin AuNWs of sample shown in FIG. 5 (Inset: Fourier transform pattern), and (B) a kink of the ultrathin AuNWs of sample shown in FIG. 5.

FIGS. 10(A) and (B) are high resolution TEM (HRTEM) images of (A) a straight segment of the ultrathin AuNWs of sample shown in FIG. 5 (Inset: Fourier transform pattern), and (B) a kink of the ultrathin AuNWs of sample shown in FIG. 5.

As shown in FIGS. 10(A) and (B), the ultrathin AuNWs comprised both kinks and relatively straight segments. The bent angles at the kinks appeared to be highly random. The kinks could have resulted either from the initial growth, or inelastic bending owing to sheer force during the stirring, centrifuging, pipetting, or drying processes. Close inspection of the AuNWs using high-resolution TEM (HRTEM) showed that the straight segments were single-crystalline (FIG. 10(A)), which was also supported by the Fourier transform analysis. The AuNWs grow along <311> direction; their relatively smooth side surfaces were bound with (111) facets.

On the other hand, the kink shown in FIG. 10(B) contained two straight single-crystalline segments connected via a twin boundary, in which two sets of (111) planes had a mirror-symmetry across the boundary. On the basis of the highly ordered lattice, it is postulated that this particular case was formed during the initial growth. However, given the ultrathin NWs and the high mobility of Au atoms, there is a possibility that after bending the AuNR, its lattice may have annealed either in the solution or under the electron beam.

These AuNWs with (111) side surfaces were distinctively different from AuNWs synthesized in the presence of oleylamine and CTAB, whose side surfaces were bound with (100) facets. Both oleylamine and CTAB have amino head groups and aliphatic tails; they are known to have preference for the Au (100) facets owing to the lower coordination number of the surface atoms on (100) than that on (111) facets.

In contrast, the new class of ligands is thiol-ended with aromatic tails. It is conceivable that both the strong Au—S bonds and the tight stacking among the phenyl rings may have contributed to their binding preference for Au (111) facets. In this case, this binding preference may play an important role in inducing the 1D growth of AuNWs.

Example 17: Mechanism for Nanowire Growth

There are two possible mechanisms for ligand-directed nanowire growth: (a) templating effect of cylindrical micelles formed by the amphiphilic ligands; and (b) strong ligand binding on specific facets.

Regarding (a), the ligands used presently have short hydrophobic groups making them unlikely to form stable micelles. The simultaneous formation of multiple radiating micelles on the (AuNP@silica)@seeds was even less likely. The —OH group on 4-MPN was not ionic and thus not very hydrophilic. The 11-MUA has a long hydrophobic tail but it was unable to induce AuNW growth. Furthermore, it is unlikely that both 3-MBA and 4-MBA could form similar micelles. Importantly, the presence of PVP is expected to disrupt any micelles formed by the ligands, but it did not change the structure of the resulting AuNWs. Therefore, templating effect as a major factor is ruled out.

Regarding (b), on the basis of the Au (111) side facets and the structural similarity among the applicable ligands, it is postulated that facet control by the capping ligands was a dominant factor in directing the 1D growth. The 3-MBA, with its —COOH group at the meta-position of the thiol group, was expected to have less efficient packing. As such, the ligand should promote the lateral growth of the AuNWs. Thus, the observed variable width in the resulting AuNWs is in support for the facet control.

The initiation of the AuNWs from the seeds is most intriguing. To the best of the inventors' knowledge, this is the first example where the NWs initiated from only a small section of the seed surface.

Ligand density on the seed surface is an important factor. For example, when a ligand is not used, it was found that the seeds grew uniformly on all directions. As another example, at a high ligand concentration, the seeds were unable to grow AuNWs (FIG. 8(h)). In view of the above, it is postulated that the active surface for initiating AuNW growth was probably small patches of open Au surface uncoated with ligands. Such open patches would be easily capped by ligands once Au deposition occurred there.

Furthermore, it was found that the adsorption of seeds on the silica surface was important. It follows that either the junctions between the seed NPs or the interface between silica and seed could have promoted and sustained the active surface, in view of the lack of AuNW growth on free Au seeds. For example, control experiments using aggregated 15 nm AuNPs did not give AuNWs, thus ruling out the role of seed junctions. The silica shells prepared by the Stöber method are porous. Therefore, it is expected that there is continued materials transfer at the Au-silica interface.

Example 18: Synthesis of AuNWs on Silicon/Silica Substrate

Figure 11:
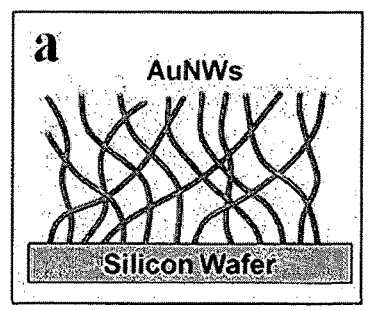
FIG. 11 is (a) a schematic illustration (side view), and (b) SEM image of ultrathin AuNWs using silicon wafer as substrate; (c) TEM image of the ultrathin AuNWs obtained from (b).
Figure 11:
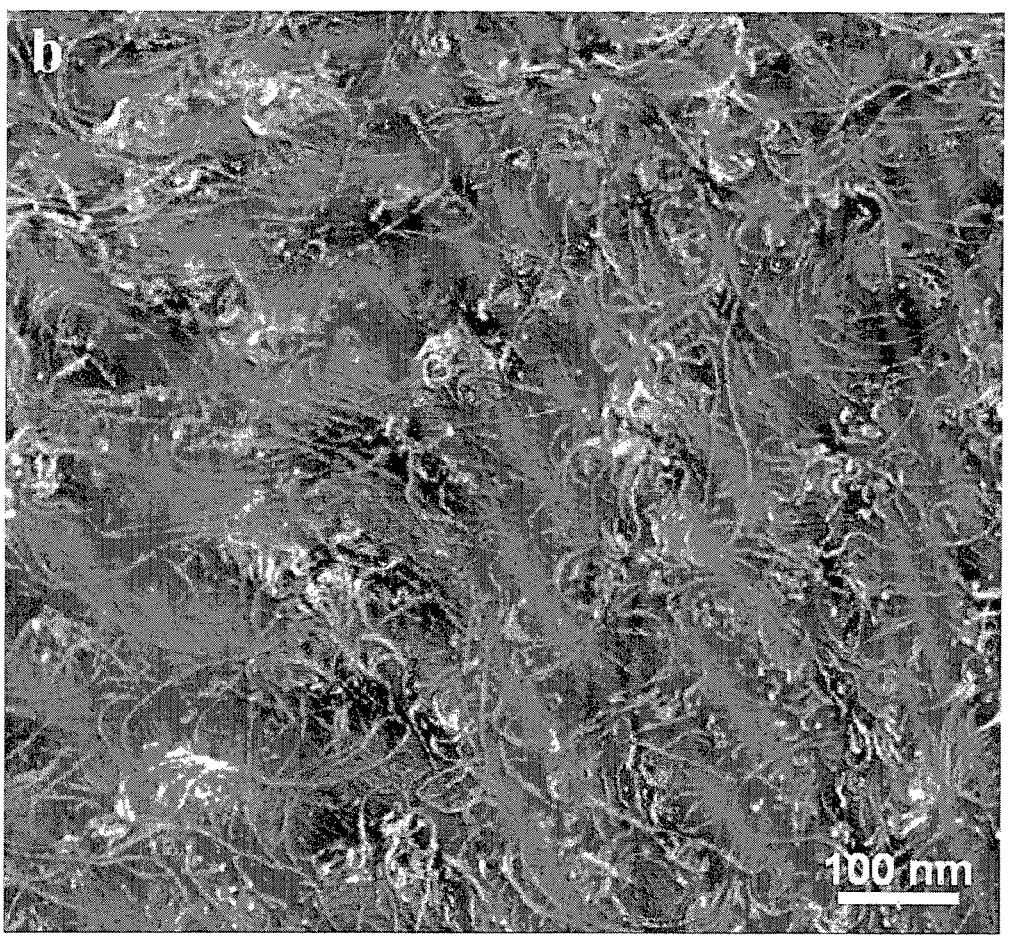
Figure 11:
Figure 12:
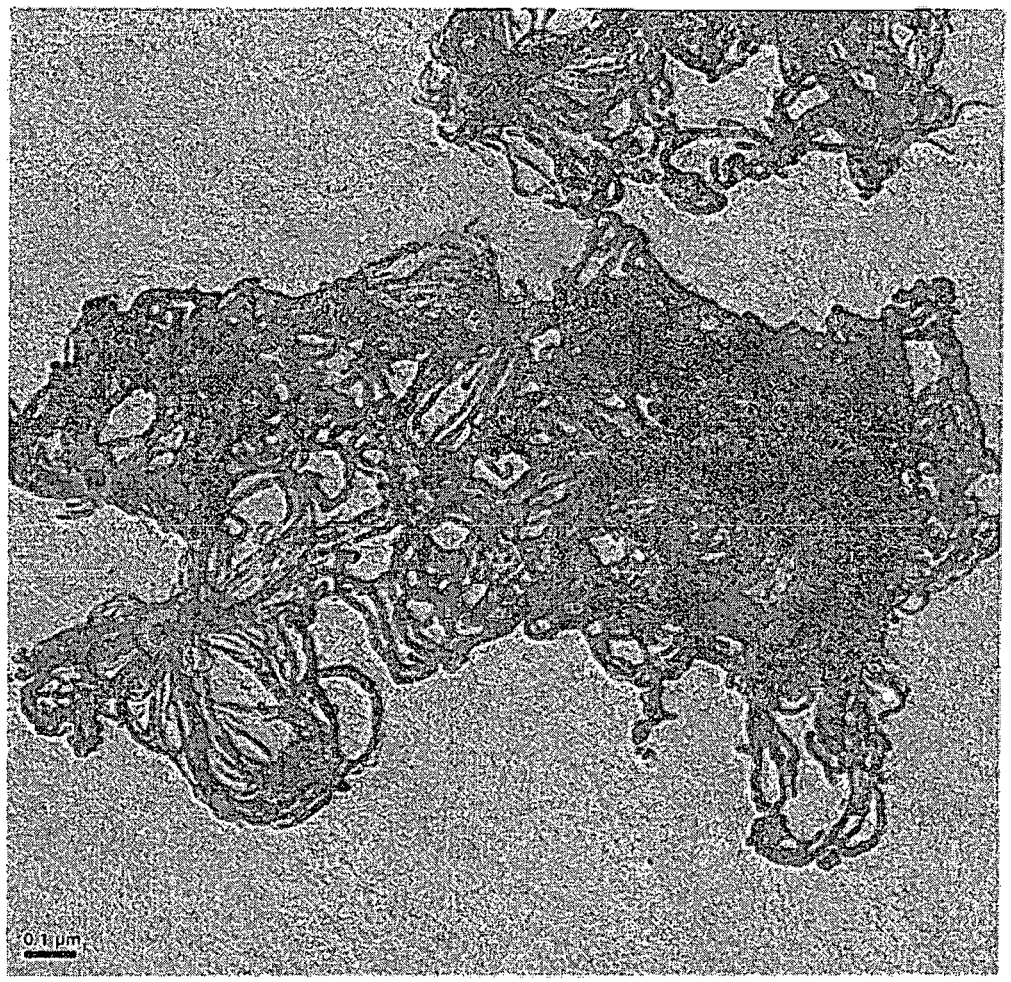
FIG. 12 is a TEM image of (AuNP@silica)@AuNWs nanocomposites using 4-MBA ligand and with a higher quantity of HAuCl$_4$.
Figure 13:
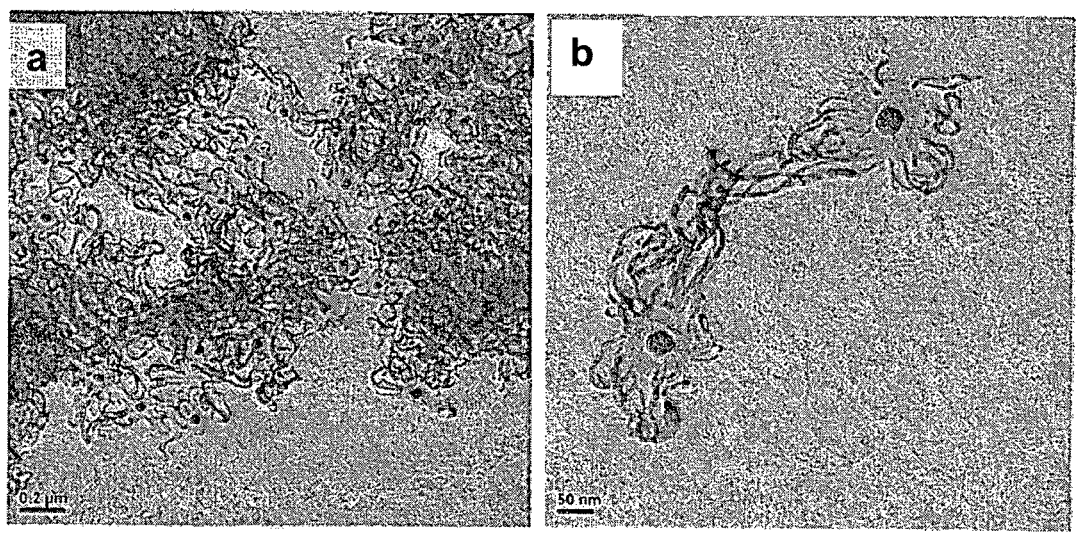
FIGS. 13(a) and (b) are TEM images of (AuNP@silica) @AuNWs nanocomposites using 4-MPAA ligand with short reaction time.
Figure 14:
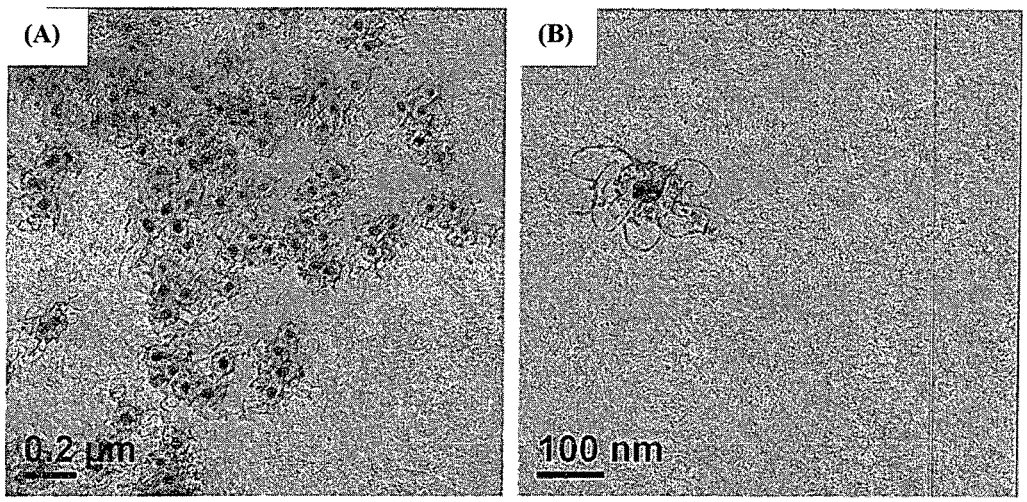
FIG. 14 are (A) low and (B) high magnification TEM images of (AuNP@silica)@AuNWs nanocomposites using 4-MPAA ligand with a lower quantity of HAuCl$_4$.
Figure 15:
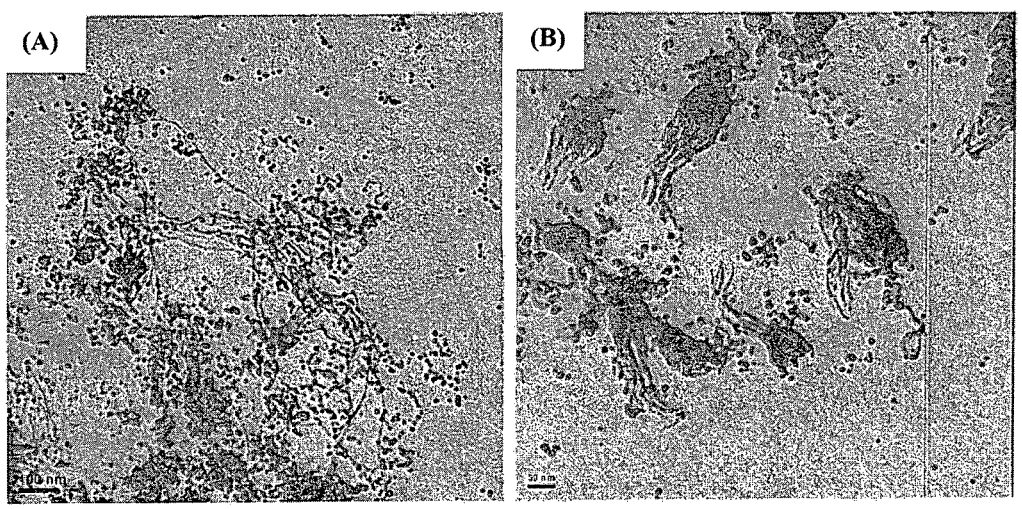
FIG. 15 are TEM images of ultrathin Au nanowires nanocomposites using 4-MBA ligand and synthesized without Au@SiO$_2$.
Figure 16:
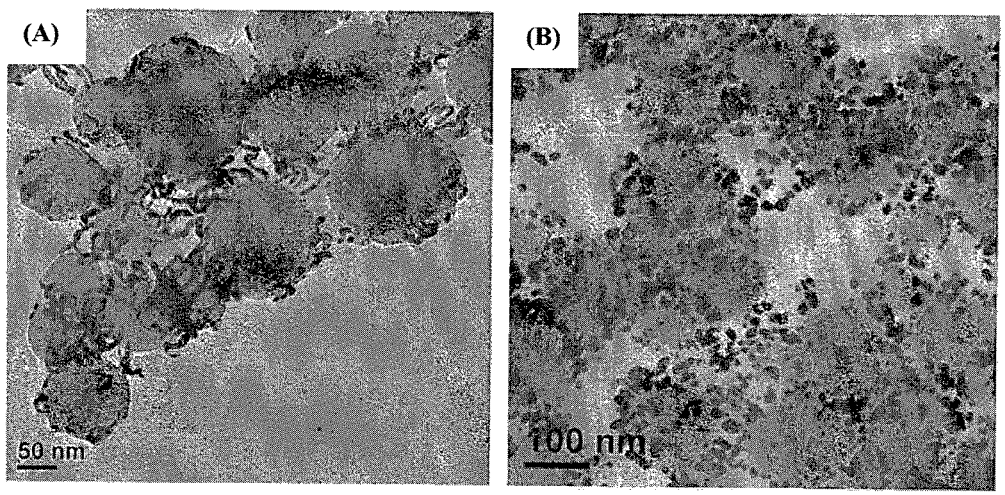
FIG. 16 are TEM images of silica@AuNWs nanocomposites using (A) 4-MPAA as ligand, and (B) 4-MBA as ligand.
Figure 17:
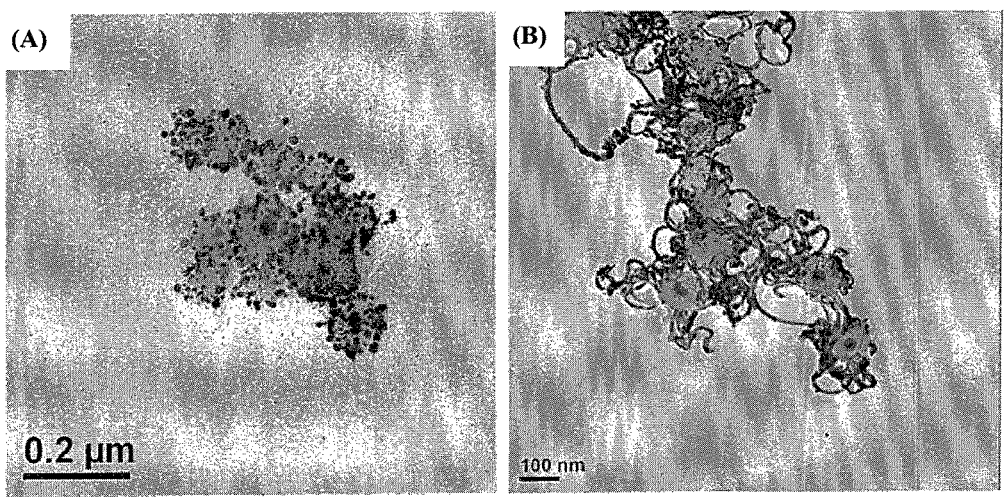
FIG. 17 are TEM images of (AuNP@silica)@TiO$_2$-ultrathin Au nanowires nanocomposites using (A) 4-MPAA as ligand, and (B) 4-MBA as ligand.
Figure 18:
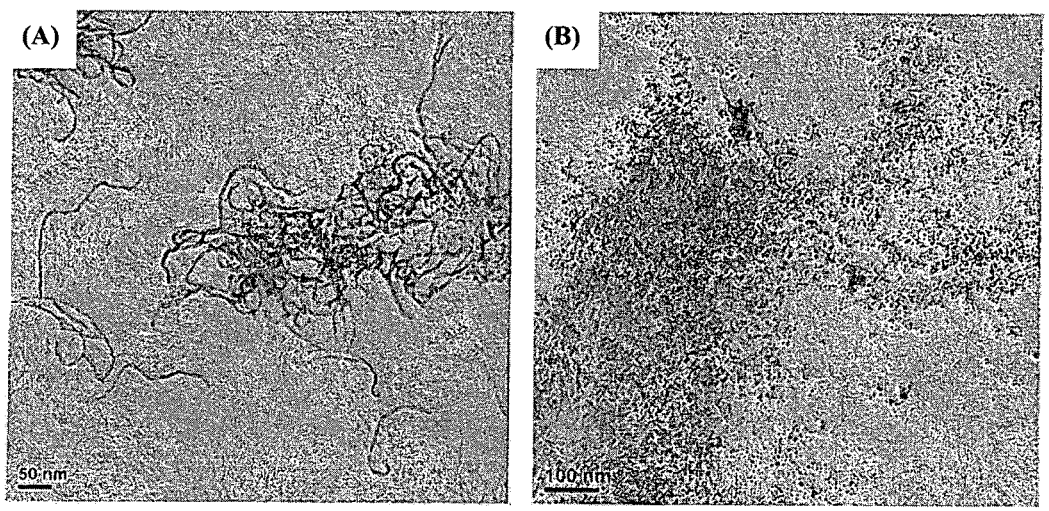
FIG. 18 are TEM images of (Fe$_x$O$_y$@silica)@AuNW nanocomposites using (A) 4-MPAA as ligand, and (B) 4-MBA as ligand.
Figure 19:
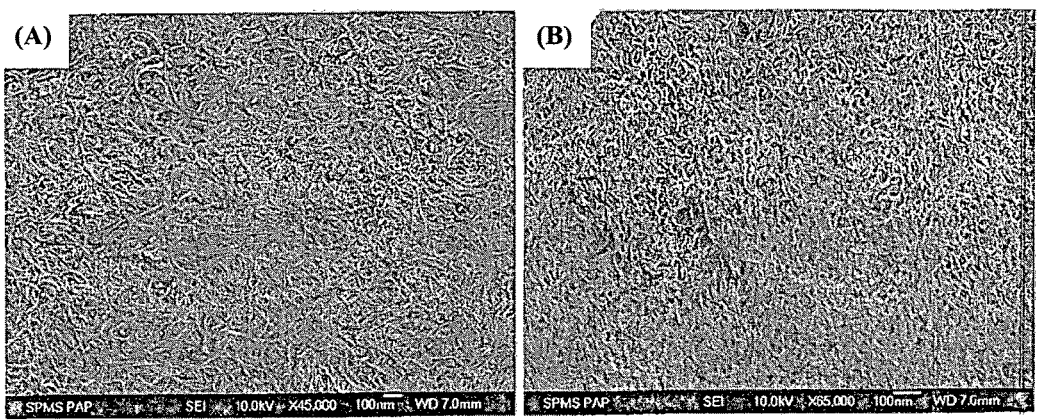
FIG. 19 are (A) low and (B) high magnification SEM images of ultrathin Au nanowires prepared using 4-MPAA as ligand on silicon wafer.
Figure 20:
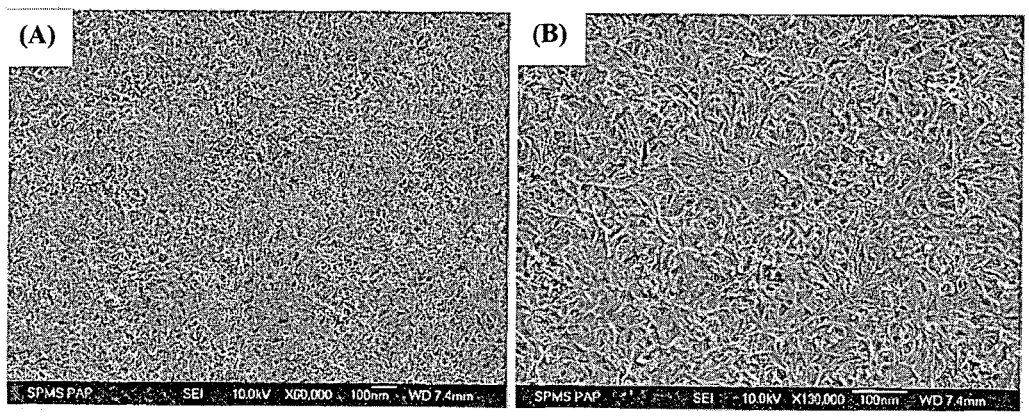
FIG. 20 are (A) low and (B) high magnification SEM images of ultrathin Au nanowires prepared using 4-MBA as ligand on silicon wafer.
Figure 21:
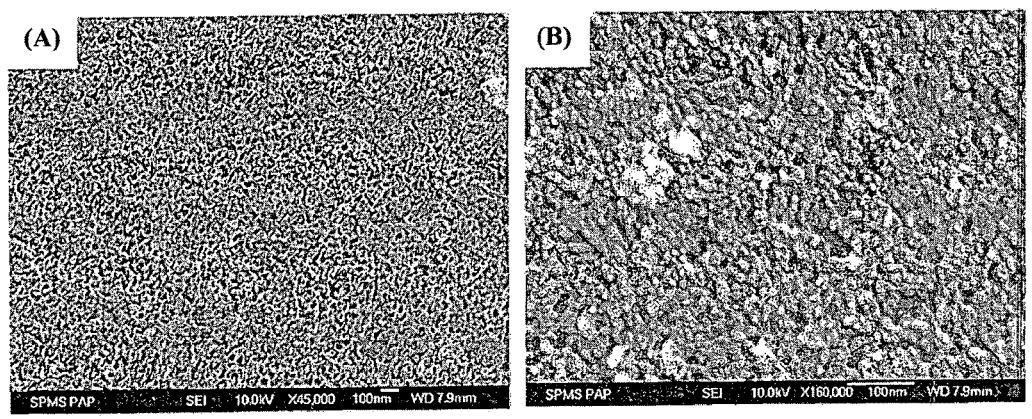
FIG. 21 are (A) low and (B) high magnification SEM images of ultrathin Au nanowires prepared using 4-MPAA as ligand on silicon wafer after heating at 200° C. for 1 hour.
Figure 22:
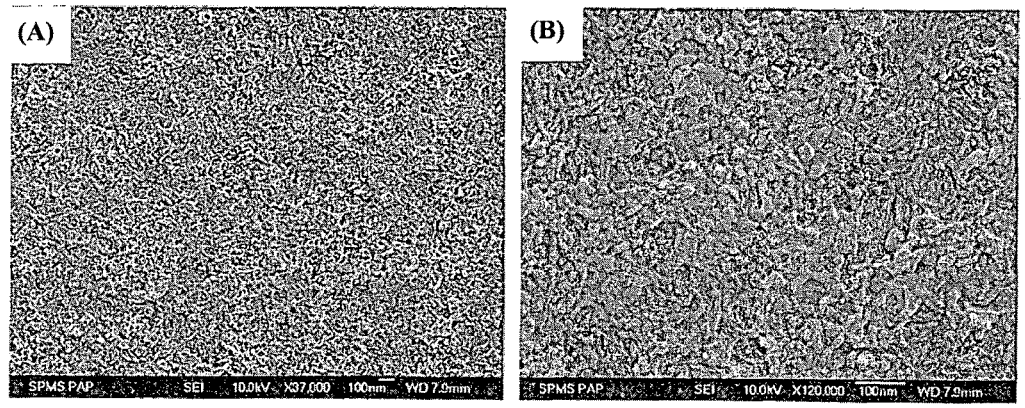
FIG. 22 are (A) low and (B) high magnification SEM images of ultrathin Au nanowires prepared using 4-MBA as ligand on silicon wafer after heating at 200° C. for 1 hour.
Figure 23:
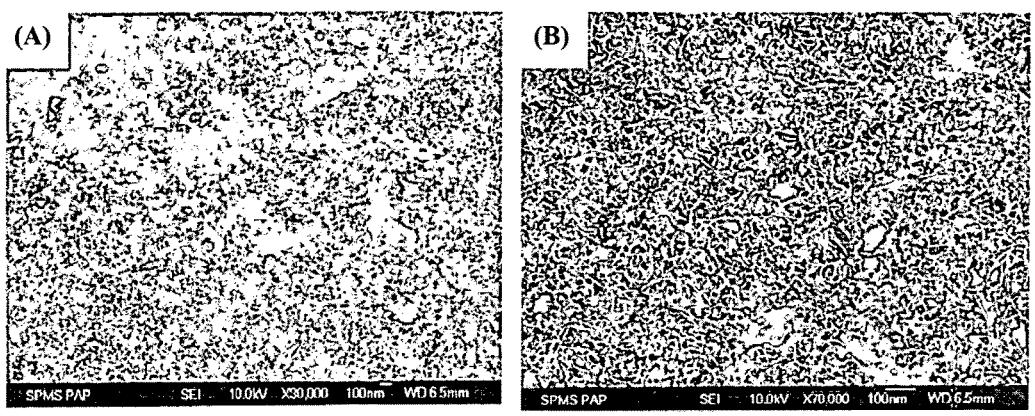
FIG. 23 are (A) low and (B) high magnification SEM images of ultrathin Au nanowires prepared using 4-MPAA as ligand on glass slide.
Figure 24:
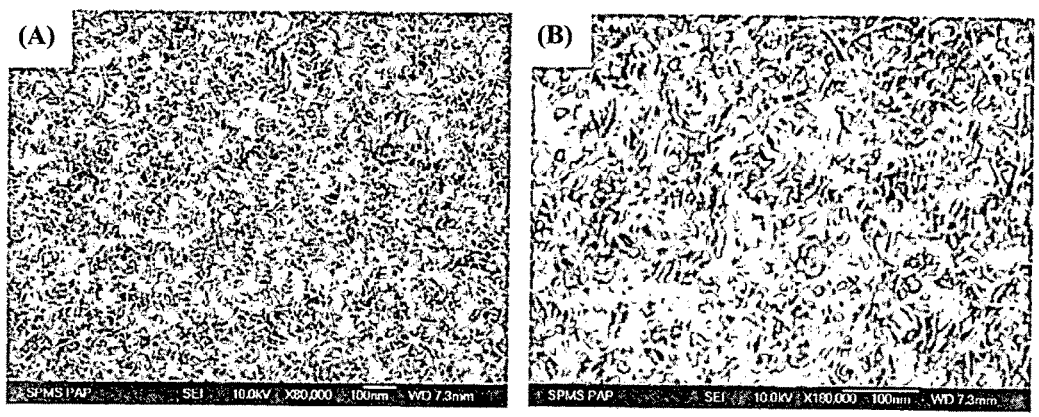
FIG. 24 are (A) low and (B) high magnification SEM images of ultrathin Au nanowires prepared using 4-MBA as ligand on glass slide.
Figure 25:
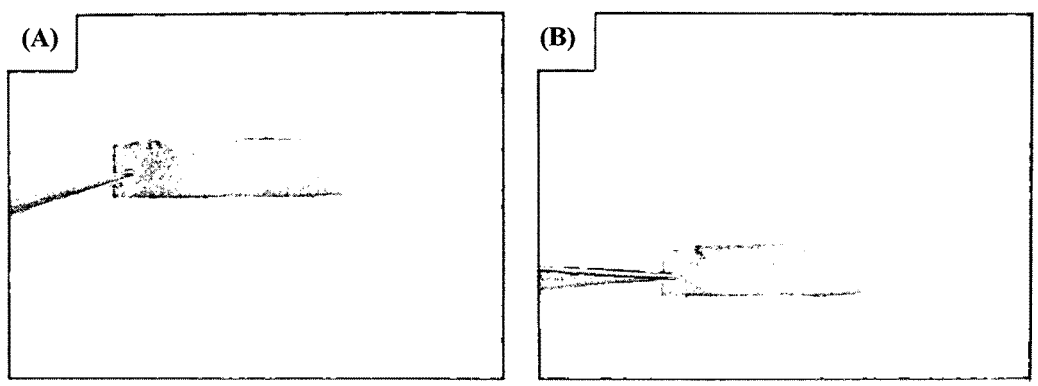
FIGS. 25 (A) and (B) are photos of Au nanowires on the glass slide (4-MPAA ligand) and the transparency of this slide is about 50%.
Figure 26:
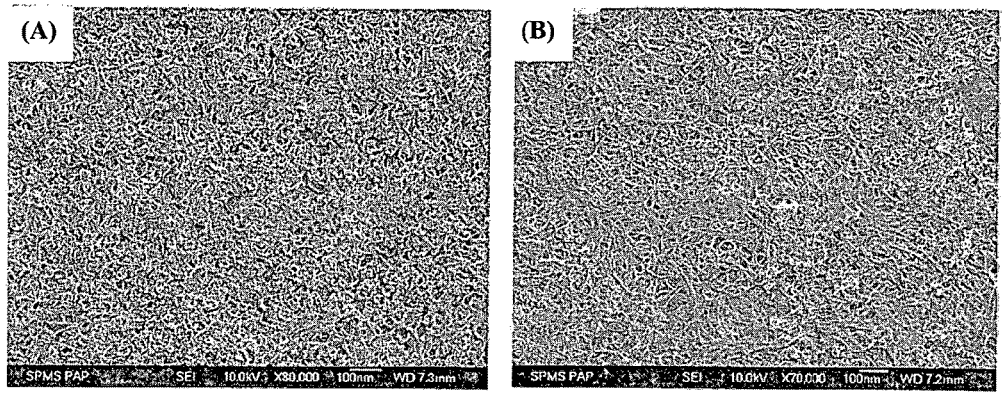
FIGS. 26 (A) and (B) are SEM images of ultrathin Au nanowires (4-MBA ligand) on glass slide, where (A) nanowires are grown once; and (B) nanowires are grown twice, and the nanowires grow longer.
Figure 27:
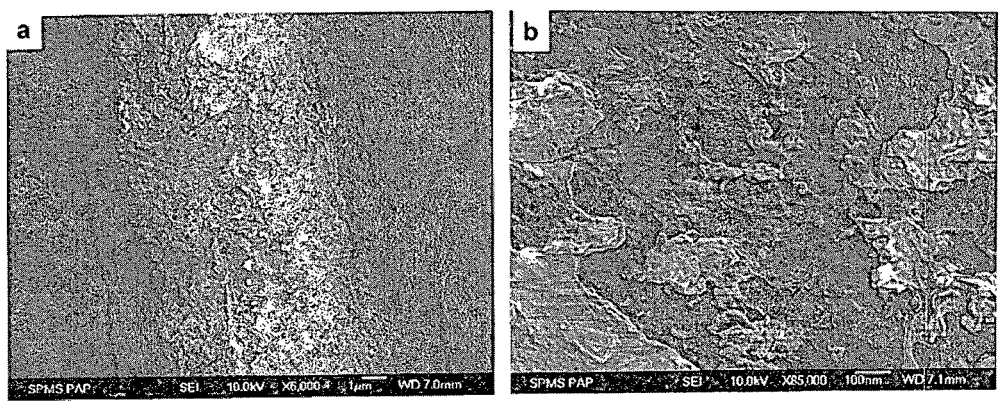
FIG. 27 are (A) low and (B) high magnification SEM images of ultrathin Au nanowires prepared using 4-MPAA as ligand on glass fiber.
Figure 28:
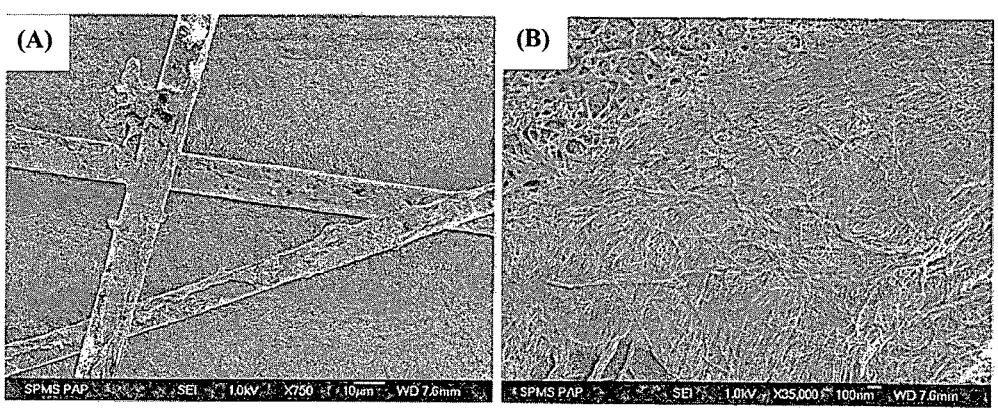
FIG. 28 are (A) low and (B) high magnification SEM images of ultrathin Au nanowires prepared using 4-MBA as ligand on glass fiber.
Figure 29:
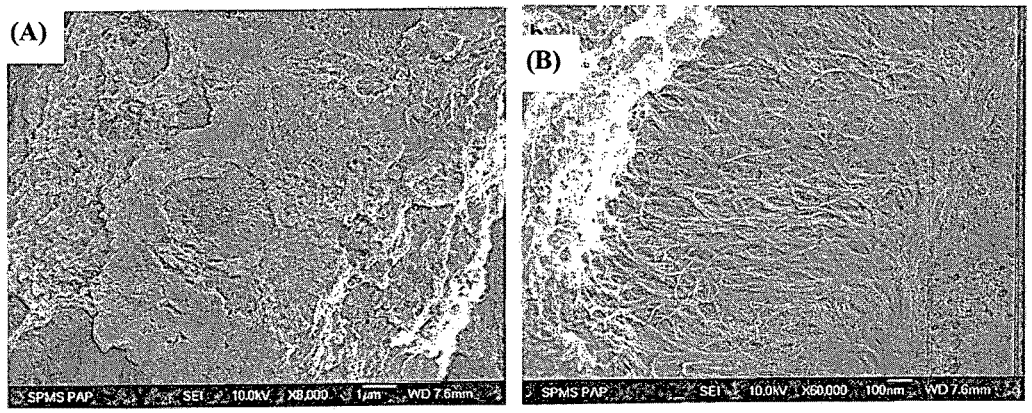
FIG. 29 are (A) low and (B) high magnification SEM images of ultrathin Au nanowires prepared using 4-MBA as ligand on glass fiber using a higher quantity of HAuCl$_4$.
Figure 30:
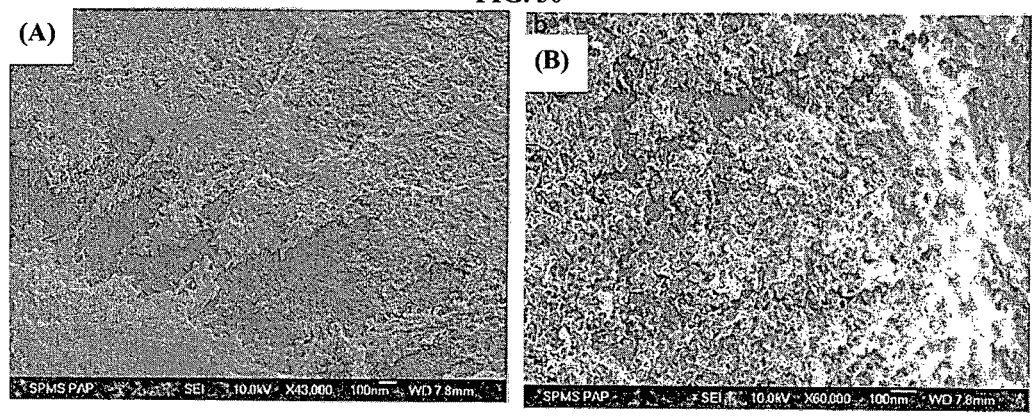
FIG. 30 are (A) low and (B) high magnification SEM images of ultrathin Au nanowires prepared using 4-MBA as ligand on filter paper.
Figure 31:
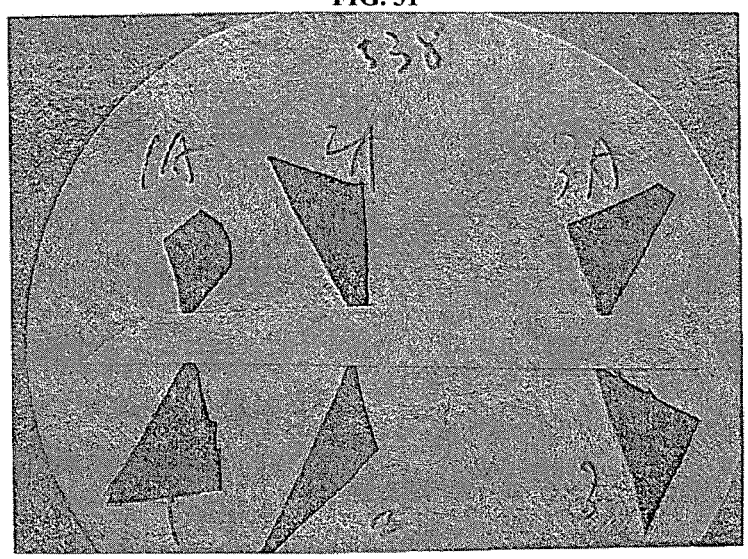
FIG. 31 is a photograph of Au nanowires on the filter paper prepared using 4-MBA as ligand.
Figure 32:
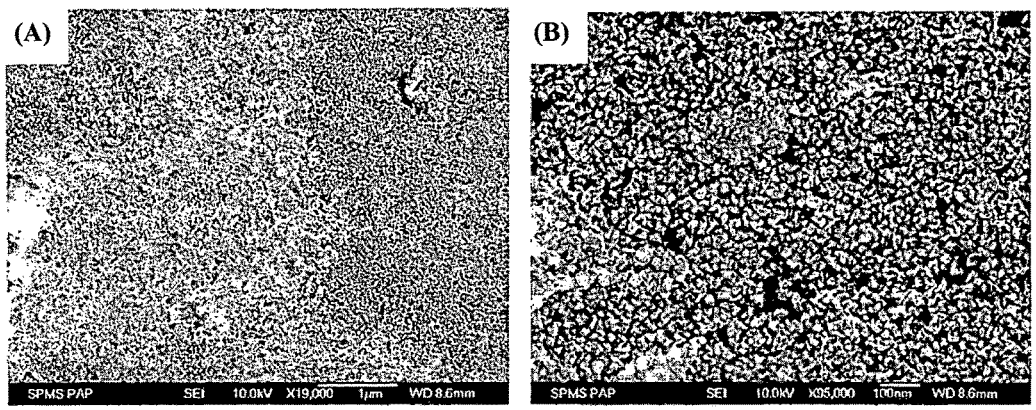
FIG. 32 are (A) low and (B) high magnification SEM images of Au nanoparticles prepared using 4-MBA as ligand on polyethylene terephthalate slide.
Figure 33:
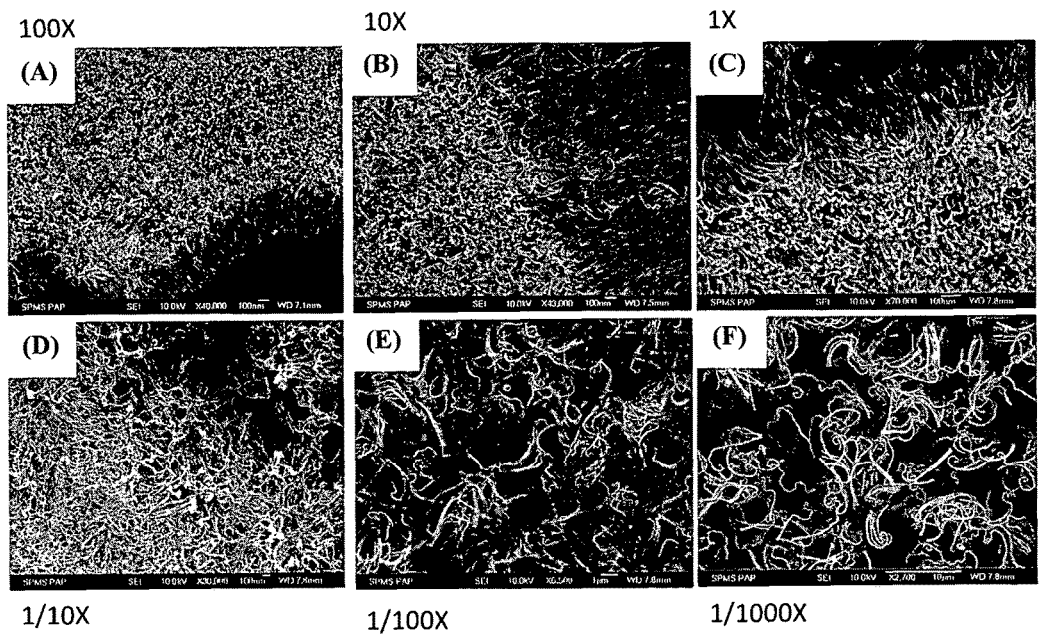
FIG. 33 are SEM images of Au nanowires for different density of seeds on the silicon wafer substrate: (A) 100×; (B) 10×; (C) 1×; (D) 1/10×; (E) 1/100×; and (F) 1/1000×. AuNW length increase stops due to appearance of bundle.
Figure 34:
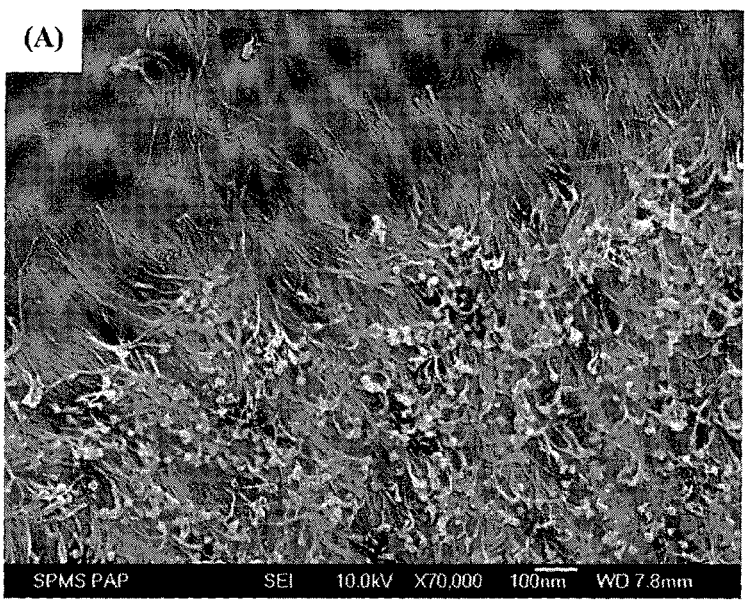
FIG. 34 are SEM images of Au nanowires for the morphology comparison: (A) normal seed density; (B) 1/10 of the seed density in A; (C) vertical Au array obtained by high seed density (100×, low magnification); and (D) Au nanorods as seeds. Densely absorbed seeds lead to vertical growth, due to repulsion between each growth site.
Figure 34:
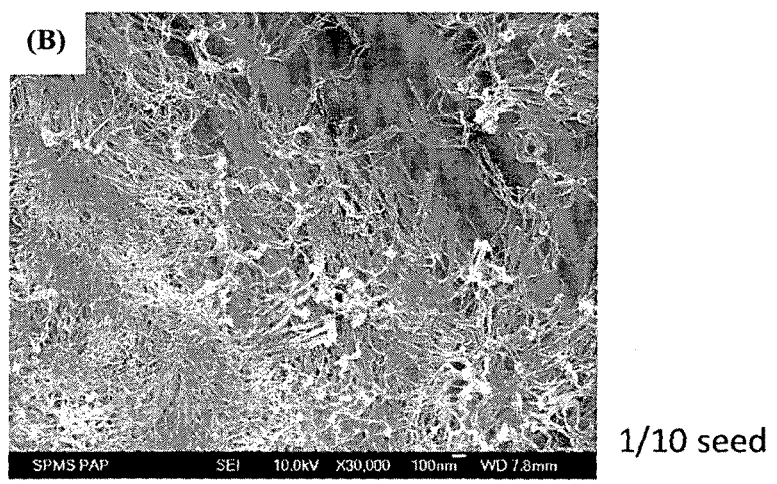
Figure 34:
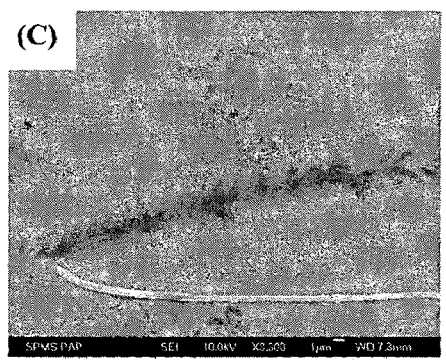
Figure 34:
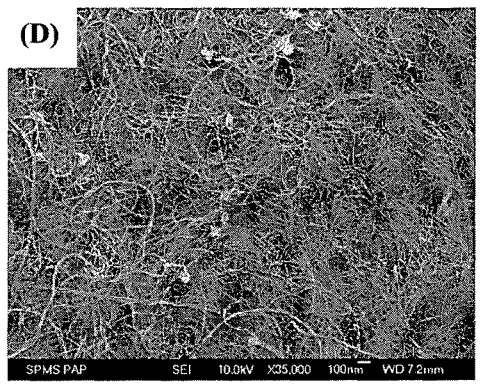
Figure 35:
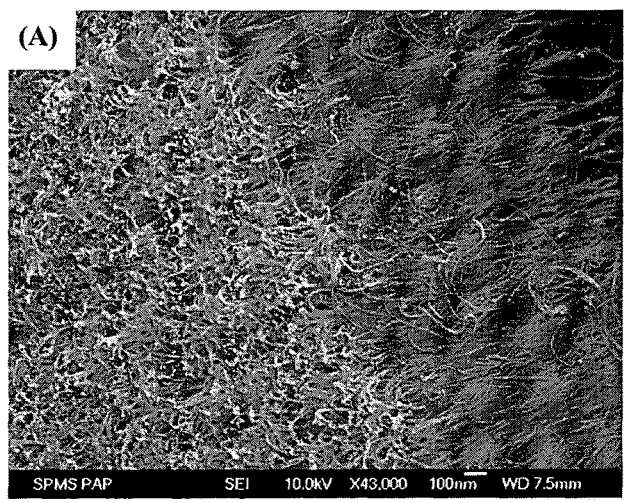
FIG. 35 are SEM images of Au nanowires grown on (A) 15 nm AuNP; (B) 40 nm AuNP; and (C) 55 nm Au octahedral. As can be seen from the figure, the wire diameter is not affected by the seed size, and the thickness is independent of the gold nanoparticle morphology. Generally, the diameter is about 5 nm to 7 nm.
Figure 35:
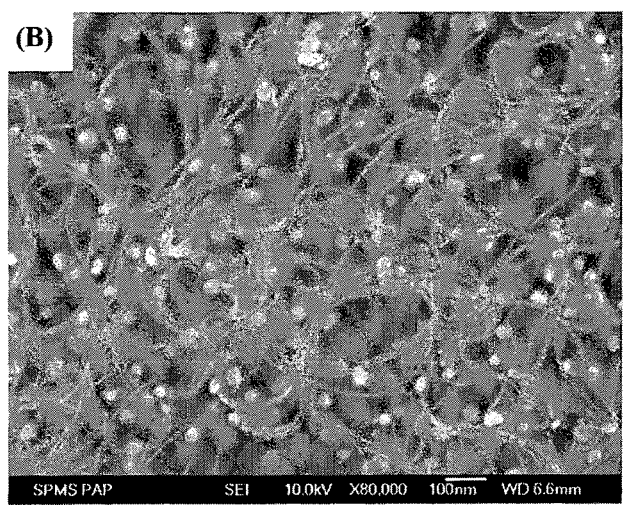
Figure 35:
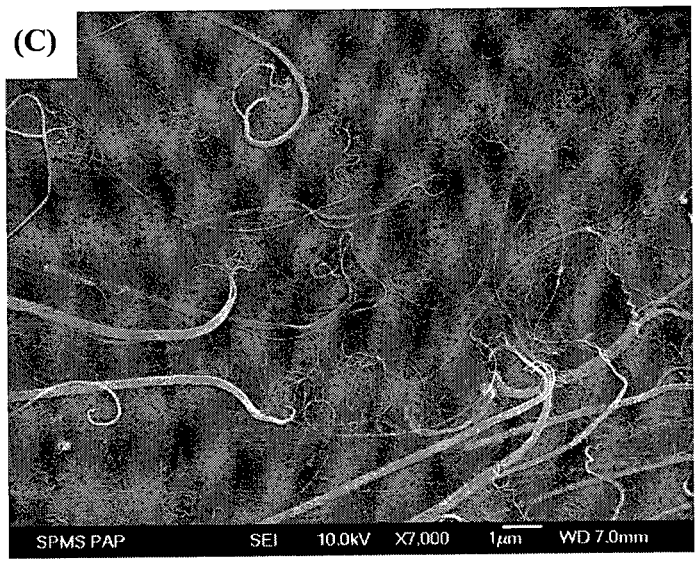
Figure 36:
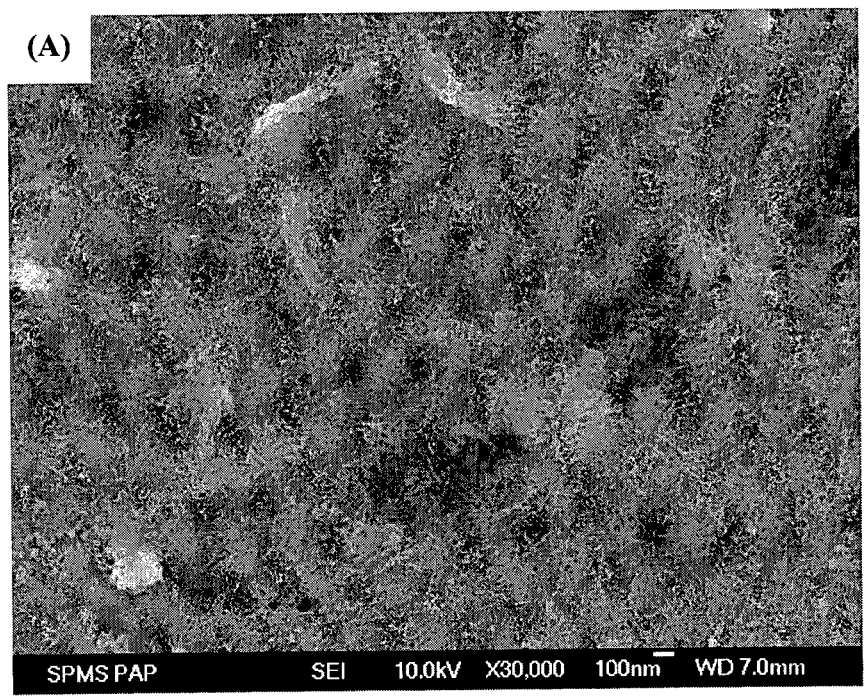
FIG. 36 are SEM images of Au nanowires grown on (A) platinum nanoparticle (PtNP); and (B) silver (Ag) nanotube. As can be seen from the figure, galvanic replacement takes place. However, wires are still formed.
Figure 36:
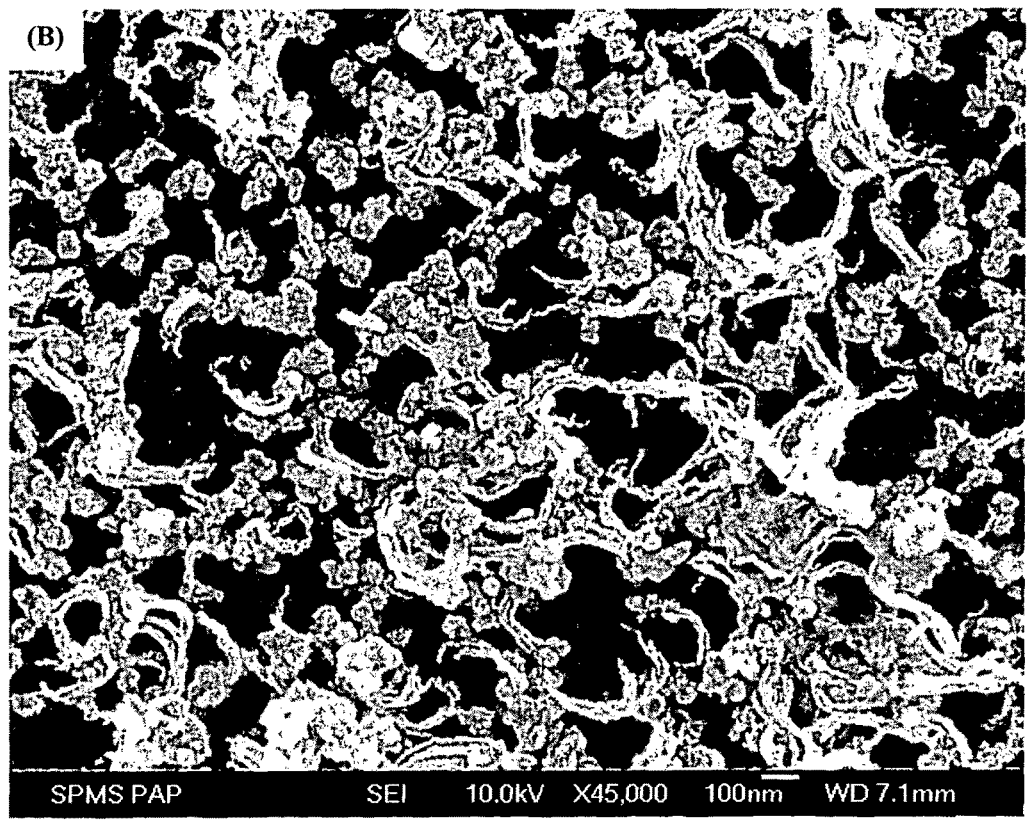
Figure 37:
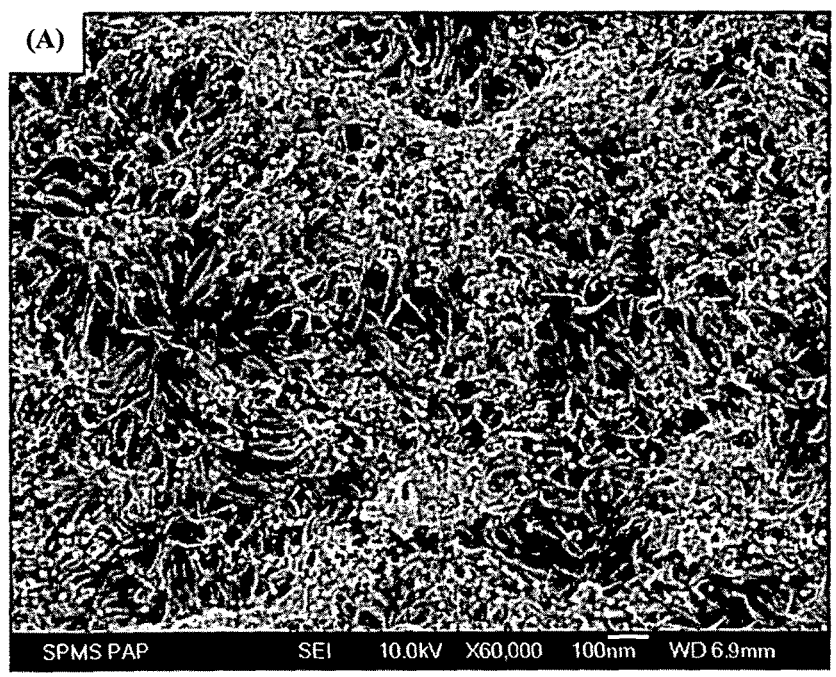
FIG. 37 are SEM images of Au nanowires grown on (A) 15 nm AuNP; and (B) aggregated AuNP as seed.
Figure 37:
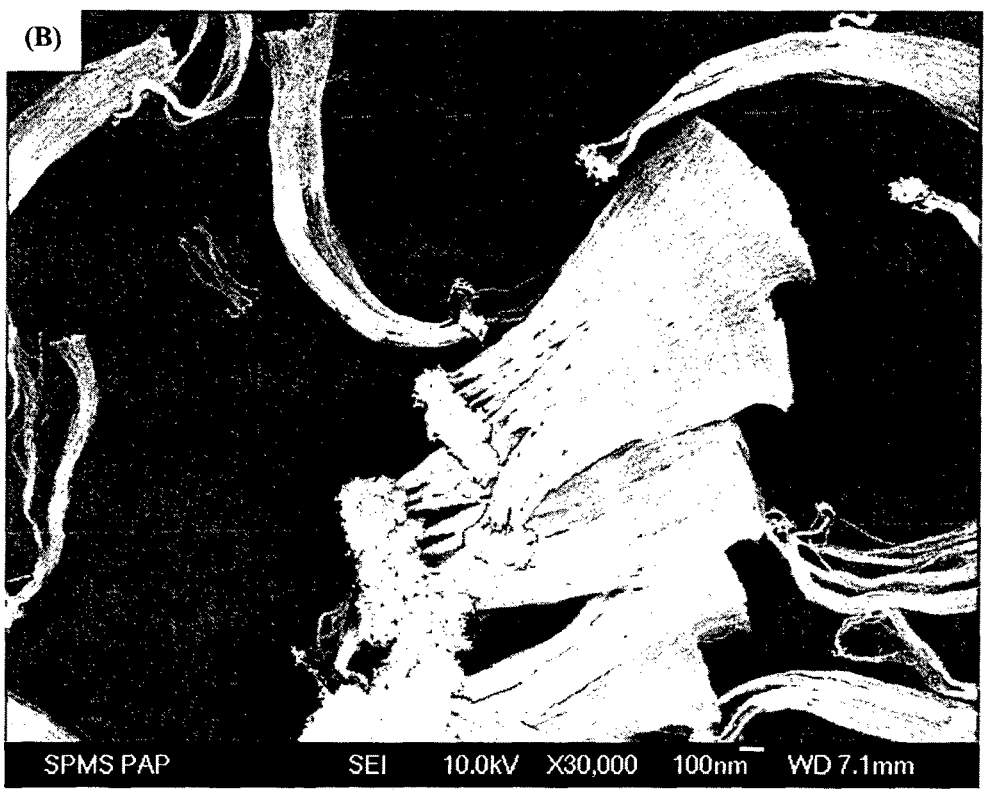
Figure 38:
FIG. 38 are (A) low and (B) high magnification SEM images of Au nanowires grown without seeds. (C) is a graph depicting the distribution of the width of Au nanowire bundles.
Figure 38:
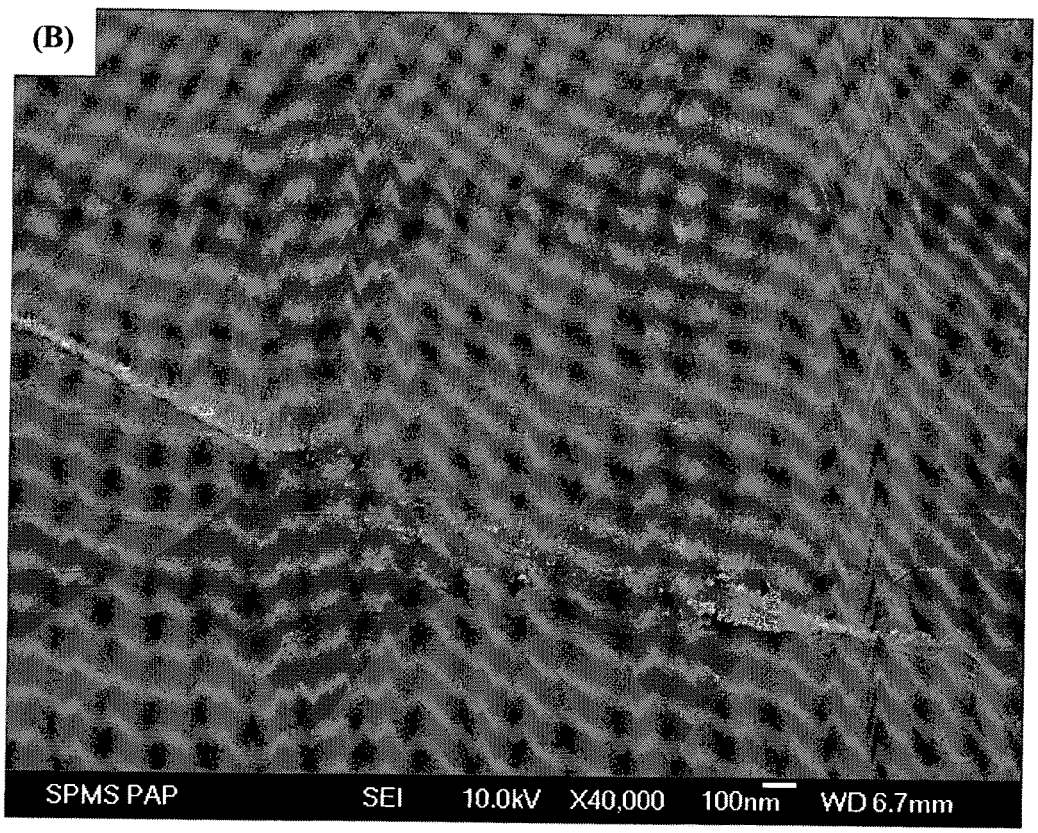
Figure 38:
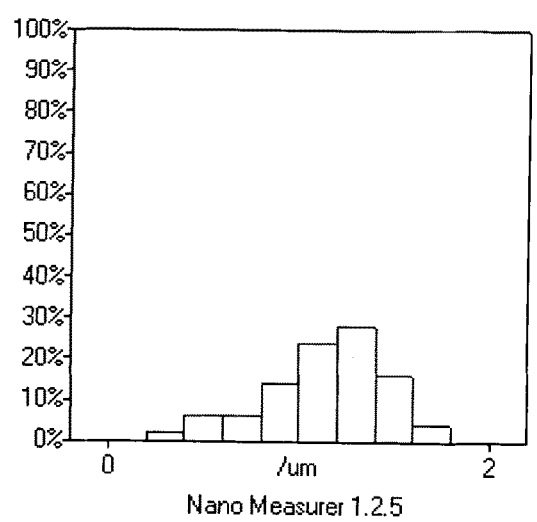
Figure 39:
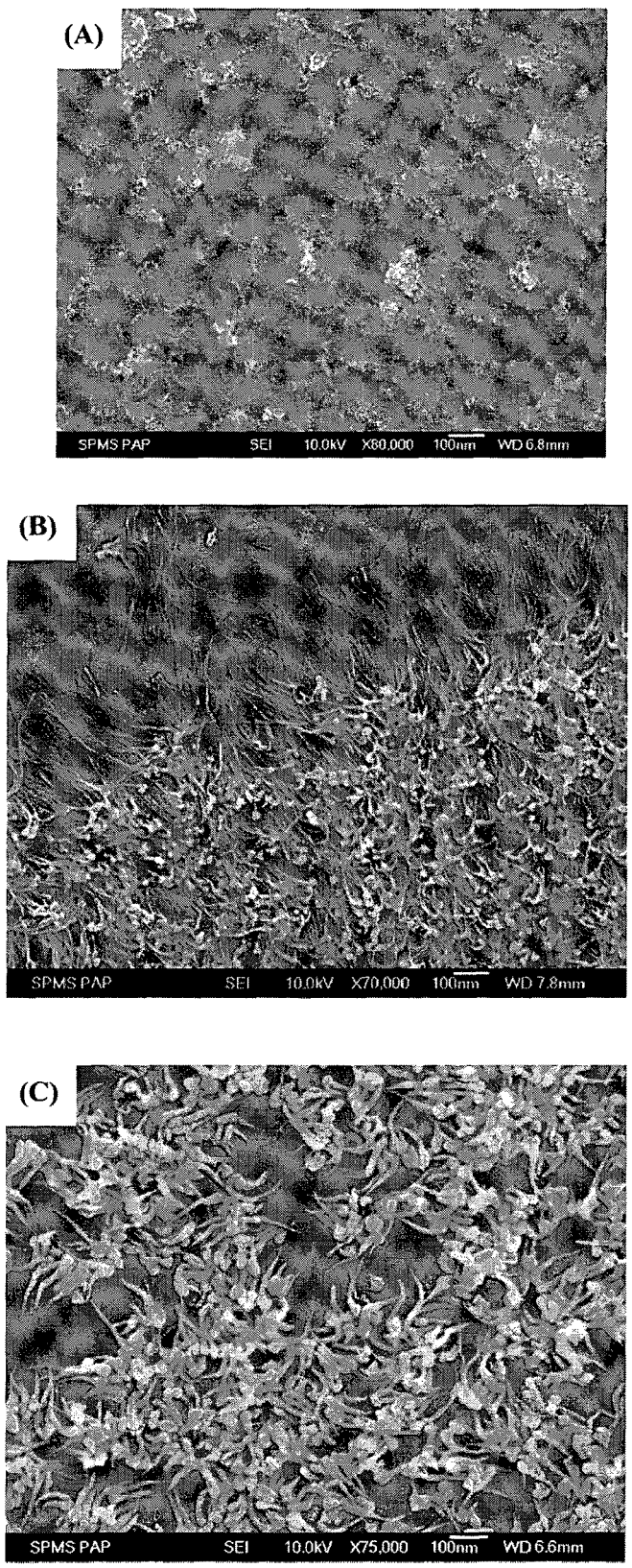
FIG. 39 (A) to (E) are SEM images of Au nanowires grown with 4 MBA as ligand having concentrations of (A) 5 mM; (B) 1 mM; (C) 0.1 mM; (D) 0.05 mM; and (E) 0.01 mM.
Figure 39:
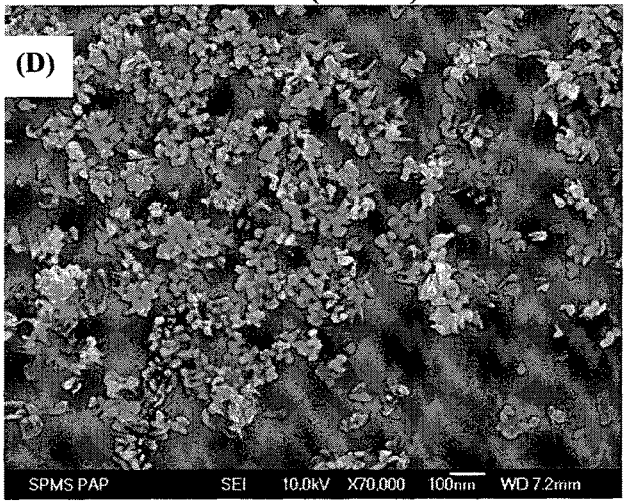
Figure 39:
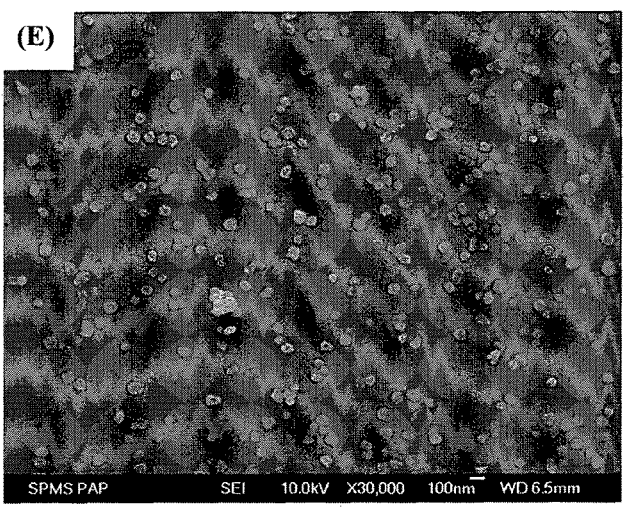
Figure 40:
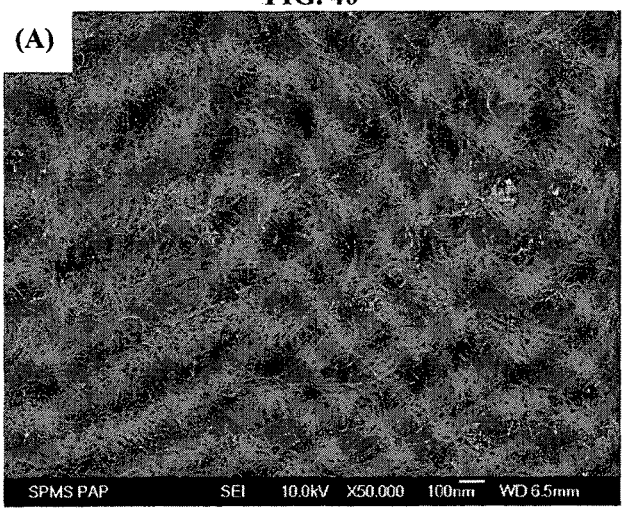
FIG. 40 (A) to (K) are SEM images of Au nanowires grown with different ligands.
Figure 40:
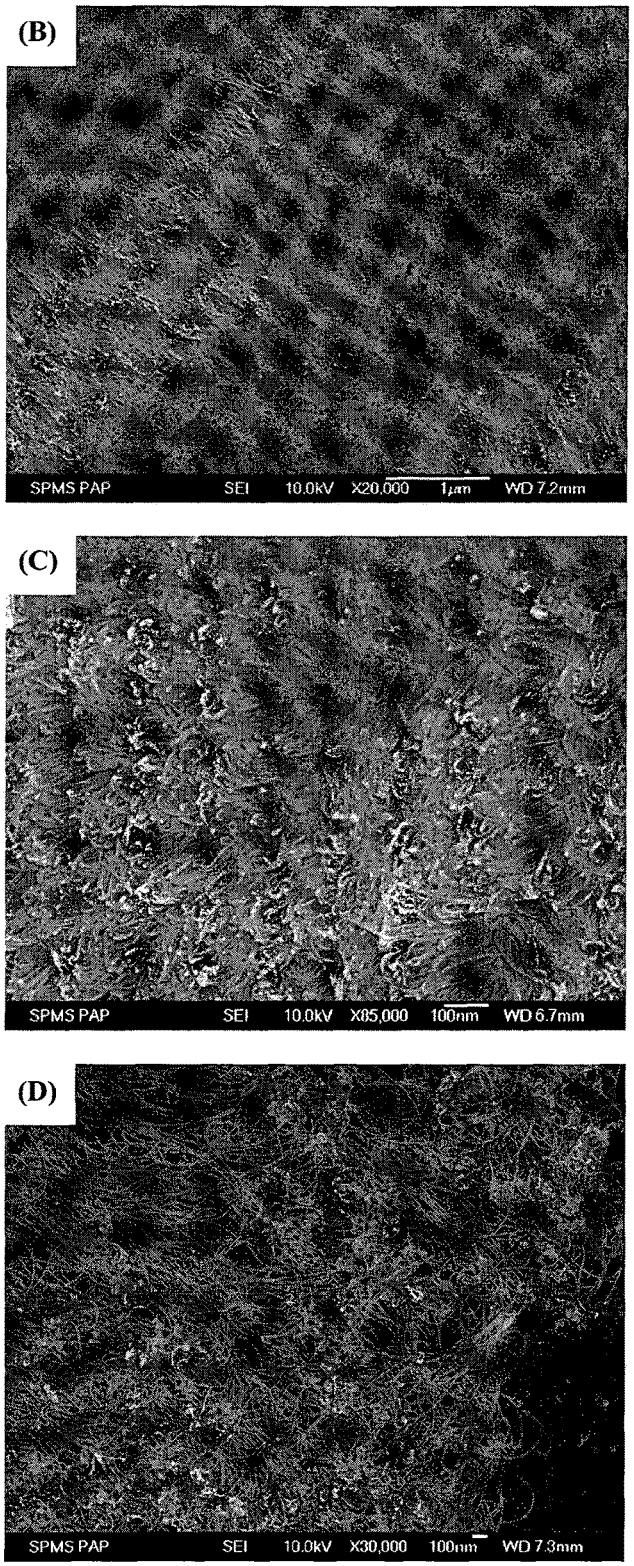
Figure 40:
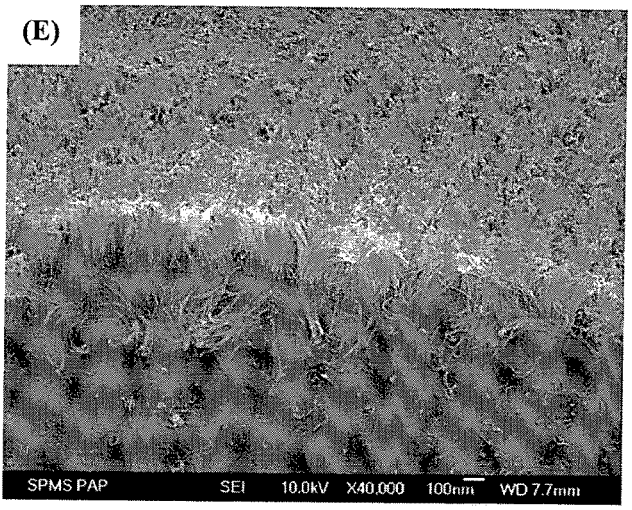
Figure 40:
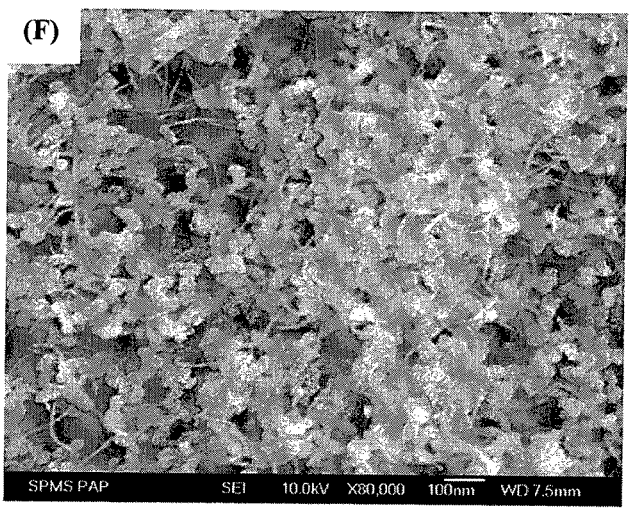
Figure 40:
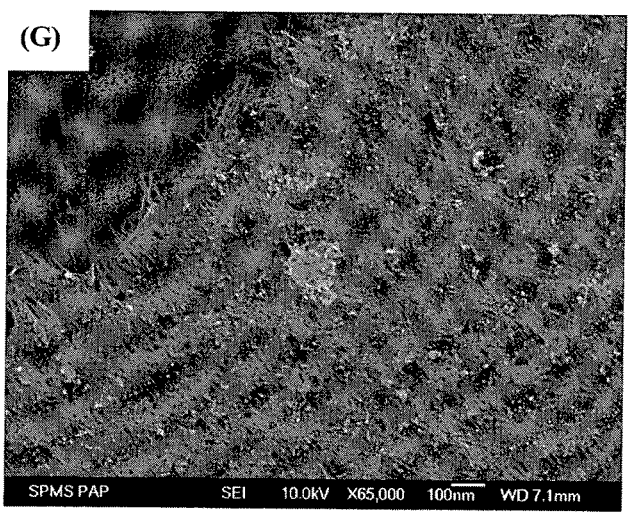
Figure 40:
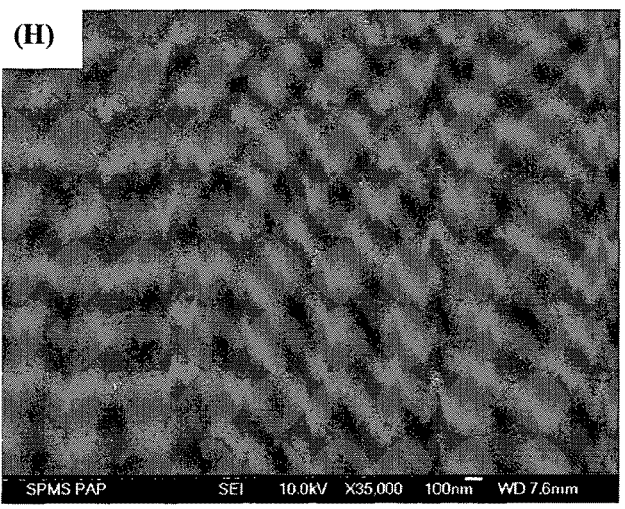
Figure 40:
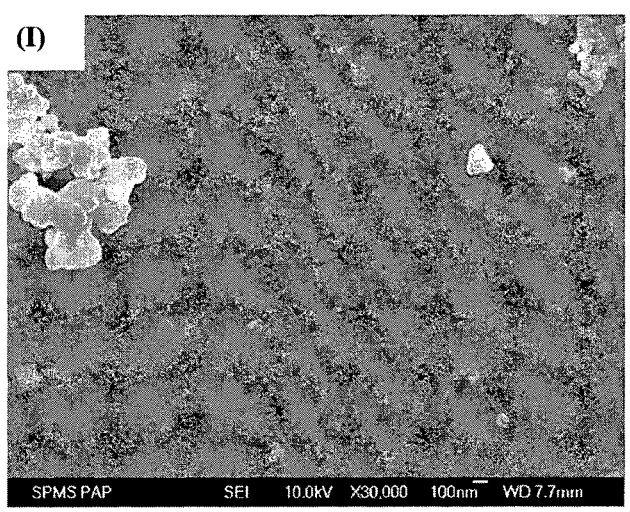
Figure 40:
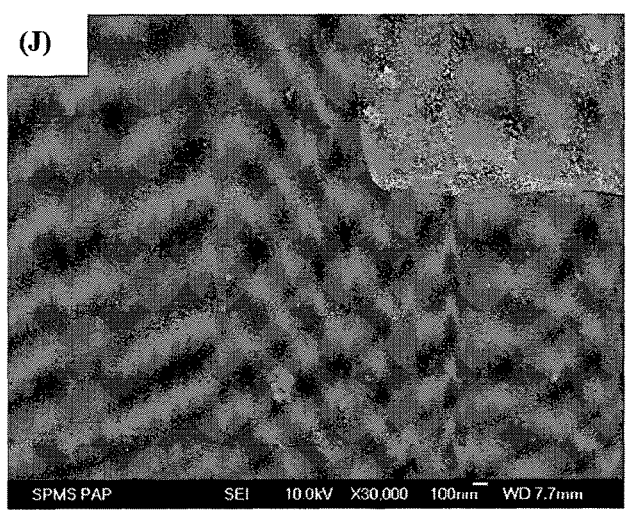
Figure 40:
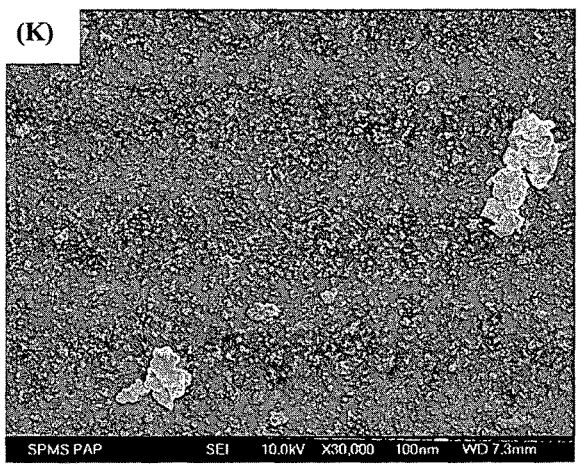

AuNWs on bulk silicon/silica substrates have also been demonstrated. FIG. 11 is (a) a schematic illustration (side view), and (b) SEM image of ultrathin AuNWs using silicon wafer as substrate; (c) TEM image of the ultrathin AuNWs obtained from (b).

Briefly, a silicon wafer with a thermal oxide layer was functionalized with 3-5 nm Au seeds, and immersed into a similar reaction mixture using 4-MPAA as the ligand.

From the scanning electron microscopy (SEM) image in FIG. 11(b), the wafer surface was covered with a dense layer of entangled AuNWs. TEM image of scratched powder (FIG. 11(c)) showed that the diameters of the AuNWs were roughly 6 nm.

Example 19: Synthesis of AuNWs on Glass Substrate

Glass substrates used were commercially available glass slides, which require no special pretreatment. Nevertheless, functionalization of the glass surface with amino group was carried out in order to attach Au nanoparticles (NPs) afterwards.

Glass slides were cut into smaller pieces with dimensions of 1.1 cm×0.7 cm. They were washed with ethanol and deionized water by ultrasonication for 10 min each before use. The glass was pre-treated with APTMS in water/ethanol (3:1) solution (5.5 mM) for 20 mM. 3-Aminopropyltrimethoxysilane (APTMS) was hydrolyzed and condensed before it was capable of coupling with the free hydroxyl groups on the glass substrate. Excess 3-aminopropyltrimethoxysilane (APTMS) was washed off with ethanol.

The silanized glass was then incubated in the 3-5 nm citrate stabilized AuNPs aqueous solution for 30 mM, followed by wash with DI water. The amino groups are adhesive to AuNPs suspended in the solution through Coulomb interactions, and thus anchor them on the glass substrate Hydrogen tetrachloroaurate was used as the source of gold atoms for the growth of nanowires. The glass substrate was soaked in a solution of 4-MBA (10 mM) and $HAuCl_4$ (50 mM) in ethanol, after which L-ascorbic acid was added. The process was carried out under ambient conditions. As the Au(III) ions were reduced by L-ascorbic acid, the solution turned from yellow to colorless. Finally, the glass was rinsed with water/ethanol (1:1) and dried in air. This method is applicable to various transparent oxide surfaces.

Example 20: Nanowires Growth in Solution

During the process of nanowires growth in solution, the control of surface ligand binding is one of the most significant factors that determine the structures in freshly grown region. Some ligands bind strongly to certain surfaces, reduce greatly their surface energy, and thus slow down the growth rate. Meanwhile, other ligands bind loosely or unattached to the surfaces, creating an active site for the growth of nanowires. The ligand system used is 4-mercaptobenzoic acid (4-MBA). Similar thiol-containing ligand such as 4-mercaptophenylacetic acid (4-MPAA) was also used, but may give rise to inhomogeneous film (FIG. 47(C)) and shows poor reproducibility. It may be ascribed to the additional secondary carbon and consequently inefficient packing of ligands.

Continuous binding of ligands around the freshly formed AuNW and the following deposition on their tips, where ligands are packed loosely due to the vicinity of Au seed and glass substrate. It eventually leads to the formation of unidirectional Au nanostructures. They have almost uniform diameters of 6 nm and lengths of over 1 μL as observed by scanning electron microscopy (SEM) (FIG. 47(A)).

The strong covalent bonding between the thiol group and gold, together with the dense packing of ligands on Au seed surface provides a steady force for inhibition of gold deposition on surfaces other than the contact points between the AuNPs and the glass substrate. Ligand type and concentration control the growth process, and therefore, determine the final structures of nanowires. The diameter and length of AuNWs was found tunable by varying the ligand concentration. As the amount of 4-MBA in the solution decreases, the resulting AuNWs become shorter and bulkier and ultimately approaching larger granule structures. In order to obtain the wire structures as desired final products, at least 1 mmol of 4-MBA ligands were required for a 1.1 cm×0.7 cm glass slide.

Example 21: Optimization of Growing Conditions

Facilitated with this AuNWs growing method, the control of each step in the procedure, and its influence on the electrical conductivity and optical transparency of obtained networks of AuNWs on glass substrates was studied. These two properties of materials used for transparent thin films typically have inverse relationship.

As can be seen from the SEM image (FIG. 47(A)), AuNWs produced were short and dense. They were in close contact with neighboring strains, giving excellent conductivity at around 100Ω. Conversely, for the same reason, hardly any space was left for the light to pass through, giving rather poor transparency at around 30%.

In order to boost its competitiveness as a potential substitute for ITO, improvement in its transparency without significant loss in conductivity is necessary. Therefore, a balance point was found between the two extremes by optimizing the growth conditions of AuNWs.

Example 21.1: Optimization of Growing Conditions (APTMS Concentration)

The first step is to functionalize the glass surface with APTMS (0.1%). When the concentration of APTMS exceeded 22 mM, there was no significant improvement in conductivity of the film. However, when APTMS was reduced further below 3 µL, uneven distribution of AuNWs on glass and poor reproducibility under same conditions were observed (FIG. 48(b) to (e)). Though some regions with moderate transparency appeared, there was a drastic rise in electric resistance accompanied with the occurrence of inhomogeneous films (Table 1).

TABLE 1

The transparency and conductivity of samples in FIG. 48

| Sample No. | APTMS (1 µL/mL) | Transparency (% T) | Conductivity (Ω) |
|---|---|---|---|
| a) | 4.0 µL | 32% | 260 |
| b) | 3.0 µL | 35% | 220 |
| c) | 2.8 µL | Uneven | 1,800 |
| d) | 2.5 µL | Uneven | 4,500 |
| e) | 2.0 µL | Uneven | 17,000 |

In the attempt to solve the problems, ultrasonication was used to improve dispersion of the APTMS molecules in solution as they couples to the substrate. Moreover, the volume of reaction solution was increased to ameliorate the effect of concentration slope in the reaction vial. Disappointingly, discontinued film was still obtained with no enhancement as expected (FIG. 48f). In conclusion, taken into consideration the loss on the glass surface of reaction vial, the concentration threshold may be the minimum amount of APTMS required to completely cover the glass surface and subsequently anchor the Au seeds.

Example 21.2: Optimization of Growing Conditions (Size of Gold Nanoparticles)

Besides reduction of the concentration of APTMS, in order to enhance the transparency of the network, an alternative path to lower the density of AuNWs on glass substrate is to control the attachment of the gold seeds.

One possible solution is to increase the size of gold seeds used. When the spherical AuNPs increase in diameter, they are expected to be further apart by repulsion from one another, which gives rise to more space in between. Meanwhile, a drop in conductivity is expected as a result of further distance and fewer contact points between AuNWs. Experimental results of stepwise increase in AuNPs diameters were consistent with the theoretical prediction. By using larger AuNPs as seeds, the AuNWs films become more transparent but less conductive (Table 2). As we can see from the results, the 15 nm Au seed is the optimal choice for improvement of transparency with acceptable loss in conductivity.

TABLE 2

The transparency and conductivity of samples in FIG. 49

| Sample No. | Diameter of Au Seeds | Transparency (% T) | Conductivity (Ω) |
|---|---|---|---|
| a) | 3-5 nm | 41% | 170 |
| b) | 15 nm | 57% | 500 |
| c) | 35 nm | 73% | >200,000 |

Example 21.3: Optimization of Growing Conditions (Amount of Gold Nanoparticles)

Another possible solution is to decrease the amount of AuNPs added to the amino group functionalized substrate surface. Since gold seeds are stabilized by citrate and in free motion in the solution, lowering their concentration may considerably minimize their occurrences at the glass-solution interface and the subsequent adhesion process. However, when 15 nm Au seeds were used, by decreasing their concentration from 200 µL to 100 µL and 50 µL, a large irregular spot of thicker film than its surrounding area was formed (FIG. 49(d)-(e)). Within the darker regions, the transparency and conductivity were comparable with those samples prepared with 200 µL of 15 nm Au seeds (Table 1b). The SEM image (FIG. 49(f)) of the dark region in sample (e) confirmed this similarity in the density and conformation of AuNWs. In contrast, the AuNWs in the brighter region were much longer, thicker and further separated from each other. It is in agreement with the proposed theory, since the number of Au seeds in this region was far less than the darker region, keeping the level of $HAuCl_4$ constant, the selective deposition of gold would encourage the continual growth on existing AuNWs both in length and width. Nonetheless, the distribution of seeds on substrate turned out to be not uniform, which suggested that the concentration of Au seeds should be kept at 200 µL.

Example 21.4: Optimization of Growing Conditions (Duration of Incubation)

The durations of incubation in the AuNPs solutions should also be an important factor. Given more time to diffuse inside the solution, more Au seeds are likely to be attached to the glass substrate. Indeed, as we prolonged the incubation time, the AuNWs film became darker (FIG. 50(a)-(c)), which can be also reflected by a severe loss of optical transparency. However, the slight increase of electric conductivity could not compensate such drop of transparency (Table 3a-c).

TABLE 3

The transparency and conductivity of samples in FIG. 50

| Sample No. | Incubation Time | $HAuCl_4$ (50 mM) used | Transparency (% T) | Conductivity (Ω) |
|---|---|---|---|---|
| a) | 5 min | 60 µL | 61% | 120 |
| b) | 10 min | 60 µL | 33% | 100 |
| c) | 30 min | 60 µL | 25% | 80 |
| d) | 5 min | 40 µL | 64% | 320 |
| e) | 5 min | 30 µL | 66% | 500 |

In addition, when the incubation time was too short, such as 5 minutes, the AuNWs film appeared not so smooth and homogeneous. Therefore, optimal incubation time was set as 10 minutes.

Example 21.5: Optimization of Growing Conditions (Quantity of $HAuCl_4$)

The last step of the AuNWs growth method is the reduction of Au(III) ions in solution by L-ascorbic acid in the presence of 4-MBA ligands. The reducing agent was added in excess amount to ensure all $HAuCl_4$ was reduced, so the concentration of $HAuCl_4$ determined the quantity of gold atoms available for deposition. Fewer building blocks available may lead to shorter and thinner nanowires, which may in turn impair the conductivity of the whole network. Truly enough, reducing the amount of $HAuCl_4$ by half caused more than four times of increase in resistance (Table 3). However, if too much $HAuCl_4$ was added, a rush of gold atoms would occur in the reaction solution immediately after the L-ascorbic acid was added. It is undesired because aggregation will take place, which is a competitive process consuming free Au atoms. The solution turned cloudy and finally dark blue within a few minutes. The change of color reflects the gradual increase of the size of particles in the solution triggered by the self-nucleation and kept by continuous aggregation of the reduced Au ions. Thus, reduction in the quantity of HAuCl$_4$ was undesirable.

Example 21.6: Optimization of Growing Conditions (Reaction Time)

Correspondingly, reaction time can also determine the final structure and conformation of the nanowire network. Longer time is required to grow AuNWs with larger length and width to guarantee satisfactory conductivity. 5 minutes may be too short for the growing AuNWs to reach certain length to completely cover the substrate surface and get into contact with their neighbors. As can be observed from the photo (FIG. 51(a)), the center region on the glass seemed to be barely covered and displayed very poor conductivity (>200 kΩ). For prolonged reaction time (1 hour), the reaction solution turned black as nucleation and aggregation of gold nanoparticles in the solution were still observed. By comparison (Table 4), 10 minutes of growth time appeared to be enough, giving homogeneous film with moderate transparency and good conductivity.

TABLE 4

The transparency and conductivity of samples in FIG. 51

| Sample No. | Reaction Time | Transparency (% T) | Conductivity (Ω) |
|---|---|---|---|
| a) | 5 min | Uneven | N.A. |
| b) | 10 min | 64% | 130 |
| c) | 30 min | 40% | 100 |

From all the above mentioned selections, the optimized transparent AuNWs film was grown with 15 nm Au seed, 10 minutes of incubation time, 60 μL HAuCl$_4$ (50 mM) and 10 minutes of reaction time (FIG. 51(b)). The optimal conditions were successfully scaled up five times on 1.7 cm×1.7 cm glass slides (FIG. 52(a)). It possesses comparable transparency of 67% and conductivity of 200Ω.

When the optimized AuNWs was repeated with freshly prepared 4-MBA solution, a further improvement of transparency was observed (FIG. 52(b)). It exhibits an excellent transparency of 95% and a moderate conductivity of 2000Ω. From the SEM image (FIG. 53(a)), we can see that perhaps due to a lower concentration of the ligand presented in the solution, AuNWs became thicker and longer leaving more vacant space in between the network.

Example 22: Deposition of AgNPs on Glass with AuNWs

A feasible way to further improve the electric conductivity of the optimized AuNWs film on glass substrate is to deposit another layer of silver nanoparticles on top.

Glass substrate was immersed in 4 mL of ethanol. 200 μL of silver nitrate solution (10 mM) was added followed by 200 μL of L-ascorbic acid solution (10 mM). The mixture was kept still for 30 min before the glass substrate was washed with water/ethanol (1:1) and dried in air.

In this way, its conductivity was enhanced by five times (FIG. 52(d)) with 10% loss of transparency (FIG. 54). No obvious differences were observed on the SEM image (FIG. 53(B)) after the deposition of AgNPs, substantiating the fact of maintaining high transparency. The deposition of metal nanoparticles on the network may have improved the contact in between individual or bundle of nanowires, leading to the great boost in electrical conductivity.

A novel ultrathin AuNW system, with a new class of ligands, a new mode of seeded growth, a new synthetic strategy for hierarchical nanostructures, and the rare ability to grow ultrathin AuNWs in an aqueous solution such as water has been demonstrated. Further, growth conditions for gold nanowires network on glass substrate to significantly improve its transparency without much loss in conductivity has been optimized. With such promising electrical and optical properties, it may be a potential candidate for the novel material used in the TTFTs. In addition, the method is facile, scalable and reproducible, and opens up new opportunities in nanostructure synthesis and device fabrication.

The invention claimed is:

1. A method for forming gold nanowires on a substrate, the method comprising:
   a) attaching noble metal nanoparticles onto the substrate;
   b) contacting the noble metal nanoparticles with an aqueous solution comprising a ligand, gold ions and a reducing agent, wherein the ligand is an organic compound having a thiol group, and wherein the ligand is attached to a surface of the noble metal nanoparticles thereby covering at least a portion of the surface of the noble metal nanoparticles; and
   c) growing the gold nanowires on the substrate, wherein each of the gold nanowires is grown extending from the substrate.

2. The method according to claim 1, wherein the ligand is a compound of formula I:

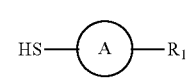

(I)

wherein A is a substituted or unsubstituted straight-chain or branched C$_1$-C$_6$ alkyl, substituted or unsubstituted monocyclic, condensed polycyclic or bridged C$_5$-C$_{20}$ aryl or heteroaryl, wherein in the heteroaryl, 1-4 carbon atoms are replaced by O, N or S, and wherein R$_1$ is —H, —OH, —COOH, —CONH$_2$, —NH$_2$, —NO$_2$, —SO$_3$H, —OSO$_3$H, —OP(=O)(OH)$_2$, or C$_1$-C$_4$ alkyl substituted with one or more substituents selected from the group consisting of OH, —COOH, —CONH$_2$, —NH$_2$, —NO$_2$, —SO$_3$H, —OSO$_3$H, and —OP(=O)(OH)$_2$.

3. The method of claim 2, wherein the ligand is a compound of formula II:

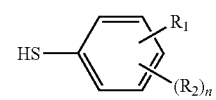

(II)

wherein R$_1$ is —H, —OH, —COOH, —CONH$_2$, —NH$_2$, NO$_2$, —SO$_3$H, —SO$_3$H, —OP(=O)(OH)$_2$, or C$_1$-C$_4$ alkyl substituted with one or more substituents selected from the group consisting of OH, —COOH, —CONH$_2$, —NH$_2$, NO$_2$, —SO$_3$H, —SO$_3$H, and —OP(=O)(OH)$_2$, and wherein R$_1$ is in meta or para position relative to the thiol group;

each R$_2$ is independently selected from the group consisting of —H, —OH, —COOH, —CONH$_2$, —NH$_2$, NO$_2$, —SO$_3$H, —SO$_3$H, —OP(=O)(OH)$_2$, unsubstituted or substituted C$_1$-C$_4$ alkyl, and wherein n is 0, 1, 2, 3 or 4.

4. The method of claim 3, wherein the ligand is selected from the group consisting of 4-mercapto-phenylacetic acid (4-MPAA), 4-mercaptobenzoic acid (4-MBA), 3-mercaptobenzoic acid (3-MBA), 4-mercaptophenol (4-MPN), and mixtures thereof.

5. The method according to claim 2, wherein the ligand comprises 4-mercaptobenzoic acid (4-MBA).

6. The method according to claim 1, wherein concentration of the ligand in the aqueous solution is in the range of about 0.1 mM to about 1.4 mM.

7. The method according to claim 1, wherein the substrate is selected from the group consisting of silica, alumina, titania, strontium titanium oxide, lanthanum aluminum oxide, calcium carbonate, silicon, paper, glass, polymers, and combinations thereof.

8. The method according to claim 1, wherein the noble metal nanoparticles comprise gold nanoparticles.

9. The method according to claim 8, wherein the gold nanoparticles consist essentially of gold.

10. The method according to claim 9, wherein the gold nanoparticles are citrate-stabilized gold nanoparticles.

11. The method according to claim 1, wherein the mean diameter of the noble metal nanoparticles is in the range of about 3 nm to about 15 nm.

12. The method according to claim 11, wherein the mean diameter of the noble metal nanoparticles is about 15 nm.

13. The method according to claim 11, wherein the gold ions are provided by a gold source selected from the group consisting of chloroauric acid, gold trichloride, gold potassium chloride, and combinations thereof.

14. The method according to claim 1, wherein the reducing agent is selected from the group consisting of hydroquinone, sodium citrate, hydrazine, ethylene glycol, oxalic acid, sodium borohydride, formaldehyde, ascorbic acid, and combinations thereof.

15. The method according to claim 14, wherein the reducing agent comprises ascorbic acid.

16. The method according to claim 1, wherein the aqueous solution further comprises a surfactant.

17. The method according to claim 16, wherein the surfactant is selected from the group consisting of polyvinyl pyrrolidone (PVP), sodium dodecyl sulfate, sodium citrate, hexadecyltrimethylammonium bromide, sodium dodecyl benzene sulfonate, octyl phenol ethoxylate, and combinations thereof.

18. The method according to claim 17, wherein the surfactant comprises or consists essentially of polyvinyl pyrrolidone (PVP).

19. The method according to claim 1, further comprising coating a surface of the substrate with a binding agent for attaching the noble metal nanoparticles to the substrate.

20. The method according to claim 19, wherein the binding agent comprises 3-aminopropyltrimethoxysilane (APTMS).

21. The method according to claim 1, wherein attaching noble metal nanoparticles onto the substrate comprises incubating the substrate in a suspension comprising noble metal nanoparticles to allow adsorption of the noble metal nanoparticles on the substrate.

22. The method according to claim 21, wherein the incubating time is about 10 minutes.

23. The method according to claim 1, wherein the noble metal nanoparticles are contacted with the aqueous solution for about 10 minutes to form the gold nanowires.

24. The method according to claim 1, further comprising depositing a layer of metal nanoparticles on the gold nanowires.

25. The method according to claim 24, wherein the metal nanoparticles comprise silver.

* * * * *